United States Patent [19]
Gotou

[11] Patent Number: 5,818,753
[45] Date of Patent: Oct. 6, 1998

[54] ELECTRICALLY-ERASABLE AND PROGRAMMABLE ROM WITH PULSE-DRIVEN MEMORY CELL

[75] Inventor: Hiroshi Gotou, Tokyo, Japan

[73] Assignee: NKK Corporation, Tokyo, Japan

[21] Appl. No.: 692,861

[22] Filed: Jul. 30, 1996

[30] Foreign Application Priority Data

Jul. 31, 1995 [JP] Japan .................................. 7-195603

[51] Int. Cl.$^6$ .................................................. G11C 11/34
[52] U.S. Cl. ............................. 365/185.03; 365/185.13; 365/185.23; 365/185.29
[58] Field of Search ..................... 365/185.03, 185.11, 365/185.13, 185.23, 185.25, 185.26, 185.29, 185.33, 218

[56] References Cited

U.S. PATENT DOCUMENTS

| | | | |
|---|---|---|---|
| 4,282,446 | 8/1981 | McElroy | 365/238.5 |
| 4,432,072 | 2/1984 | Chao et al. | 365/149 |
| 4,574,273 | 3/1986 | Atsumi et al. | 365/185.23 |
| 4,649,520 | 3/1987 | Eitan | 365/185.1 |
| 4,797,856 | 1/1989 | Lee et al. | 365/218 |
| 4,811,292 | 3/1989 | Watanabe | 365/233 |
| 4,931,997 | 6/1990 | Mitsuishi et al. | 365/218 |
| 4,953,123 | 8/1990 | Takeuchi et al. | 365/226 |
| 4,958,317 | 9/1990 | Terada et al. | 365/104 |
| 5,068,827 | 11/1991 | Yamada et al. | 365/189.01 |
| 5,075,888 | 12/1991 | Yamauchi et al. | 365/149 |
| 5,126,808 | 6/1992 | Montalvo et al. | 365/189.01 |
| 5,126,969 | 6/1992 | Kawana | 365/149 |
| 5,132,935 | 7/1992 | Ashmore, Jr. | 365/218 |
| 5,179,536 | 1/1993 | Kasa et al. | 365/200 |
| 5,278,794 | 1/1994 | Tanaka et al. | 365/200 |
| 5,282,161 | 1/1994 | Villa | 365/185.1 |
| 5,283,758 | 2/1994 | Nakayama et al. | 365/218 |
| 5,327,385 | 7/1994 | Oyama | 365/218 |
| 5,402,373 | 3/1995 | Aritome et al. | 365/218 |
| 5,406,521 | 4/1995 | Hara | 365/218 |
| 5,412,601 | 5/1995 | Sawada et al. | 365/185.03 |
| 5,491,656 | 2/1996 | Sawada | 365/185.29 |
| 5,602,779 | 2/1997 | Gotou | 365/185.23 |
| 5,615,146 | 3/1997 | Gotou | 365/185.25 |
| 5,623,444 | 4/1997 | Gotou et al. | 365/185.23 |

FOREIGN PATENT DOCUMENTS

| | | |
|---|---|---|
| 0108681 A3 | 5/1984 | European Pat. Off. . |
| 53-46621 | 12/1978 | Japan . |
| 62-266793 | 11/1987 | Japan . |
| 2-166764 | 6/1990 | Japan . |
| 4-105368 | 4/1992 | Japan . |
| 4-155694 | 5/1992 | Japan . |
| 5-189988 | 7/1993 | Japan . |

OTHER PUBLICATIONS

International Electron Devices Meeting. Dec. 8, 1980, Washington, D.C., USA, pp. 602–606, Kupec et al, Triple Level Polysilicon E2PROM with Single Tgransistor Per Bit'.

IEEE Journal of Solid–State Circuits, vol. 29, No. 2, Feb., 1994, pp. 147–150, M. Lanzoni et al, A Novel approach to controlled programming of tunnel–based floating–gate MOSFET'S.

IEEE Electron Device Letters, vol. 16, No. 3, Mar., 1995, New Operation Mode for Stacked–Gate Flash Memory Cell, Hiroshi Gotou.

*Primary Examiner*—David C. Nelms
*Assistant Examiner*—Trong Phan
*Attorney, Agent, or Firm*—Frishauf, Holtz, Goodman, Langer & Chick

[57] ABSTRACT

Multi-value data pieces of one block are held in correspondence with a plurality of bit lines included in this block. One of the multi-value data pieces is produced. The former held multi-value data pieces and the latter produced multi-value data pieces are compared with each other, and only bit lines corresponding to portions which hold the multi-value data pieces each being coincident with the produced multi-value data pieces are made active. Then, the produced multi-value data pieces are simultaneously written in multi-value memory cells connected to the bit lines being made active.

25 Claims, 33 Drawing Sheets

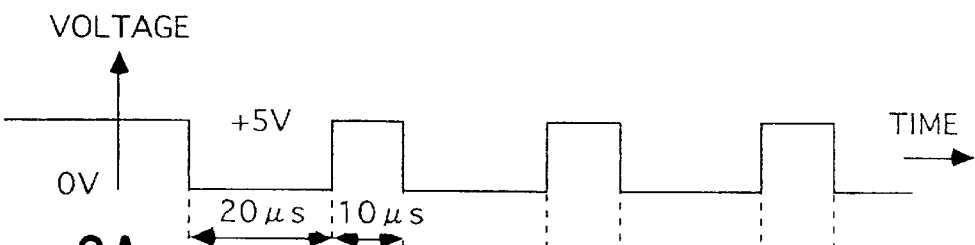
FIG. 2A
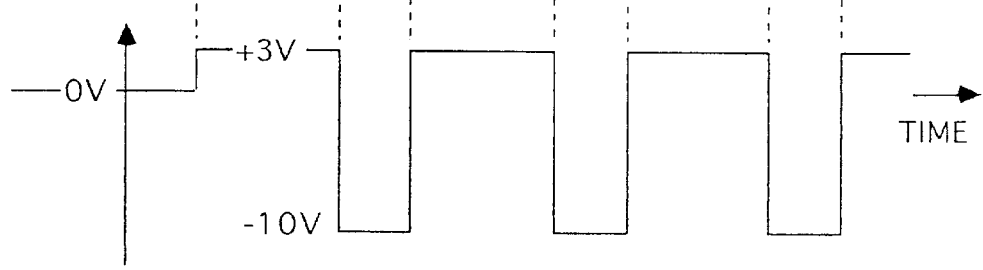
FIG. 2B
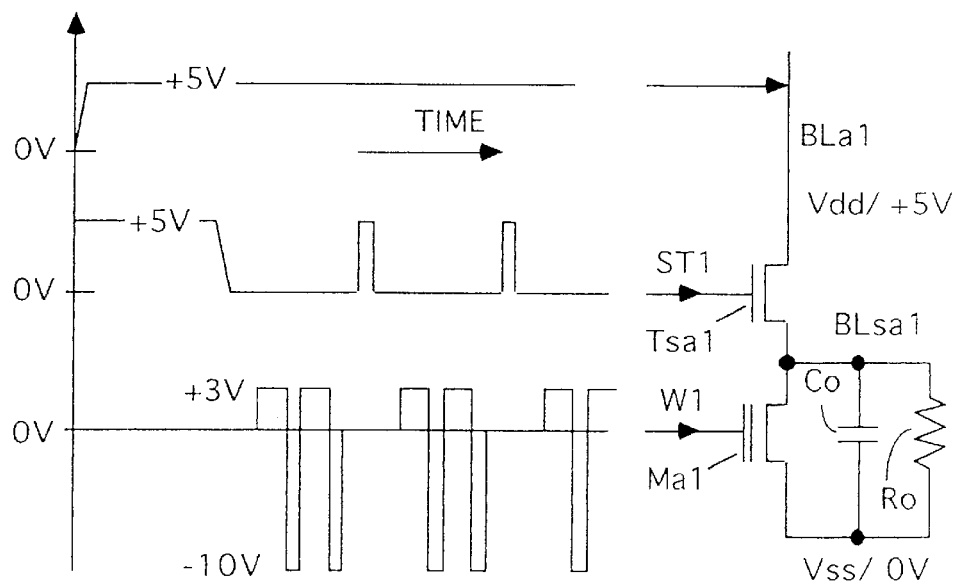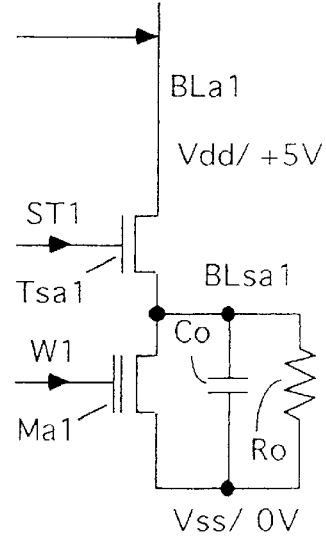
FIG. 3A   FIG. 3B

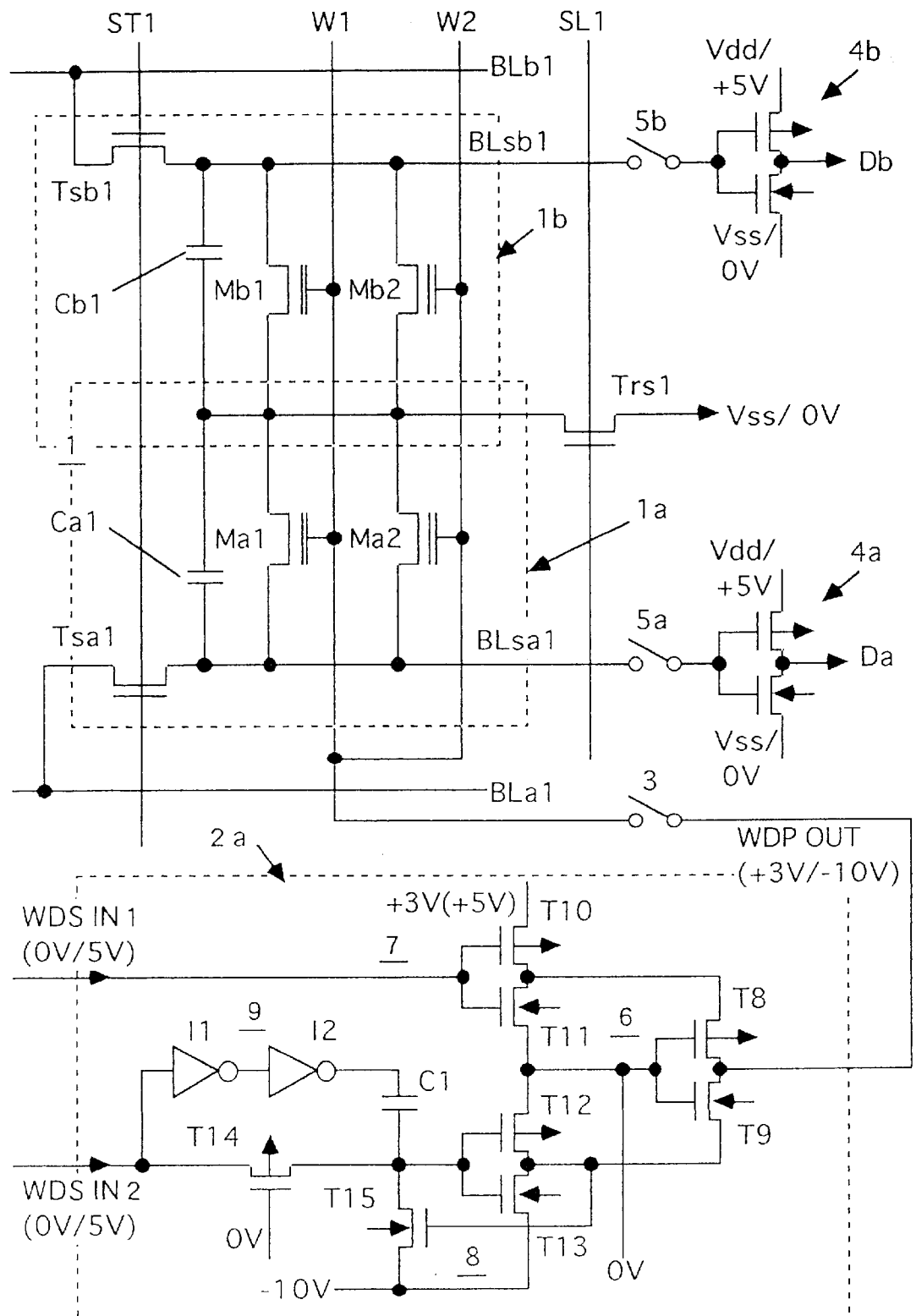
F I G. 4

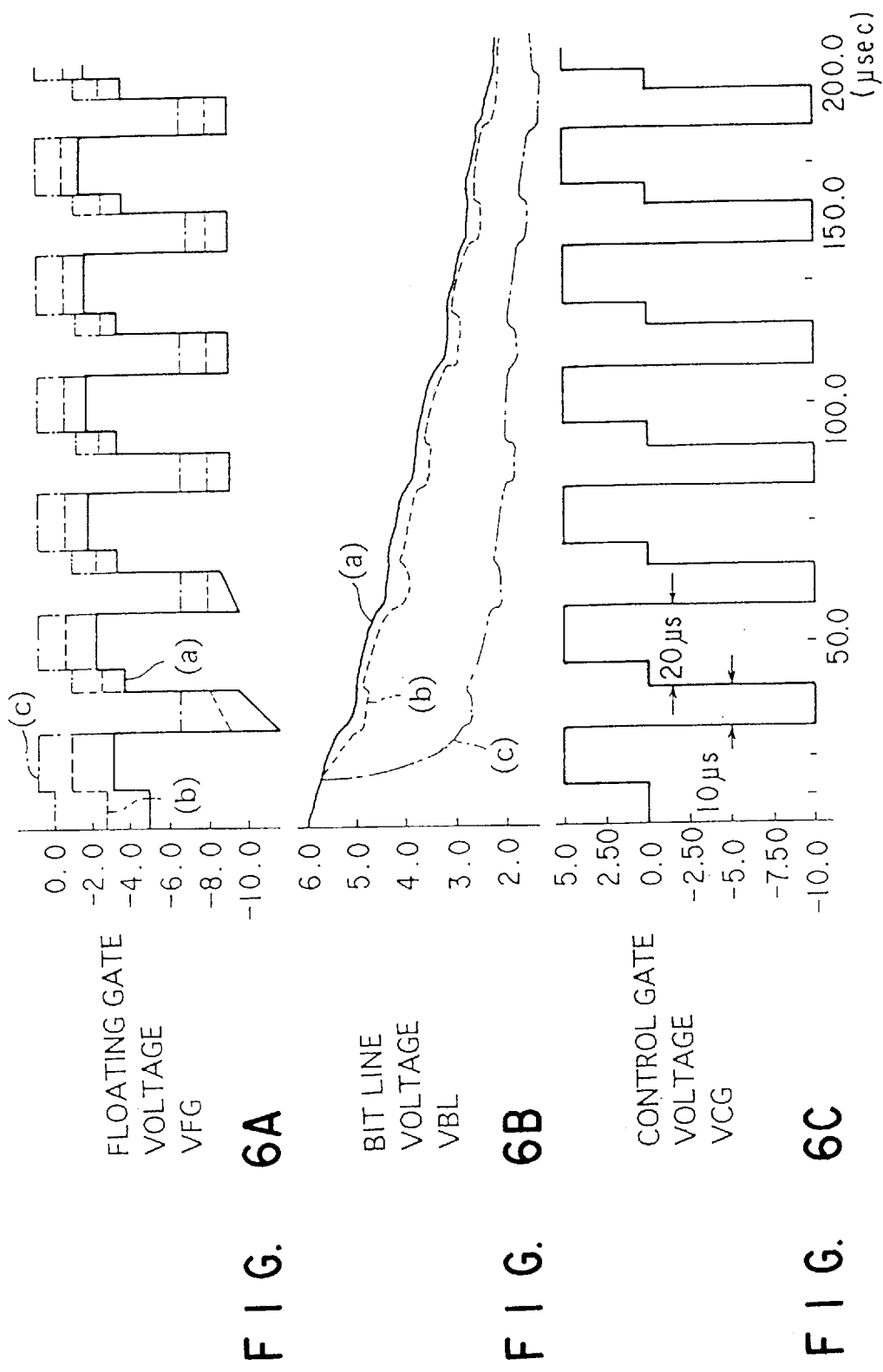
FIG. 6A  FLOATING GATE VOLTAGE VFG
FIG. 6B  BIT LINE VOLTAGE VBL
FIG. 6C  CONTROL GATE VOLTAGE VCG

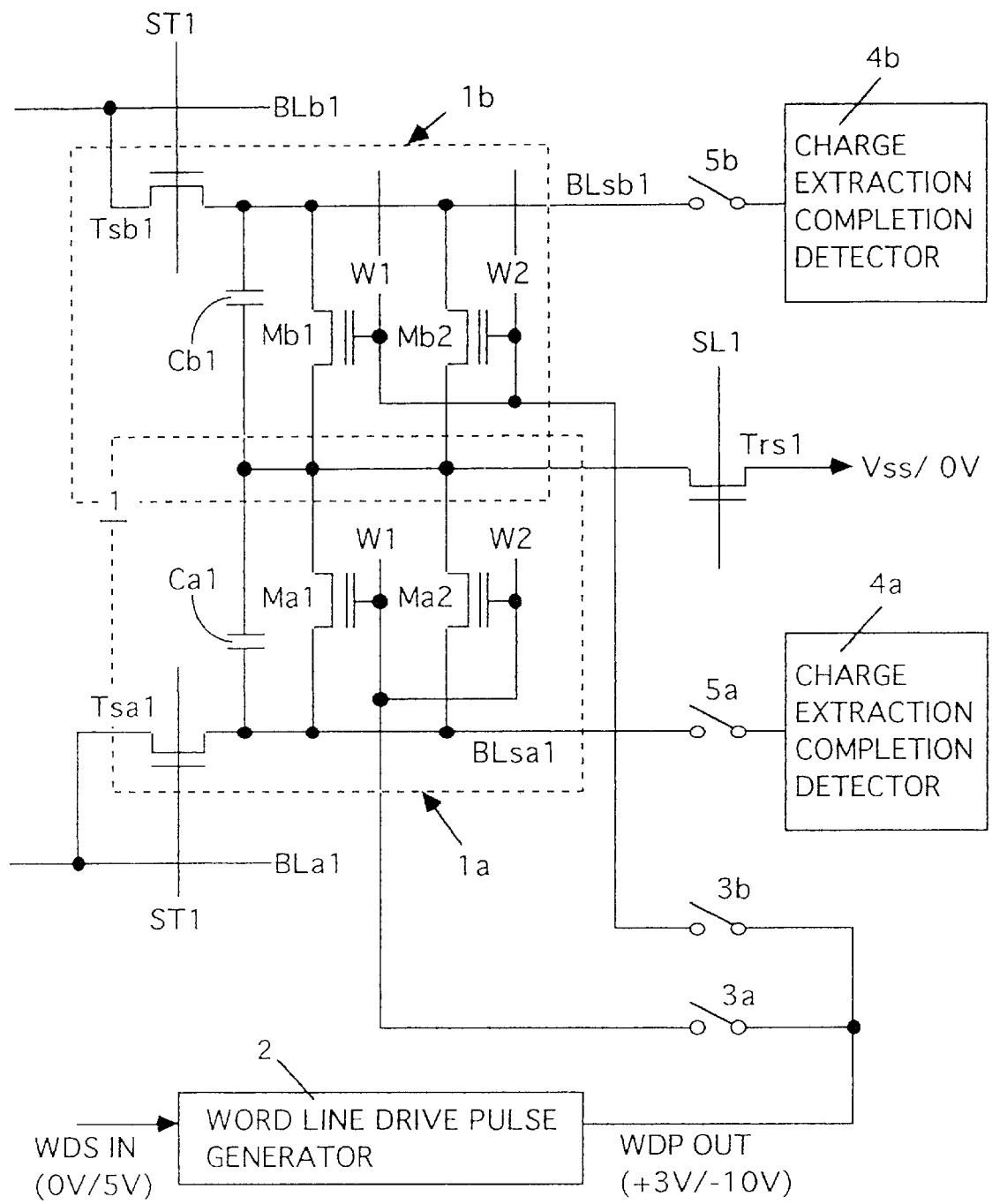
F I G. 9

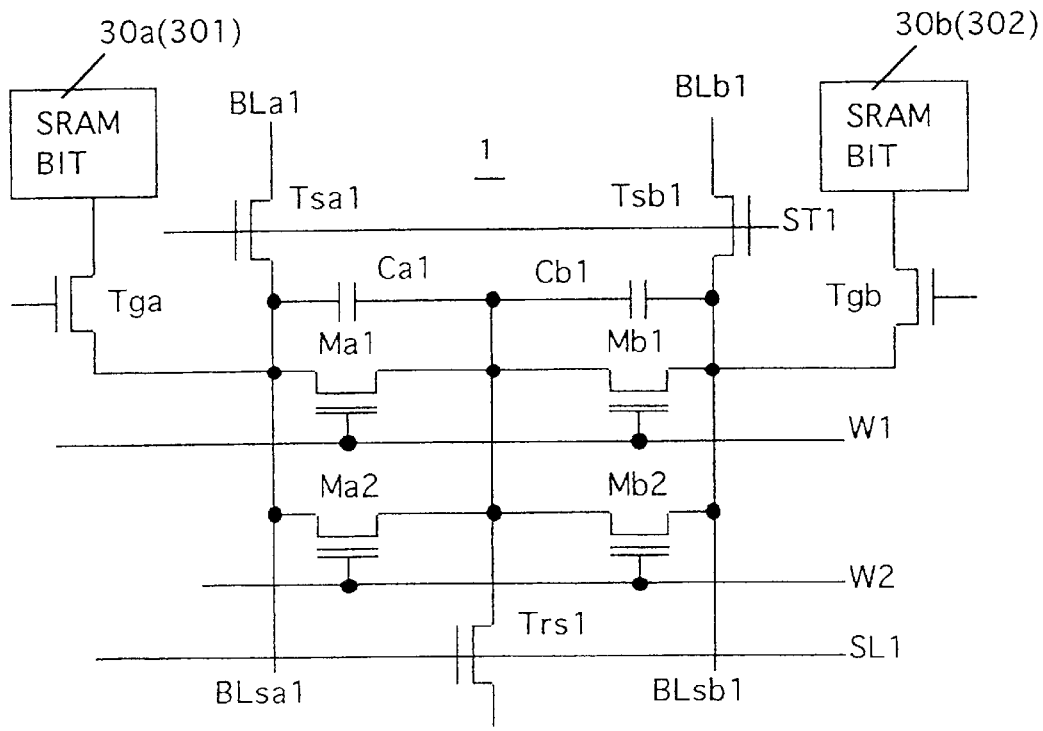
F I G. 10A
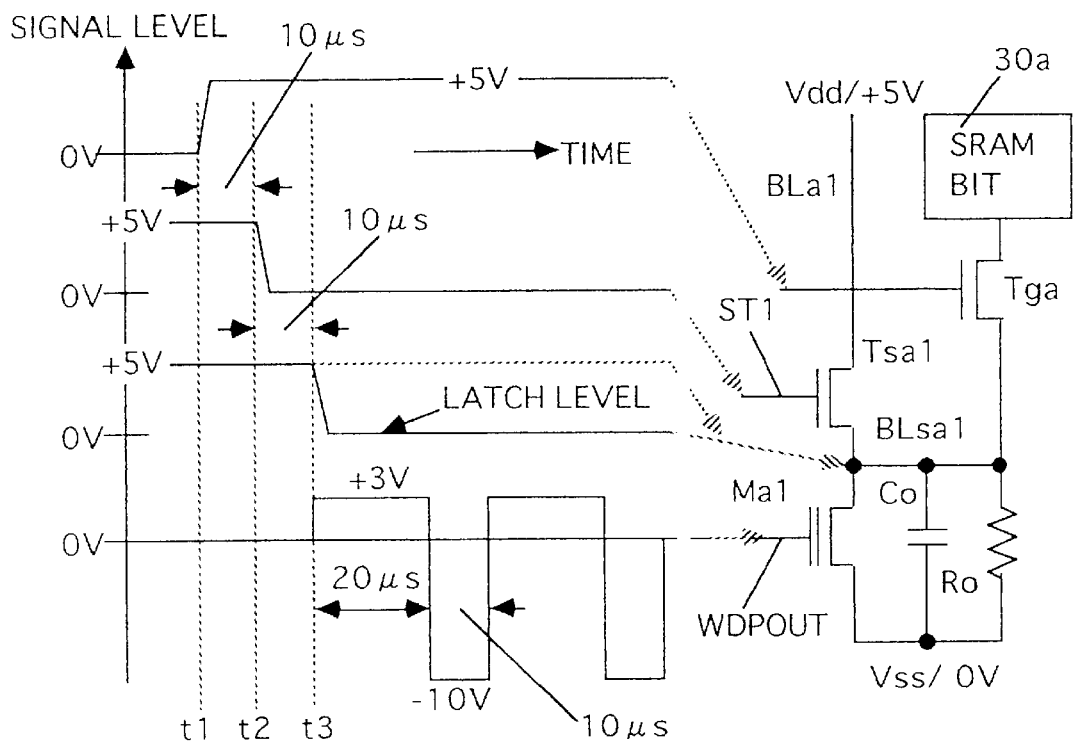
F I G. 10B        F I G. 10C

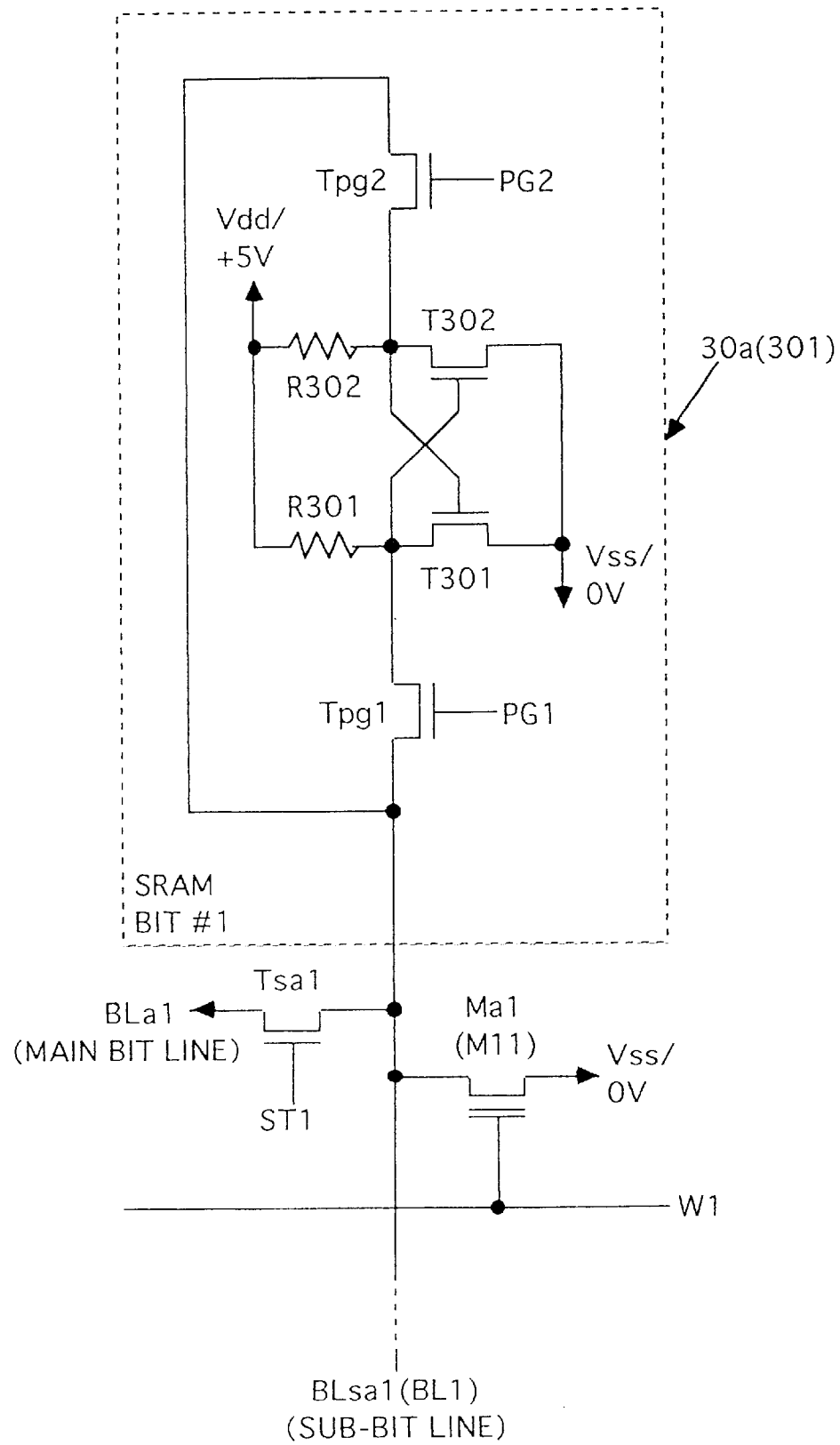
F I G. 15

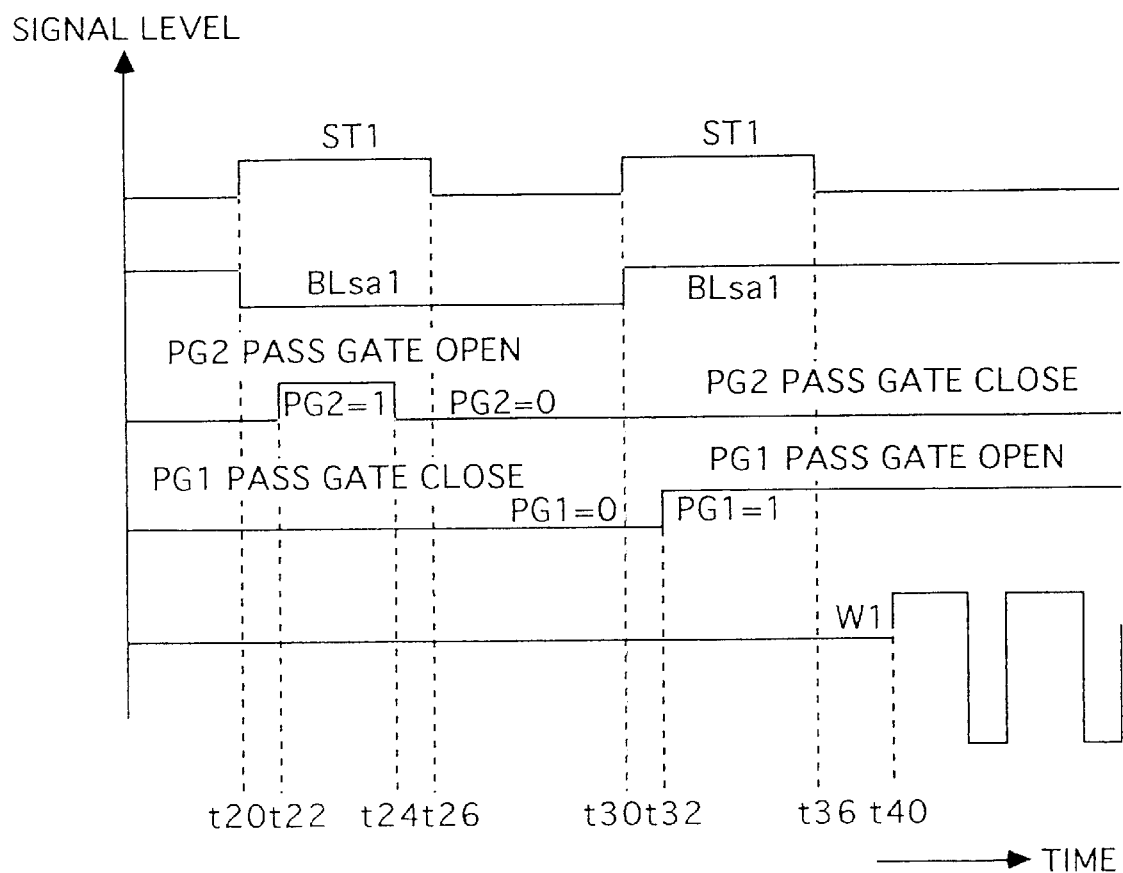
F I G. 17

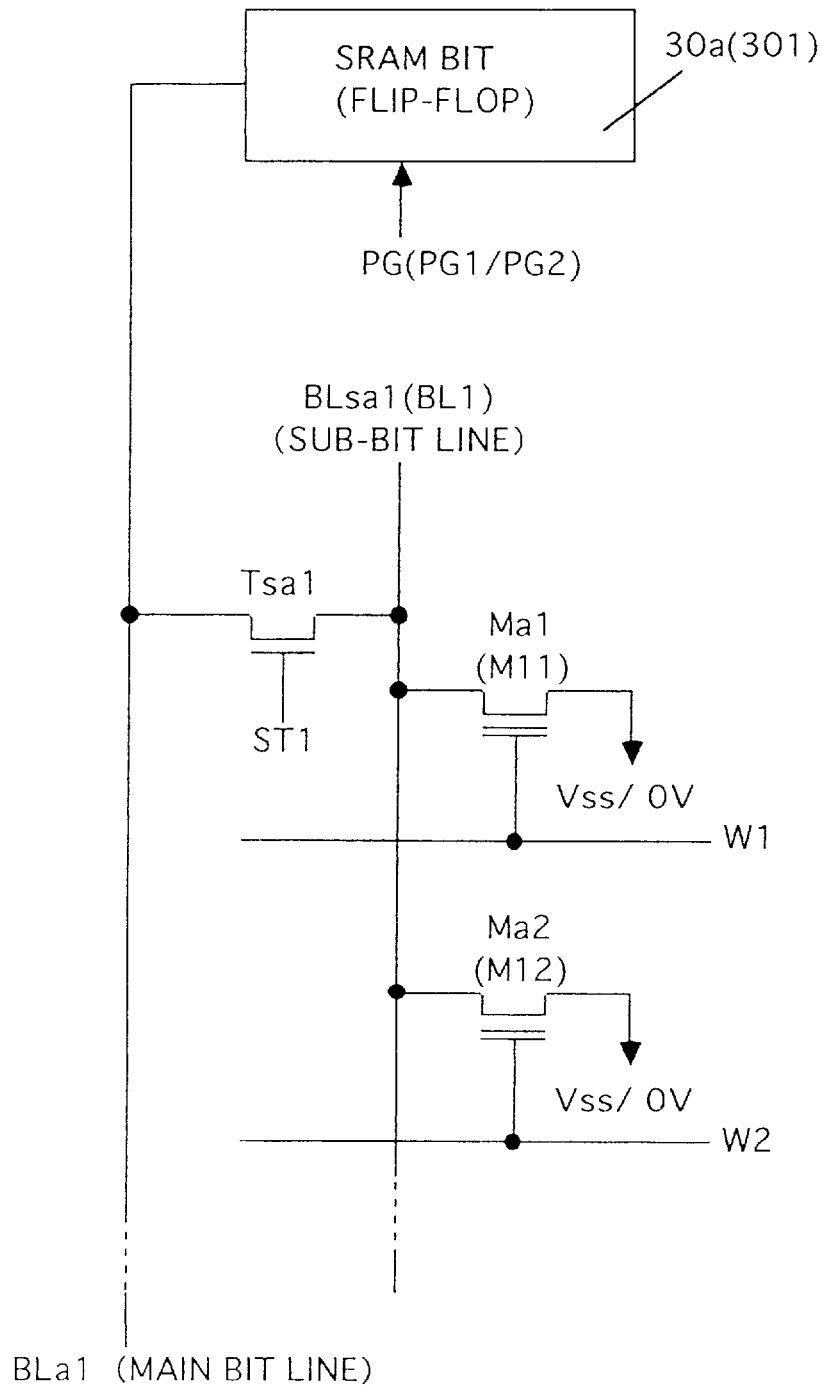
F I G. 18

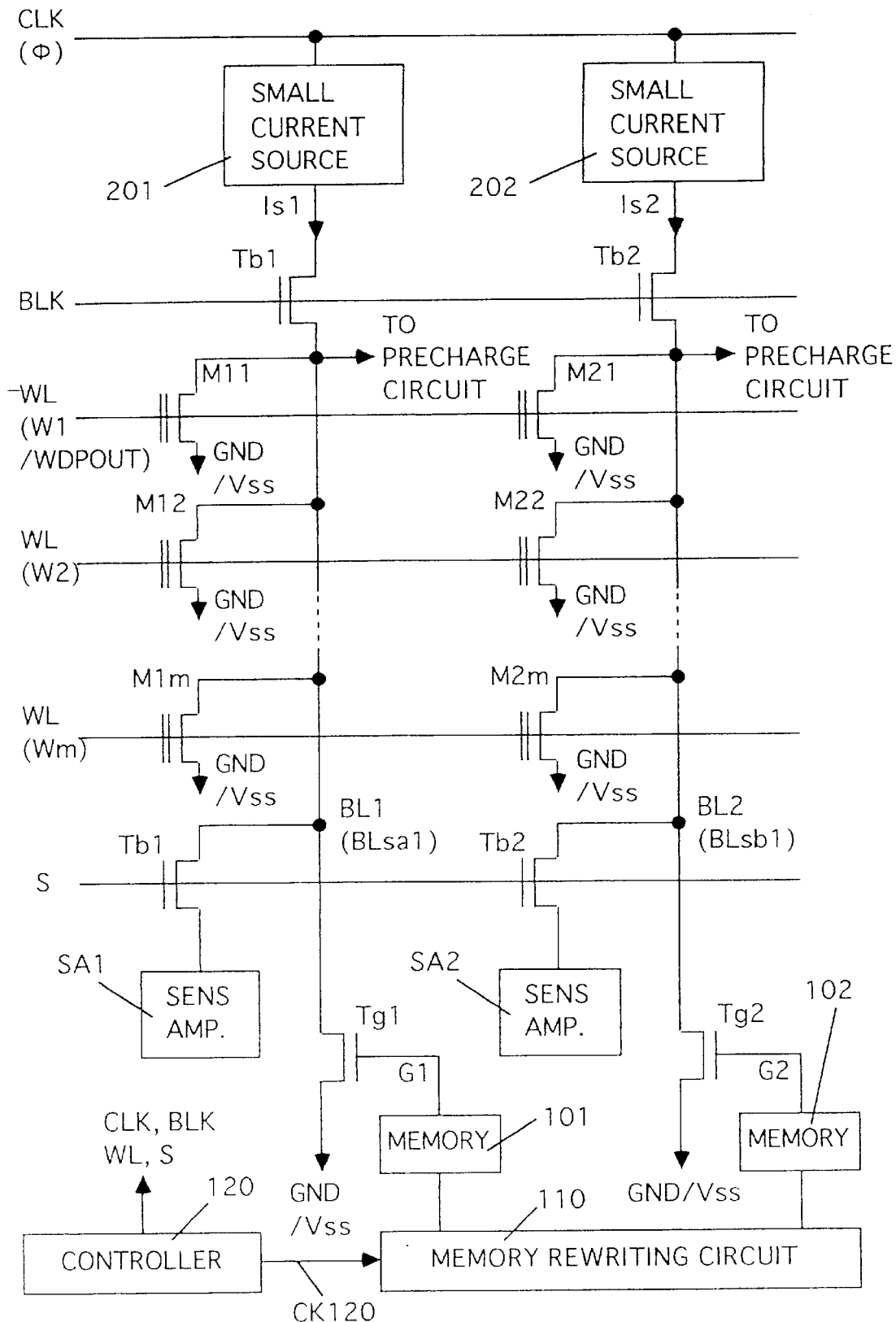
F I G. 19

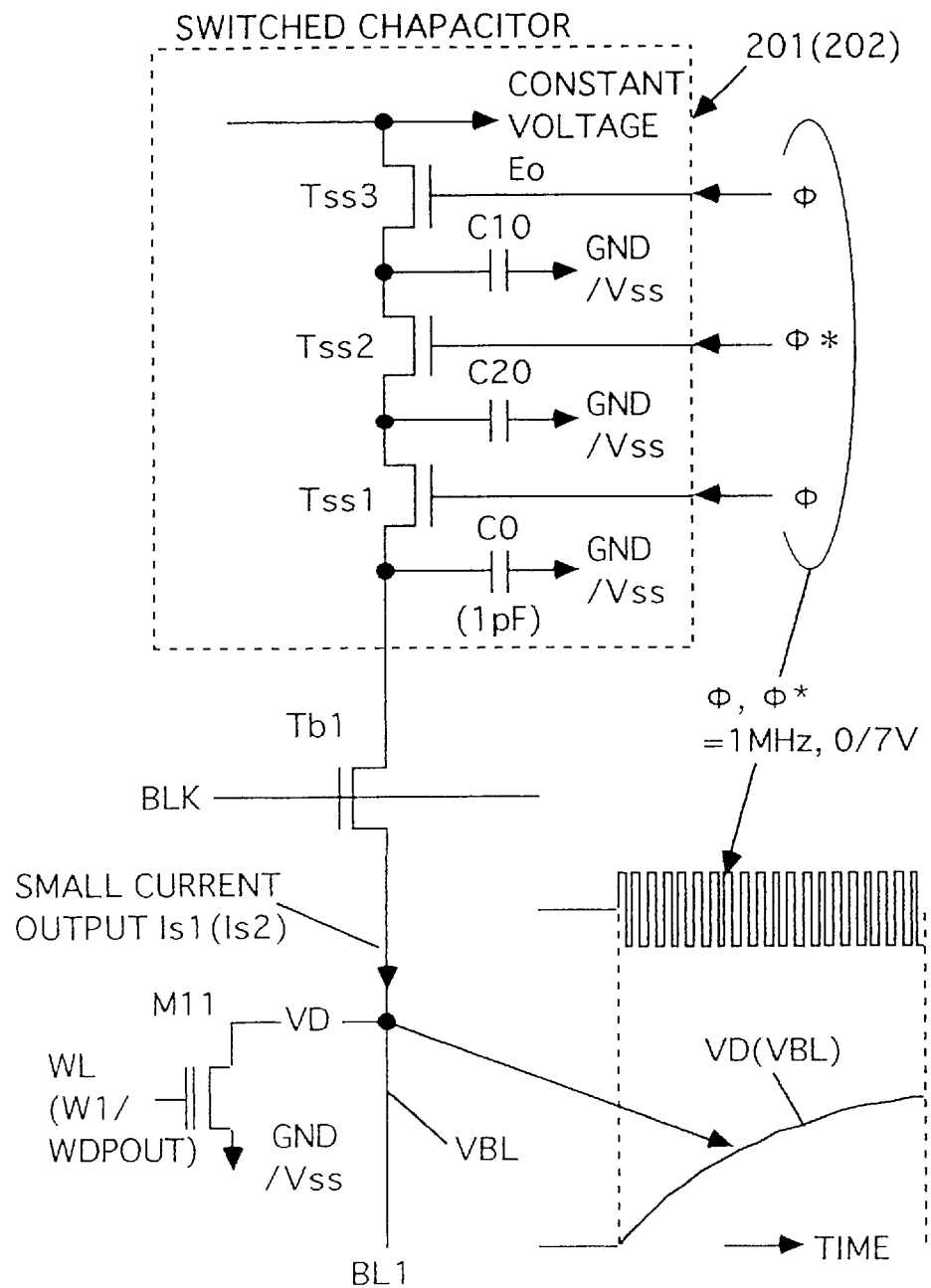
F I G. 32

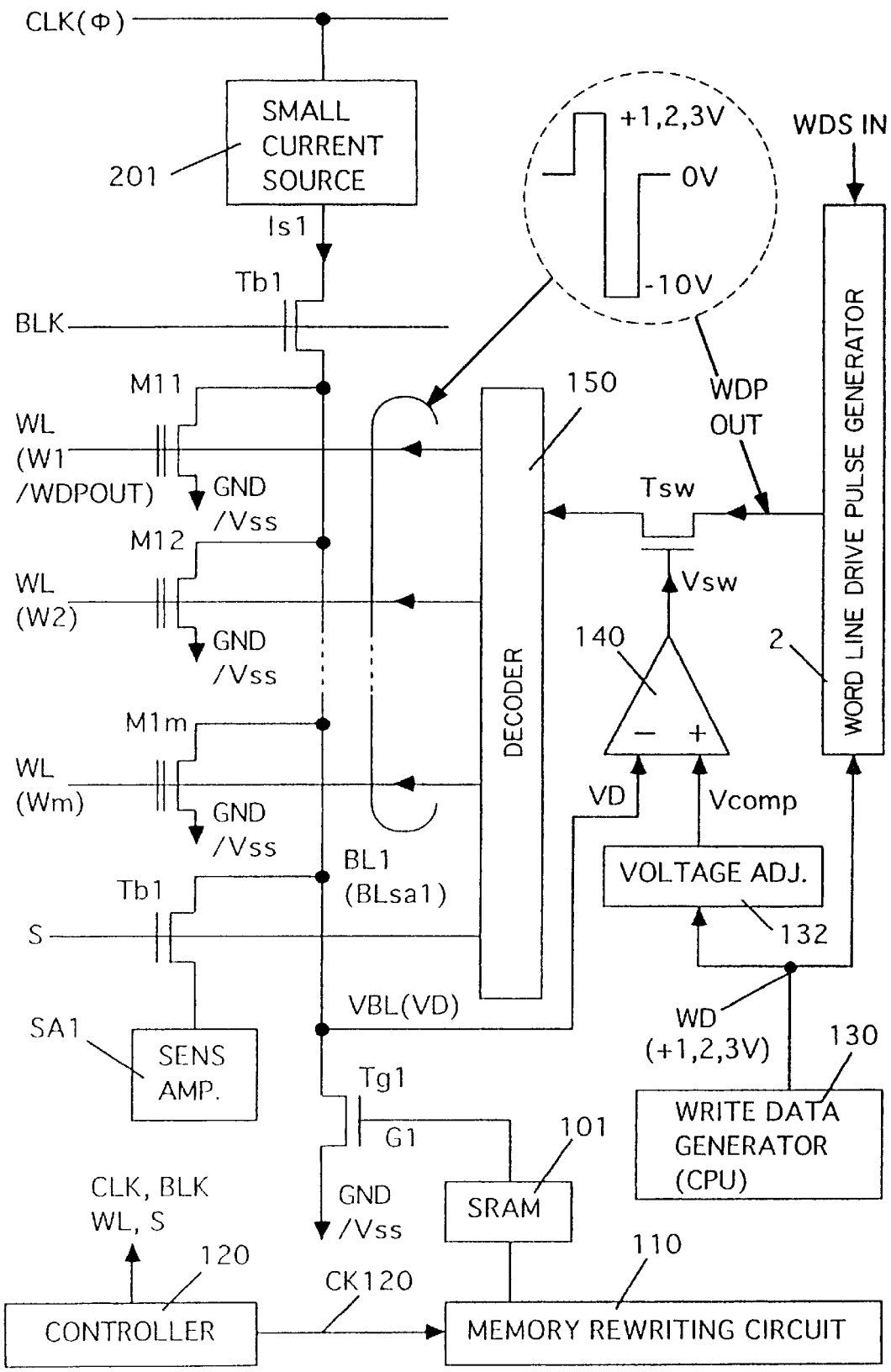
F I G. 33

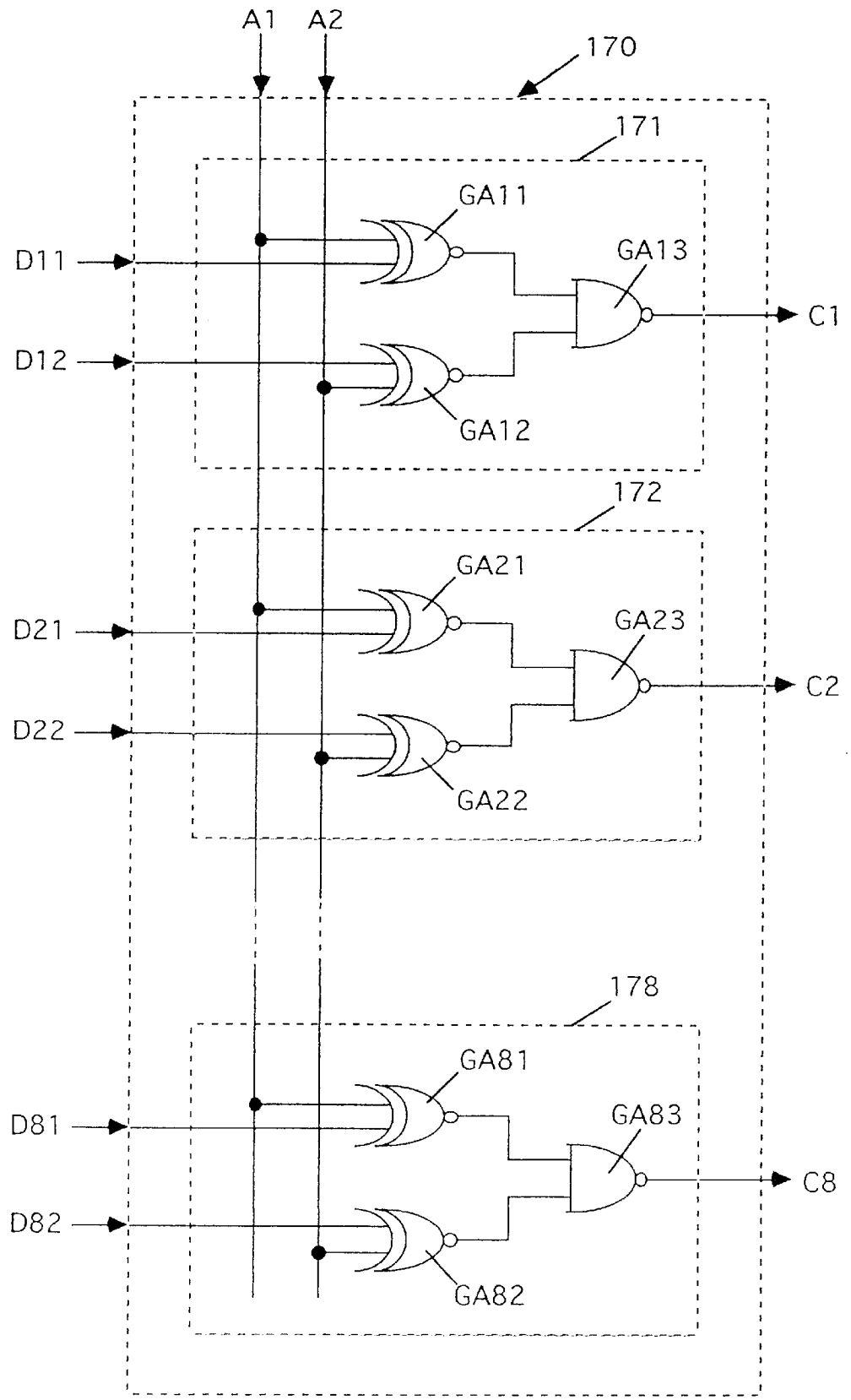
F I G. 35

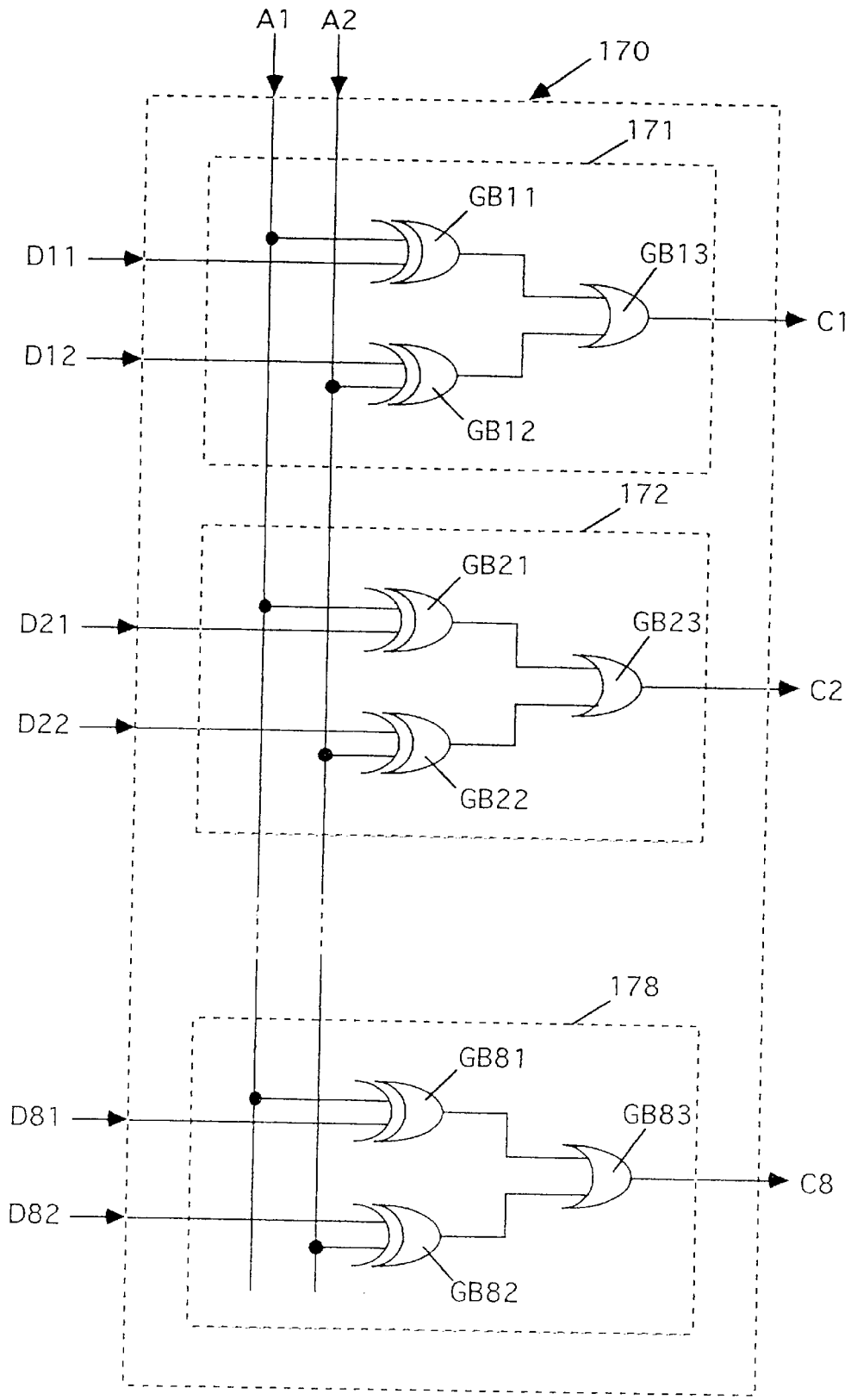
F I G. 36

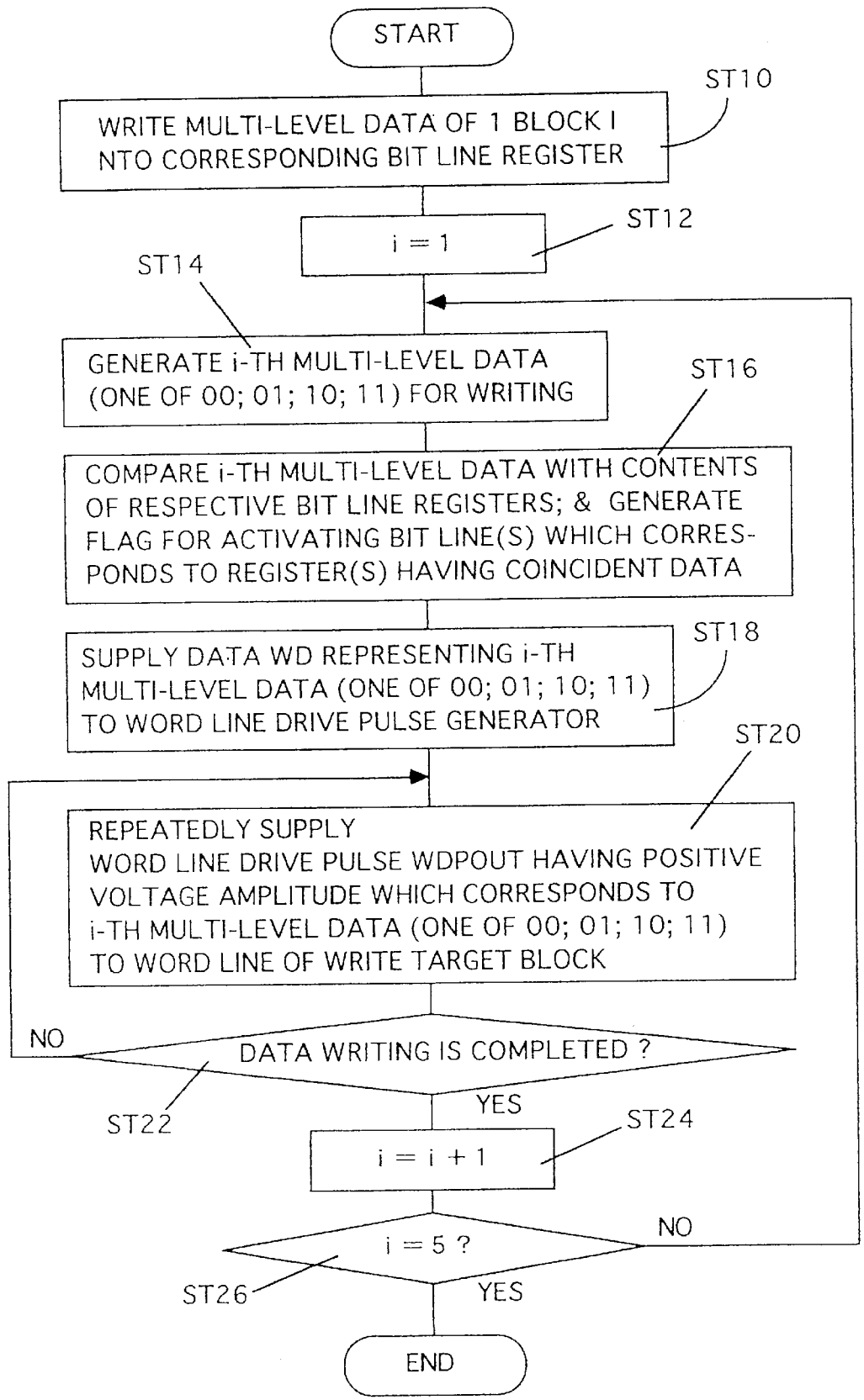
F I G. 37

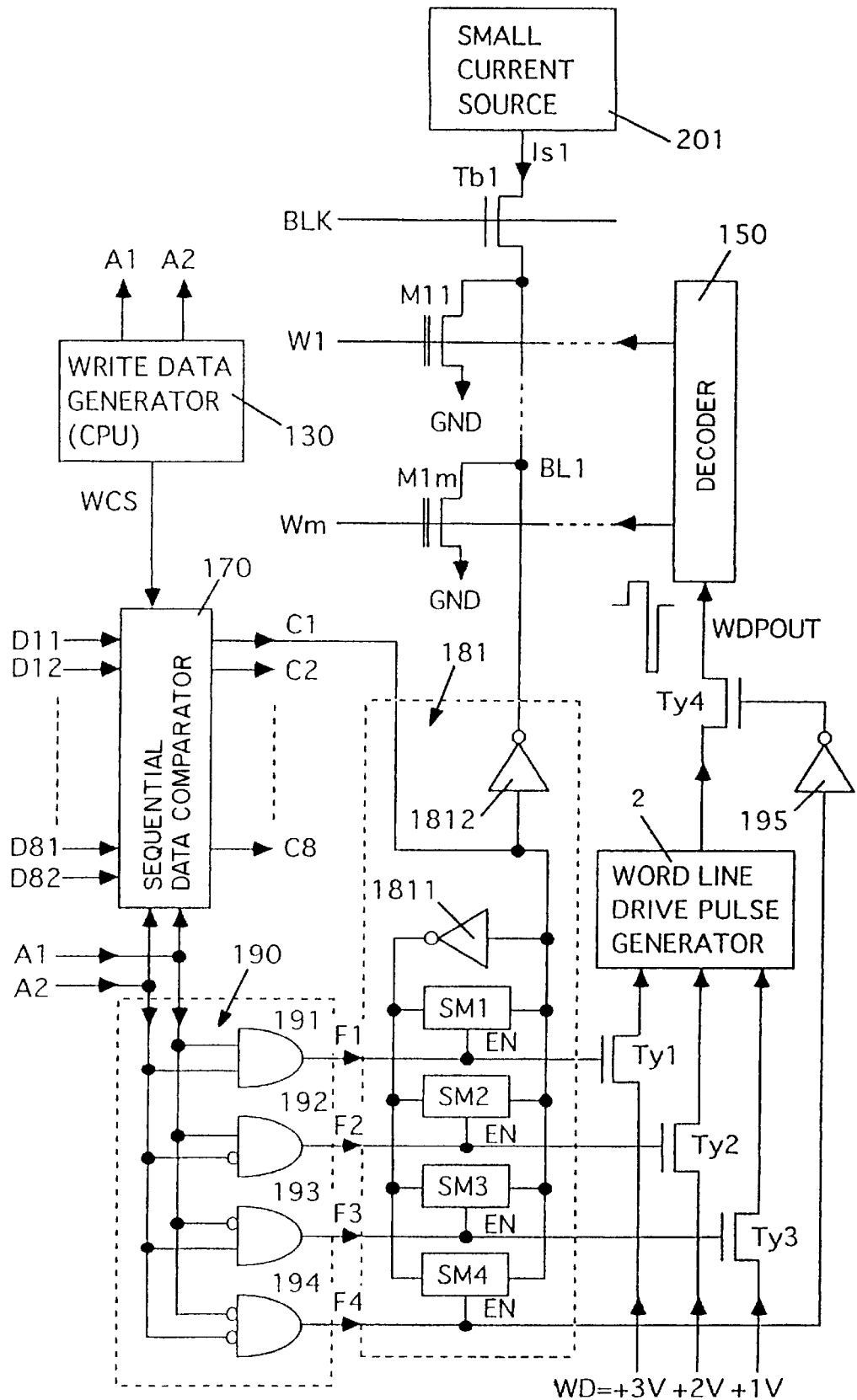
F I G. 38

ELECTRICALLY-ERASABLE AND PROGRAMMABLE ROM WITH PULSE-DRIVEN MEMORY CELL

BACKGROUND OF THE INVENTION

1. Field of the Invention

The present invention relates to a nonvolatile semiconductor memory (EEPROM) capable of electrically rewriting/erasing information. In particular, it relates to a technique of suppressing variations in data pieces written in a multi-value memory in which two or more kinds of data pieces are stored in one memory cell transistor.

2. Description of the Related Art

The stored information rewrite operations of nonvolatile semiconductor memories are roughly classified into operations performed by a scheme (1) of writing information with hot electrons and erasing information with a tunnel current and operations performed by a scheme (2) of writing information with a tunnel current and erasing information with a tunnel current.

A flash EEPROM is a typical example of the nonvolatile semiconductor memory using the former scheme (1). In the flash EEPROM, information is written by applying a write voltage (high voltage Vpp) to both the control gate and drain electrode of a MOS transistor constituting a memory cell and injecting hot electrons into the floating gate.

In such an EEPROM, the threshold of a memory cell transistor changes with a change in the channel length of a MOS transistor for a memory cell, the thickness of the tunnel current passage insulating film (the thickness of the tunnel oxide film) under the floating gate, the electrode voltage between the source and the drain, or the like. As a result, the distribution (data "0") of threshold voltage VTH after information is written in each memory cell transistor greatly varies, as indicated by the hatched upper distribution in FIG. 7A or 7B.

In an erase operation, the control gate of a MOS transistor for a memory cell is grounded, and an erase voltage (Vpp) is applied to the source electrode (or the drain electrode), thereby extracting the electrons trapped in the floating gate to the source electrode (or the drain electrode) in the form of a tunnel current. In this erase operation as well, the distribution (data "1") of threshold voltage VTH of the memory cell after the information is erased is dependent on variations in the voltage (word line voltage) of the control gate, the drain voltage (or the bit line voltage), the thickness of the tunnel oxide film, or the like, and hence greatly varies, as indicated by the hatched lower distribution in FIG. 7A or 7B.

A NAND type EEPROM is a typical example of the nonvolatile semiconductor memory using the latter scheme (2). In the NAND type EEPROM, information is written or erased with a tunnel current from the floating gate of a MOS transistor constituting a memory cell.

The tunnel current used in the scheme (2) varies depending on variations in word line voltage (control gate voltage), bit line voltage (drain voltage), or the thickness of a tunnel oxide film, as in the erase operation performed by the scheme (1) described above. For this reason, in the scheme (2) as well, the distribution of threshold voltage VTH of a memory cell transistor in a write/erase operation greatly varies, as indicated by the hatched upper/lower distribution in FIG. 7C.

For example, in the case shown in FIG. 7B, of the variations in threshold voltage VTH, since variations on the upper voltage side (data "0" write operation) are distributed on the side higher than the read voltage (+5 V of TTL level) of the EEPROM, no significant problem is posed. However, since variations in threshold voltage VTH on the lower voltage side (data "1" erase operation) are distributed on the side lower than the read voltage (+5 V of TTL level) of the EEPROM, a data read operation is greatly influenced by the variations.

In particular, for a multi-value memory comprising memory cells each of which can store two or more kinds of data pieces by setting the threshold voltage at any one of various values after writing of data, the distribution of the threshold voltages (variations in threshold voltage VTH) at the lower side shown in FIGS. 7A to 7C must be far narrower than that of a conventional two-value memory (0/1 binary memory). Otherwise, distributions of different kinds of write data (i.e., distributions in different VTH's) are overlapped one another, and the distinction of written multi-value data pieces is disabled when they are read therefrom, to thereby causing errors in data reading.

When each threshold voltage of memory cell transistors constituting the EEPROM is subjected to large variations as mentioned above, especially when such memory cell transistors constitute a multi-value memory, correct data reading with a fixed reference threshold voltage cannot be performed.

Further, when various data pieces (corresponding to different threshold voltages VTH's) should be written to many multi-value memory cell transistors in one memory block, and if independent data pieces are written, one by one, to respective memory cell transistors in a sequential order, then a relatively long period of time is required to complete the writing of all of the data pieces into all of the corresponding multi-value memory cells in one memory block. Thus, the operation speed of this memory becomes slow.

SUMMARY OF THE INVENTION

The present invention was made in view of the above-noted situations. It is a first object of the invention to provide a nonvolatile semiconductor memory capable of increasing a speed for block writing when plural kinds of write data pieces are to be written in a multi-value memory in unit of blocks.

It is a second object of the invention to provide a nonvolatile semiconductor memory capable of suppressing variations in a plurality of threshold values among memory cell transistors corresponding to plural kinds of write data pieces, and increasing a speed for block writing when these plural kinds of write data pieces are to be written in unit of blocks.

It is a third object of the invention to provide a method for increasing a speed for block writing when plural kinds of write data pieces are to be written in a multi-value memory in unit of blocks.

The nonvolatile semiconductor memory of the invention is provided with a plurality of word lines (W1 to Wm), a plurality of bit lines (BL1 to BL8) and memory cells placed in the respective intersections between the word lines and the bit lines, and is applicable to a memory cell array (group of M11 to M8m) in which a memory cell block (group of M11 to M81) comprising memory cells equivalent in number to the plurality of bit lines (BL1 to BL8) is placed in each word line (e.g., W1).

This memory cell array (group of M11 to M8m) comprises a plurality of memory cell transistors (M11 to M8m) having a source or a drain connected to the bit line (BL1), a floating gate for holding nonvolatile multi-value information (corresponding to Vth1 to Vth3 during writing; Vth 0 during erasing) and a control gate connected to the word line (W1) for controlling writing, erasing or reading of the information held by this floating gate.

Multi-value write data pieces (combination of A1/A2) written in the respective memory cell transistors (M11 to M81) of the memory block (group of M11 to M81) are produced by write data generating means (130).

Only the particular bit lines (BL1 and BL8) corresponding to the particular contents of the multi-value write data pieces (A1/A2) are made active by bit line activating means (170, 180 and Tg1 to Tg8).

A drive signal (WDPOUT) having a first potential (e.g., +1, 2 or 3 V) corresponding to the particular contents (0/1) of the multi-value write data pieces (A1/A2) and having a second potential (e.g., −10 V) different from the first potential, wherein the drive signal repeats alternative potential switching between the first and second potentials, is given to each control gate of the memory cell transistors (M11 to M81) in the memory block (group of M11 to M81) which is the target of writing by drive signal means (2).

In the nonvolatile semiconductor memory of the present invention, the potentials of particular bit lines (BL1 and BL8) are controlled such that each of the potentials (VD/VBL) of the activated particular bit lines (BL1 and BL8) can change with a fixed rate (exponential change; cf. VD3 of FIG. 28) during application of the drive signal (WDPOUT) to each control gate of the memory cell transistors (M11 to M81) in the memory block (group of M11 to M81) which is the target for writing.

The method for high-speed block writing of the invention includes the following steps:
holding (step ST10) multi-value data pieces of one block corresponding to each of the plurality of bit lines included in this block;
producing (step ST14) one of multi-value data pieces;
comparing (step ST16) the multi-value data pieces held in the holding step (ST10) with the one multi-value data piece produced in the producing step (ST14), and activating (step ST16) only the bit line (e.g., BL1 or BL8) corresponding to a portion which holds a multi-value data piece coincident with the multi-value data piece produced in the producing step (ST14); and
writing (step ST20) one of multi-value data produced in the producing step (ST14) in the multi-value memory cell (M11 or M81) connected to the bit line (BL1 or BL8) made active in the activating step (ST16).

In the nonvolatile semiconductor memory of the invention, first, one potential (e.g., +3 V) of a word line drive signal (WDP) is applied to the control gate of the target memory cell transistor (Ma1/M11), and checking is made to determine whether this memory cell transistor can be turned-ON or not with this potential (+3 V).

If the transistor is turned-ON, a bit line (or sub-bit line) potential drops through the drain-source path of this target memory cell transistor. Then, even when the other potential (e.g., −10 V) of the word line drive signal (WD) is applied to the control gate of the memory cell transistor, discharging of electric charges from the floating gate due to a tunnel current will be prevented (excess erasure prevention).

If the memory transistor is not turned-ON with the potential (+3 V) of the first word line drive signal (WDP) (i.e., the threshold value of the target memory cell transistor is higher than a predetermined value), no reduction occurs in the bit line potential. Immediately thereafter, when the other potential (−10 V) of the word line drive signal (WDP) is applied to the control gate, accumulated electric charges are slightly pulled out of the floating gate of the target memory cell transistor in the form of a tunnel current. Then, the threshold value of the target memory cell transistor drops slightly by an amount equivalent to the pulled out electric charges.

However, if this memory cell transistor is still not turned-ON even by applying the potential (+3 V) of the word line drive signal (WDP) again to the memory cell transistor with its threshold value slightly reduced (or, the threshold value of the target memory cell transistor is higher than the predetermined value), no reduction occurs in the bit line potential. Immediately thereafter, when the other potential (−10 V) of the word line drive signal (WDP) is given to the control gate, the accumulated electric charges are again pulled out of the floating gate of the target memory cell transistor in the form of a tunnel current. Then, the threshold value of the target memory cell transistor further drops by an amount equivalent to the pulled out electric charges.

If the memory cell transistor is turned-ON by applying the potential (+3 V) of the word line drive signal (WDP) again to the memory cell transistor with its threshold further reduced (i.e., the threshold value of target memory cell transistor has dropped to the predetermined value), the bit line potential declines through the drain-source path of the turned-ON target memory cell transistor. Then, even when the other potential (−10 V) of the word line drive signal (WDP) is again applied to the control gate of the memory cell transistor, discharging of electric charges from the floating gate thereof due to a tunnel current will be prevented (excess erasure prevention). At this time, the target cell transistor has been erased to accurately reach the predetermined threshold value without having been excessively erased. (That is, variances or variations in threshold values of the memory cell transistor after erasure can be made very small.)

In the above-described memory cell, by setting the threshold values of the memory cell transistor after erasure to plural kinds of voltage values corresponding to a plurality of write data pieces, a multi-value memory can be provided.

Assume that the nonvolatile multi-value memory of the invention comprises, for instance, eight of four-value memories per block, for the sake of simplicity. Under this assumption, writing for each block after flash-erasing is carried in the following manner:

(1) Each memory block is constructed by 8 memory cell transistors M11 to M81 each of whose gates is connected to one word line, for instance, W1 (in practice, one block may be formed of 256 to 1024 memory cell transistors). The drains of the memory cell transistors M11 to M81 are respectively connected to 8 bit lines BL1 to BL8. In case of a four-value memory, any of 4 kinds of data pieces "00", "01", "10", and "11" is stored in each of the memory cell transistors M11 to M81, depending on the "difference" in 4 kinds of threshold values.

Bit line registers RG1 to RG8 (2-bit memory; SRAM or DRAM capable of high-speed writing may also be used therefor) capable of storing 4 values ("00", "01", "10", and "11") are allotted to the respective bit lines.

(2) 4 valued data pieces ("00", "01", "10", and "11") to be respectively written in the 8 memory cell transistors are first stored in the bit line registers RG1 to RG8 allocated to the bit lines BL1 to BL8.

Then, the bit line registers RG1 to RG8 are classified into 4 kinds (a "00" storing register, a "01" storing register, "10" storing register, and a "11" storing register) with respect to the contents of the multi-value write data pieces ("00", "01", "10", and "11").

(3) When the data "00" is to be actually written in the nonvolatile memory cell, the registers storing "00" are searched or retrieved, and the bit lines (BL1 and BL8) of the "00" storing registers (e.g., RG1 and RG8) are selected. Only the selected bit lines are precharged to a specified potential (e.g., +5 V) (where only the transistors Tg1 and Tg8 connected to the selected bit lines are switched OFF).

Then, a word line drive pulse having a positive voltage amplitude (e.g., +5 V) equivalent to the data pieces "00" is applied to the particular word line (W1) by several pulses to about 10 pulses. Even without verification of the write data, the threshold values Vth of transistors M11 and M81 can accurately (with little variance) take voltage values (e.g., +4.4 V) corresponding to the data pieces "00".

Alternatively, if the data pieces "00" are defined by a state obtained after erasing (e.g., a threshold value of +6.5 V to +7.0 V), the word line drive pulse is not applied to the particular word line (W1) while keeping the threshold values Vth of memory cell transistor M11 and M81 at the voltage values (+6.5 V to +7.0 V) of erasing.

(4) When the data pieces "01" are to be actually written in the nonvolatile memory cell, the registers which stores the data pieces "01" are searched or retrieved, and only the bit lines (BL2 and BL7) connected to the "01" storing registers (e.g., RG2 and RG7) are selected. Only the selected bit lines are precharged to a specified potential (+5 V) (or, only transistors Tg2 and Tg7 connected to the selected bit lines are switched OFF).

Then, a word line drive pulse having a positive voltage amplitude (e.g., +3 V) equivalent to the data pieces "01" is applied to the particular word line W1) by several pulses to about 10 pulses.

Thus, even without verification of the write data, the threshold values Vth of transistors M21 and M71 can accurately have the voltage values (e.g., +3.7 V) corresponding to the data pieces "01" (with little variations).

(5) When the data pieces "10" are to be actually written in the nonvolatile memory cell, the registers storing the data "10" are searched or retrieved, and only the bit lines (BL3 and BL6) of the "10" storing registers (e.g., RG3 and RG6) are selected. Only the selected bit lines are precharged to a specified potential (+5 V) (or only transistors Tg3 and Tg6 connected to the selected bit lines are switched OFF).

Then, a word line drive pulse having a positive voltage amplitude (e.g., +2 V) equivalent to the data pieces "10" is applied to the particular word line (W1) by several pulses to about 10 pulses.

Thus, even without verification of the write data, the threshold values Vth of transistors M31 and M61 can accurately take the voltage values (e.g., +3.0 V) corresponding to the data pieces "10" (with little variations).

(6) When the data pieces "11" are to be actually written in the nonvolatile memory cell, the registers storing the data "11" are searched or retrieved, and only the bit lines (BL4 and BL5) of the "11" storing registers (e.g., RG4 and RG5) are selected. Only the selected lines are precharged to a specified potential (+5 V) (or only transistors Tg4 and Tg5 connected to the selected bit lines are switched OFF).

Then, a word line drive pulse having a positive voltage amplitude (e.g., +1 V) equivalent to the data pieces "11" is applied to the particular word line (W1) by several pulses to about 10 pulses.

Thus, even without verification of the write data, the threshold values of transistors M41 and M51 can accurately take the voltage values (e.g., +2.3 V). corresponding to the data pieces "11" (with little variations).

According to the above-described data writing operations (3) to (6), the same data pieces (e.g., "11") are simultaneously written in a plurality of memory cell transistors (e.g., M41 and M51) in block. This increases a speed for data writing per memory block.

The writing procedure (3) to (6) is not limited to the order of the data pieces "00", "01", "0", and "11". This order may be optionally set. For instance, writing may start from the data pieces stored in more large (or small) number of the registers in which the same data pieces have been written.

It may be better to gradually increase a bit line potential with increase in number of the applied drive pulses (particularly, with an exponential curve), rather than constantly keeping the precharged level of the selected bit lines at +5 V. This will facilitate reduction in the threshold value variations after writing. More specifically, when specified data is to be written in the memory cell transistor (or when the threshold value is set to a prescribed value) by repeatedly applying the word line drive signal (WDP), the bit line potential is kept low during the initial period of applying the word line drive signal. As the application of the word line drive signal is repeated, the bit line potential is gradually increased. In this case, a rate of change in the threshold values of the memory transistor with respect to the number of repetitions of applying the word line drive signal will be made small (especially during the initial period of applying the word line drive signal), thereby reducing variations in threshold values obtained by means of application of a certain word line drive signal.

Moreover, even if a leakage current flows to a particular bit line during data writing after completion of erasing, fluctuations in the bit line potential can be limited or suppressed by supplying the bit line with a small current from small current supplying means (201) for compensating for the leakage current.

Another important feature of the invention is that when a drive signal (WDPOUT) is applied to the control gate of memory cell transistors connected to a bit line (e.g., main bit line BLa1 or a sub-bit line BLsa1), this bit line is separated from the peripheral equipment so that this bit line is floated. It is one of the material feature of the present invention.

BRIEF DESCRIPTION OF THE DRAWINGS

FIGS. 2A and 2B are views illustrating a circuit operation of a word line drive pulse generating circuit (level shifter) used in the memory shown in FIG. 1;

FIGS. 3A and 3B are views illustrating circuit operations of a bit line selection transistor and a memory cell transistor in the memory shown in FIG. 1;

FIG. 4 is a circuit diagram illustrating a structure of a nonvolatile semiconductor memory of a second embodiment of the invention;

FIGS. 6A to 6C are views illustrating operations of memory cells constituting the nonvolatile semiconductor memory shown in FIG. 4 when the word line drive pulse generating circuit (level shifter) shown in FIG. 4 is operated with a wave form shown in FIG. 5;

FIG. 9 is a circuit diagram illustrating a structure of a nonvolatile semiconductor memory of a fourth embodiment of the invention;

FIGS. 10A to 10C are views illustrating a nonvolatile semiconductor memory of a fifth embodiment of the invention;

FIG. 15 is a circuit diagram illustrating another specific example of the SRAM bit circuit shown in the implementation of FIG. 13;

FIG. 17 is a timing chart illustrating the circuit operation of the SRAM bit circuit of FIG. 15;

FIG. 18 is a circuit diagram illustrating a modified example of FIG. 14 or FIG. 15 in which a SRAM bit circuit is provided in a main bit line side;

FIG. 19 is a circuit diagram illustrating a nonvolatile semiconductor memory of a sixth embodiment of the invention;

FIG. 32 is a circuit diagram illustrating yet another example of a bit line charging circuit (small current source 201) for providing drain voltage curve VD3 like that shown in FIG. 28 to a bit line to which the drains of a number of memory cell transistors are connected;

FIG. 33 is a circuit diagram illustrating an example of circuits (132, 140 and Tsw) incorporated in the implementation of FIG. 19 for automatically determining, when word line drive pulse output WDPOUT having a specified positive voltage peak is applied to a particular word line, the timing of terminating application of pulse WDP by monitoring a voltage of the particular bit line;

FIG. 35 is a circuit diagram showing a specific example of a sequential data comparator (170) shown in FIG. 34;

FIG. 36 is a circuit diagram showing another specific example of a sequential data comparator (170) shown in FIG. 34;

FIG. 37 is a flow chart illustrating an operation of writing each (any of 4 values) of 4 kinds of individual data pieces at once into a plurality of memory cell transistors in a memory block; and FIG. 38 exemplifies another circuit diagram for writing each variety of multi-value data pieces at once into a plurality of memory cell transistors in a memory block.

DETAILED DESCRIPTION OF THE PREFERRED EMBODIMENTS

The arrangement and operation of a nonvolatile semiconductor memory (EEPROM) of the present invention will be described below with reference to the accompanying drawings.

Figure 1:
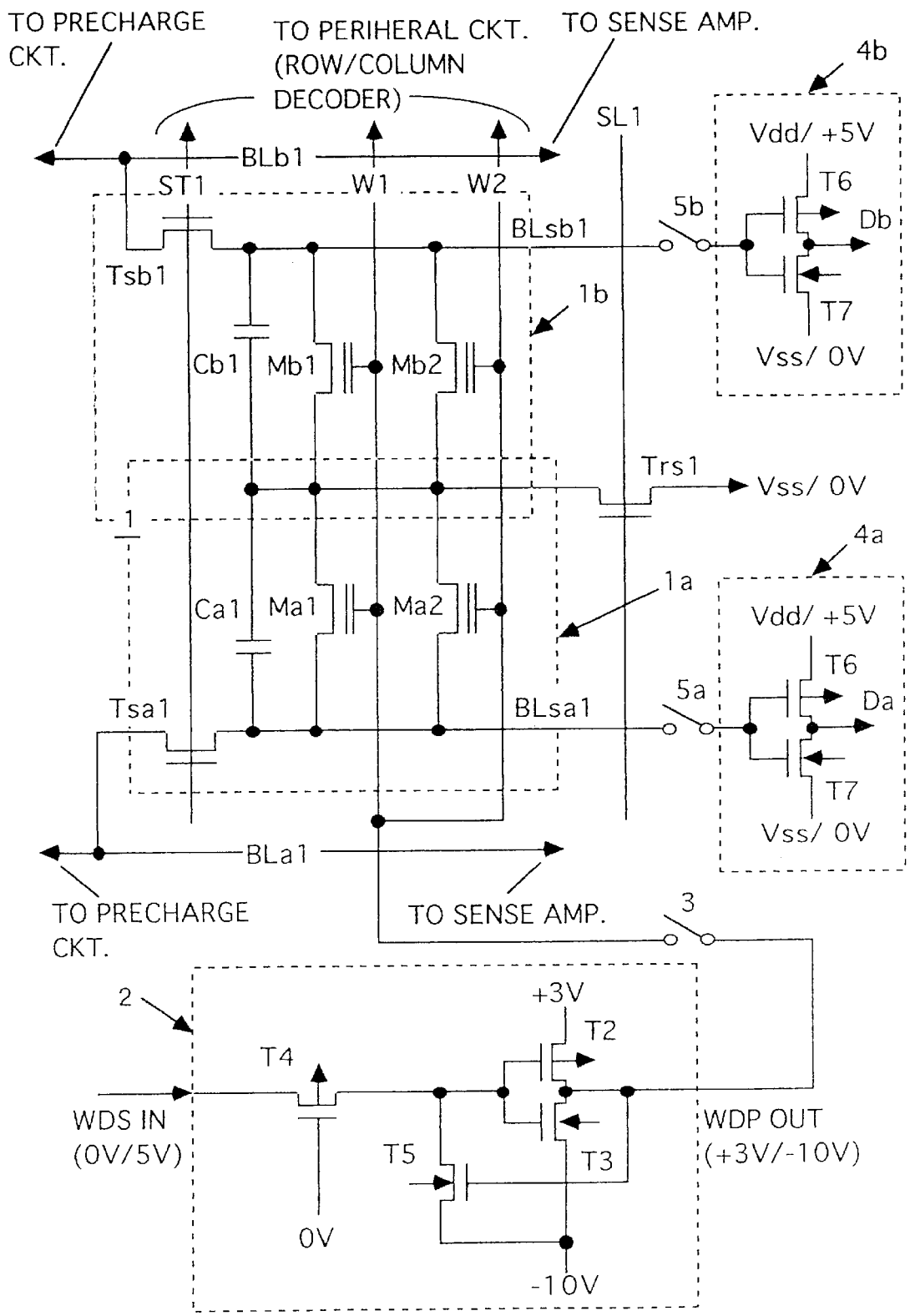
FIG. 1 is a circuit diagram illustrating a nonvolatile semiconductor memory of a first embodiment of the invention.

FIG. 1 is a circuit diagram showing the main part of an EEPROM according to an embodiment of the present invention. Referring to FIG. 1, memory cell array 1 includes bit line selection transistor Tsa1 for selectively connecting main bit line BLa1 to sub-bit line BLsa1, nonvolatile memory cell transistors Ma1 and Ma2 whose drains are connected to sub-bit line BLsa1, and bit line capacitor Ca1 connected between sub-bit line BLsa1 and a common source circuit for nonvolatile memory cell transistors Ma1 and Ma2. Each of nonvolatile memory cell transistors Ma1 and Ma2 has an N-channel MOS transistor structure having a control gate and a floating gate. Nonvolatile charge information is held in the floating gate of each nonvolatile memory cell transistor.

In this case, a sub-bit line is a conductive line connected to the drain (or source) of a memory cell transistor, and a main bit line is a conductive line connected to a sub-bit line via a switch means.

Memory cell array 1 further includes bit line selection transistor Tsb1 for selectively connecting main bit line BLb1 to sub-bit line BLsb1, nonvolatile memory cell transistors Mb1 and Mb2 whose drains are connected to sub-bit line BLsb1, and bit line capacitor Cb1 connected between sub-bit line BLsb1 and a common source circuit for nonvolatile memory cell transistors Mb1 and Mb2. Each of nonvolatile memory cell transistors Mb1 and Mb2 has a control gate and a floating gate. Nonvolatile charge information is held in the floating gate of each nonvolatile memory cell transistor.

The common source circuits for memory cell transistors Ma1, Ma2, Mb1, and Mb2 are selectively connected to a ground circuit (or a negative power supply Vss/0 V circuit) via source-side selection transistor Trs1.

Bit line selection gate line ST1 is connected to the gates of bit line selection transistors Tsa1 and Tsb1, and source-side selection gate line SL1 is connected to the gate of source-side selection transistor Trs1. Word line W1 is connected to the gates of memory cell transistors Ma1 and Mb1, and word line W2 is connected to the gates of memory cell transistors Ma2 and Mb2.

The arrangement of each of the memory cell transistors (Ma1 to Ma2/Mb1 to Mb2) will be described in detail.

The floating gate has a size of 3 $\mu$m×1 $\mu$m and is in contact with portions of the channel and the source/drain through the gate oxide film.

The channel has a size of 1 $\mu$m×1 $\mu$m. The gate oxide film has a thickness of 10 nm.

The insulating film between the floating gate and the control gate is constituted by an ONO film (silicon oxide film/silicon nitride film/silicon oxide film) having a thickness of 15 nm figured out as the thickness of the silicon oxide film.

Bit line selection transistor Tsa1, memory cell transistors Ma1 and Ma2, and bit line capacitor Ca1 constitute memory cell block 1a. Bit line selection transistor Tsb1, memory cell transistors Mb1 and Mb2, and bit line capacitor Cb1 constitute memory cell block 1b.

Referring to FIG. 1, for the sake of easy understanding, each memory cell block includes two memory cell transistors (Ma1 and Ma2 or Mb1 and Mb2). In practice, however, the number of memory cell transistors constituting each memory cell block can be increased (e.g., 256 to 1024 memory cell transistors per block). In this case, the number of word lines (W1 and W2) increases in accordance with the actual number of memory cell transistors.

Memory cell block 1a has a DRAM function using a synthetic capacitance (bit line equivalent capacitance Co: about 100 fF to 300 fF) consisting of the capacitance of bit line capacitor Ca1 and the stray capacitance (parasitic capacitance) of sub-bit line BLsa1 as an information storage means. That is, information can be stored in capacitance Co of sub-bit line BLsa1 according to the same operation principle of the DRAM by charging the bit line equivalent capacitance Co with the voltage of main bit line BLa1 when bit line selection transistor Tsa1 is turned on, and periodically refreshing the voltage of charged capacitance Co.

Memory cell block 1b has a DRAM function using a synthetic capacitance (bit line equivalent capacitance Co of about 100 fF to 300 fF) of the capacitance of bit line capacitor Cb1 and the stray capacitance of sub-bit line BLsb1 as an information storage means. That is, information can be stored in capacitance Co of sub-bit line BLsb1 according to the same operation principle of the DRAM by charging the bit line equivalent capacitance Co with the voltage of main bit line BLb1 when bit line selection transistor Tsb1 is turned on, and periodically refreshing the voltage of charged capacitance Co.

When the arrangement shown in FIG. 1 is regarded as a DRAM using bit line equivalent capacitance Co of sub-bit line BLsa1 (BLsb1) as a memory cell capacitor as described above, main bit line BLa1 (BLb1) corresponds to a bit line of the DRAM, and bit line selection gate line ST1 corresponds to a word line of the DRAM.

As memory elements decrease in size with advances in semiconductor manufacturing techniques, the value of the stray capacitance (the value of the parasitic capacitance between the sub-bit line and the semiconductor region in which the sub-bits line is formed) of sub-bit line BLsa1/BLsb1 tends to decrease. If 100 to 300 fF or more can be ensured as the sum of such stray capacitances and the capacitances between the drains and sources of many memory cell transistors (Ma1 and Ma2/Mb1 and Mb2), capacitors Ca1 and Cb1 can be omitted.

According to an embodiment of the present invention, the potentials of sub-bit lines BLsa1 and Blsb1 can be clamped by the stored contents of a flip-flop circuit (SRAM bit). Details thereof will be described later. Because of this potential clamping, no refreshing operation for the bit line capacity as in a DRAM is required. Further, it is not necessary to store data in capacitors Ca1 and Cb1 when the SRAM bit is provided. Therefore, capacitors Ca1 and Cb1 can be regarded as external components of a memory cell block. However, bit line capacitors Ca1 and Cb1 as well as the floating capacitances (parasitic capacitances) of sub-bit lines BLsa1 and Blsb1 are totally serving as a means for absorbing high-frequency pulsate potential variations of sub-bit lines BLsa1 and Blsb1. Thus, capacitors Ca1 and Cb1 have useful function in this sense.

The above flip-flop circuit (SRAM bit) serves as a high-speed write buffer for memory cell blocks 1a and 1b serving as an EEPROM.

FIG. 1 shows part of the arrangement of the EEPROM. An actual memory cell array includes many main/sub-bit lines, word lines, selection gate lines, selection transistors, memory cell transistors, and the like. These memory cell transistors are arranged in the form of a matrix. Row and column decoder circuits (peripheral circuits) for specifying a predetermined memory cell in accordance with an external address input are connected to this memory cell matrix.

Sub-bit line BLsa1 is connected to charge extraction completion detector 4a via switch circuit 5a, and sub-bit line BLsb1 is connected to charge extraction completion detector 4b via switch circuit 5b. Each of charge extraction completion detectors 4a and 4b is constituted by a CMOS inverter having P-channel MOS transistor T6 on the positive power supply Vdd (+5 V) side, and N-channel MOS transistor T7 on the negative power supply Vss (0 V).

Charge extraction completion detector 4a generates output Da of Vss level (=0 V) if the potential of sub-bit line BLsa1 is higher than the gate threshold (e.g., +2.5 V) of N-channel MOS transistor T7 when switch circuit 5a is closed, and generates output Da of the Vdd level (=5 V) if the potential of sub-bit line BLsa1 is lower than the gate threshold (e.g., 5 V−2.5 V=+2.5 V) of P-channel MOS transistor T6 when switch circuit 5a is closed.

In other words, when output Da from charge extraction completion detector 4a is at Vss level (=0 V), extraction of the charges from the floating gate of target memory cell transistor Ma1 (or Ma2) connected to sub-bit line BLsa1 is not completed. When output Da changes to the Vdd level (=5 V), the completion of extraction of the charges from the floating gate of target memory cell transistor Ma1 (or Ma2) connected to sub-bit line BLsa1 is detected.

Similarly, when output Db from charge extraction completion detector 4b is at the Vss level (=0 V), extraction of the charges from the floating gate of target memory cell transistor Mb1 (or Mb2) connected to sub-bit line BLsb1 is not completed. When output Db changes to the Vdd level (=5 V), the completion of extraction of the charges from the floating gate of target memory cell transistor Mb1 (or Mb2) connected to sub-bit line BLsb1 is detected.

Word lines W1 and W2 are commonly connected to the output circuit of word line drive pulse generator 2 via word line switch circuit 3. Word line drive pulse generator 2 comprises a CMOS inverter (P-channel transistor T2+N-channel transistor T3) connected to a positive power supply of, e.g., +3 V and a negative power supply of, e.g., -10 V, a normally ON P-channel transistor T4 (which becomes a selection transistor if its gate potential is controlled) on the input side, and N-channel transistor T5 for positively feeding back an output from the CMOS inverter to the input side.

Word line drive pulse generator 2 generates pulse output WDPOUT whose potential changes between +3 V and -10 V in accordance with the signal potential of input WDSIN whose potential changes between 0 V and +5 V.

Upon reception of word line drive signal input WDSIN having the waveform shown in FIG. 2A, word line drive pulse generator 2 generates word line drive pulse output WDPOUT having the waveform shown in FIG. 2B. Circuit 2 has a level shifting function of changing a pulse of 0 V/+5 V like the one shown in FIG. 2A to a pulse of +3 V/-10 V like the one shown in FIG. 2B.

When word line switch circuit 3 is turned on, word line drive pulse output WDPOUT of +3 V/-10 V like the one shown in FIG. 2B is supplied to word lines W1 and W2. With this operation, all the memory cell transistors whose control gates are connected to word lines W1 and W2 (i.e., the memory cell transistors each having a drain to which a sufficient sub-bit line potential is applied) can be set to a predetermined threshold to perform a batch erase operation by word line drive pulse output WDPOUT of +3 V/-10 V (a batch erase flash EEPROM operation to be performed for all the bits or a memory block at a time).

Figure 29:
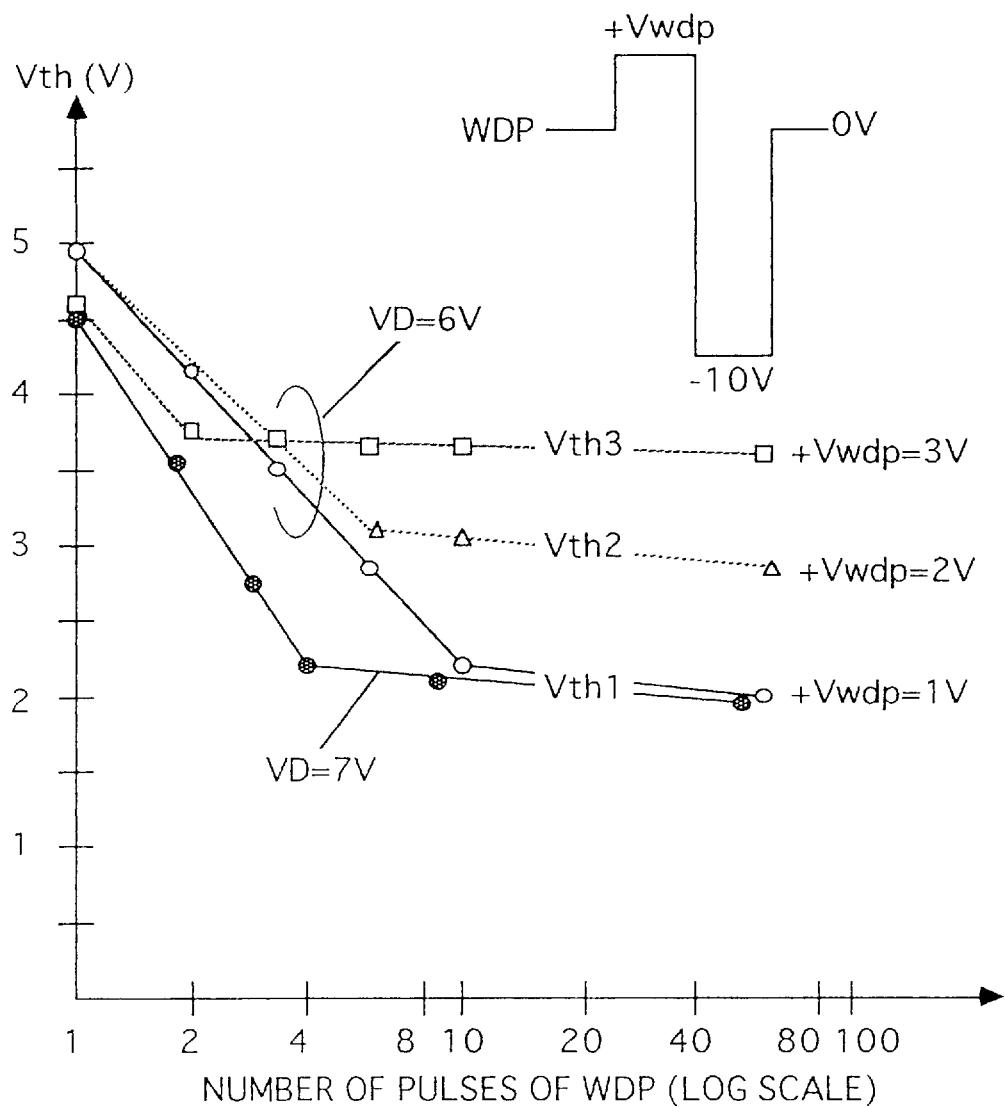
FIG. 29 is a view illustrating the relationship between the number of applied pulses of word line drive pulse WDP and threshold values (Vth1 to Vth3) of the memory cell transistors, when the positive voltage peak of word line drive pulse WDP +Vwdp (the positive voltage side amplitude of control gate voltage VCG of the memory cell transistor) is used as a parameter.

Incidentally, according to the later-mentioned embodiment (multi-value memory) of FIG. 33, the source potential (+3 V in FIG. 1) of transistor T2 in the word line drive pulse generator circuit is optionally set at any of +1 V, +2 V, and +3 V, in correspondence with the content of write data WD. By so doing, threshold voltage VTH of the memory cell transistor to which data is to be written can be converged to a specific value (Vth1=2.3 V, Vth2=3.0 V, and Vth3=3.7 V in the example of FIG. 29) corresponding to the word line drive pulse having a positive potential of +1 V, +2 V, or +3 V.

The circuit operations (erase/leakage current compensation) of bit line selection transistor Tsa1 and memory cell transistor Ma1 of the EEPROM shown in FIG. 1 will be described with reference to FIGS. 3A and 3B. FIG. 3B shows a simplified circuit of the memory arrangement shown in FIG. 1. FIG. 3A shows the waveform of a voltage applied to each component.

Referring to FIG. 3B, main bit line BLa1 is connected to the drain of N-channel MOS memory cell transistor Ma1 via the drain-source path of bit line selection transistor Tsa1, and bit line equivalent capacitance Co and leakage current component equivalent resistance Ro are connected in parallel between the drain and source of transistor Ma1.

In this case, bit line equivalent capacitance Co exhibits the synthetic value of the stray capacitance of sub-bit line BLsa1 and the capacitance of bit line capacitor Ca1, and leakage current component equivalent resistance Ro exhibits the value of a path through which a current leaks from sub-bit line BLsa1 into the source circuit (Vss/0 V) of memory cell transistor Ma1. Assume that bit line equivalent capacitance Co is about 1 pF, and leakage current component equivalent resistance Ro is about 1,000M ohm.

Figures 7A, 7B, 7C:
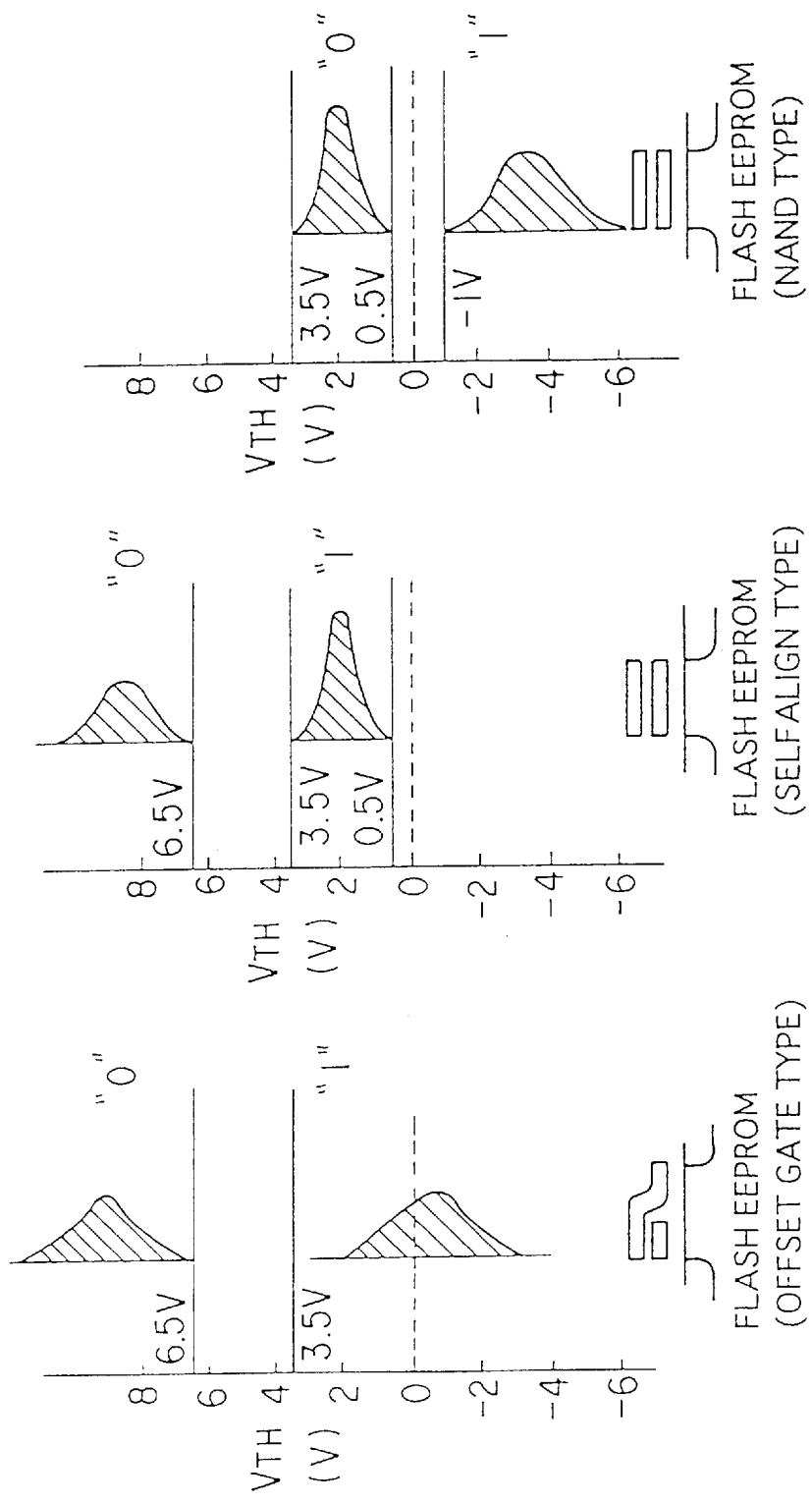
FIGS. 7A to 7C are views illustrating typical EEPROM cell structures and distributions of threshold values among cells therein.

An erase operation (see FIG. 7B) will be described, provided that threshold voltage VTH of nonvolatile memory cell transistor Ma1 is 6.5 V or more at first.

When a potential of +5 V like the one shown at the upper portion in FIG. 3A is applied to main bit line BLa1 while a potential of +5 V like the one shown at the intermediate left portion in FIG. 3A is applied to bit line selection gate line ST1, transistor Tsa1 is turned on, and sub-bit line BLsa1 is precharged to almost +5 V (a reference potential, 0 V=Vss, is set in the source circuit of memory cell transistor Ma1).

When the potential of bit line selection gate line ST1 is lowered to 0 V after the above operation as indicated by the intermediate left portion near the center in FIG. 3A, transistor Tsa1 is turned off, and sub-bit line BLsa1 is electrically disconnected from main bit line BLa1 to be set in a floating state. In this state, the precharge potential of +5 V of sub-bit line BLsa1 is maintained by the charges stored in bit line equivalent capacitance Co as a small capacitance (1 pF).

Subsequently, a word line drive pulse like the one shown at the lower left portion near the center in FIG. 3A is applied to the control gate of memory cell transistor Ma1 via word line W1. As this pulse, output WDPOUT from word line drive pulse generator 2 in FIG. 1 is used. In this case, the interval (0 V interval) during which the word line drive pulse shown at the lower portion in FIG. 3A is not generated is the interval during which word line switch circuit 3 in FIG. 1 is kept off. In the interval during which this pulse is generated, word line switch circuit 3 is kept on.

When word line switch circuit 3 is turned on, a voltage of +3 V is applied to the control gate of memory cell transistor Ma1 for a short period of time (e.g., 20 μs). However, since threshold voltage VTH is assumed to be 6.5 V or more at first, transistor Ma1 is kept off. At this point, if a drop in sub-bit line potential due to a leakage current flowing via leakage current component equivalent resistance Ro can be still regarded as a negligible state, the floating state (+5 V) of sub-bit line BLsa1 can be maintained.

When a word line drive pulse of -10 V is applied to the control gate of memory cell transistor Ma1 for a short period of time (e.g., 10 μs), a tunnel current flows between the floating gate and drain of memory cell transistor Ma1 whose drain is precharged to +5 V. With this tunnel current, some of the charges in the floating gate are extracted. As a result, threshold voltage VTH of memory cell transistor Ma1 drops to some degree.

Even if threshold VTH of memory cell transistor Ma1 drops to some degree, memory cell transistor Ma1 is not turned on as long as threshold voltage VTH is higher than +3 V equal to the voltage of the word line drive pulse.

Even in the interval during which memory cell transistor Ma1 is kept off, if a sufficient precharge potential is applied to the drain, charges are extracted from the floating gate little by little in the form of a tunnel current every time a word line drive pulse of −10 V is applied. As a result, threshold voltage VTH gradually drops.

The charge voltage (sub-bit line precharge potential) of bit line equivalent capacitance Co drops with time owing to a tunnel current flowing in the floating gate of memory cell transistor Ma1 and a leakage current flowing in leakage current component equivalent resistance Ro. If this precharge potential excessively drops (i.e., the drain voltage of memory cell transistor Ma1 excessively drops), no tunnel current flows in the floating gate even if a voltage of −10 V is applied thereto. In such a case, a gradual drop in threshold voltage VTH of transistor Ma1 stops before the voltage reaches a desired value (e.g., +2.5 V) corresponding to +3 V of the word line drive pulse.

In order to prevent a drop in the sub-bit line precharge potential, according to the arrangement shown in FIGS. 3A and 3B, bit line selection transistor Tsa1 is intermittently and instantaneously turned on in the interval during which word line drive pulse output WDPOUT is applied to word line W1, thereby injecting a small amount of charge from main bit line BLa1 into sub-bit line BLsa1 in a floating state.

More specifically, word line switch circuit 3 in FIG. 1 is turned off in accordance with the timing at which the potential of sub-bit line BLsa1 in the floating state drops to some degree, and the application of word line drive pulse output WDPOUT to word line W1 is interrupted (for a period equal to or shorter than one period, 30 μs, of pulse WDPOUT, e.g., 7 μs), as indicated by the lower central portion in FIG. 3A. Thereafter, as indicated by the intermediate central portion in FIG. 3A, a short pulse of 5 V (e.g., a pulse of a width 3 μs with an OFF interval of 2 μs between the adjacent pulses) is applied to bit line selection transistor Tsa1 to instantaneously turn it on in the interval during which word line drive pulse output WDPOUT is not generated, thereby restoring sub-bit line BLsa1, whose potential has dropped, to the precharge state corresponding to +5 V.

With a combination of the pulses indicated by the intermediate and lower portions in FIG. 3A described above, the potential (about +5 V) of sub-bit line BLsa1 in a floating state is ensured even if a bit line leakage current flows. With this operation, by repeatedly applying word line drive pulse output WDPOUT of −10 V, charges are extracted from memory cell transistor Ma1 in the floating gate little by little.

When threshold voltage VTH of memory cell transistor Ma1s drops to a desired value (+2.5 V) as a result of the extraction of the charges, memory cell transistor Ma1 is turned on by word line drive pulse output WDPOUT of +3 V, and the potential of sub-bit line BLsa1 drops to 0 V. Subsequently, the extraction of charges from the floating gate of memory cell transistor Ma1 is stopped, and threshold voltage VTH of memory cell transistor Ma1 is accurately set to a desired value, i.e., +2.5 V (corresponding to the erased state of memory cell transistor Ma1).

The completion of the erase operation of memory cell transistor Ma1 is detected (Da="1") by charge extraction completion detector 4a shown in FIG. 1 and connected to sub-bit line BLsa1. After the completion of the erase operation is detected, the application of the pulse having a width of 3 μs and indicated by the intermediate central portion in FIG. 3A is also stopped.

If the above erase operation is simultaneously performed with respect to all the memory cell transistors (Ma1 and Ma2) of memory cell block 1a, a batch erase operation (flash erase operation) in units of blocks can be realized. If this erase operation is simultaneously performed with respect to all the memory cell blocks, a batch erase operation in units of memory chips can be realized. If this erase operation is sequentially performed for each memory cell transistor, an erase operation in units of bits can be realized.

In any of the erase operations, the potential of a sub-bit line is kept at a predetermined value (about +5 V), and extraction of charges from the floating gate of each memory cell transistor is sequentially performed while the sub-bit line potential is sequentially compared with a predetermined word line potential (+3 V). Therefore, threshold voltages VTH of all the memory cell transistors can be caused to accurately converge to a desired value (+2.5 V).

In addition, since this converging operation can be completed by 10 pulses of word line drive pulse output WDPOUT (a maximum of about 300 μs using pulses each corresponding to 30 μs), a flash erase operation in units of blocks or memory chips can be performed at a high speed (within 300 μs).

A mechanism for preventing an over-erased state when threshold voltage VTH of memory cell transistor Ma1 is lower (e.g., +2 V) than the desired value will be described next.

First of all, similar to the case wherein threshold voltage VTH is higher than the desired value, potential Vss of the source line of memory cell transistor Ma1 is set to the ground potential, i.e., 0 V, and bit line selection transistor Tsa1 is turned on to precharge the potential of sub-bit line BLsa1 to +5 V. Thereafter, bit line selection transistor Tsa1 is turned off to set sub-bit line BLsa1 in a floating state corresponding to +5 V. In this case, bit line equivalent capacitance Co is in a charged state or in a floating state.

Subsequently, a word line drive pulse like the one indicated by the lower portion in FIG. 3A is applied to word line W1. Since the drain of memory cell transistor Ma1, whose threshold voltage VTH is lower (+2 V) than the desired value, is set at the sub-bit line precharge voltage (+5 V), when a pulse of +3 V is applied to the control gate, memory cell transistor Ma1 is turned on. As a result, a channel current flows between the drain and source of this memory cell transistor, and bit line equivalent capacitance Co is discharged, leading to a drop in drain voltage. In this state, even if a pulse of −10 V is applied to the control gate of memory cell transistor Ma1, no tunnel current flows between the floating gate and the drain. For this reason, charges are not extracted any more from the floating gate of memory cell transistor Ma1 whose initial threshold voltage VTH is low, thus preventing an over-erased state.

Assume that 10 pulses of word line drive pulse output WDPOUT are applied to a memory cell transistor, whose threshold voltage VTH is lower than the desired value (+2.5 V), after data "0" is written, and charges are injected into the floating gate to raise threshold voltage VTH (+6.5 V or more). In this case, threshold voltage VTH converges to the desired value (+2.5 V).

As described above, in the EEPROM of the present invention, threshold voltage VTH of a memory cell transistor whose initial threshold voltage VTH is higher than the desired value is caused to converge to the desired value, and no charges are extracted from the floating gate of a memory cell transistor whose initial threshold voltage VTH is lower than the desired value.

With this operation, even if a plurality of memory cell transistors exhibiting variations in threshold voltage VTH are subjected to a batch erase operation, no memory cell undergoes an over-erased state, and threshold voltages VTH of almost all the memory cell transistors can be caused to accurately converge to the desired value. The present invention, therefore, does not require a time-consuming operation of "matching the thresholds of nonvolatile memories by a write operation before an erase operation" in the prior art.

Further, the multi-value memory of the present invention utilizes a feature that threshold voltage VTH of each of the memory cell transistors can be accurately converged to a desired value. According to this feature, even if two or more different threshold voltages are used for storing two or more different information pieces, these different threshold voltages can be exactly distinguished from one another (since the distributions of variations of respective threshold voltages are not overlapped each other).

The erase, write, read, and refresh operations of the DRAM type memory shown in FIG. 1 or 3B will be summarized.

[Erase Operation]

(1) The row (gate line ST1) and column (bit line BLa1/BLb1) of a DRAM cell portion including at least one target memory cell transistor (e.g., Ma1 or Ma2, or Mb1 or Mb2) to be subjected to an erase operation are designated by row and column decoders (not shown), and a selection transistor (Tsa1/Tsb1) is turned on. With this operation, the DRAM cell portion (sub-bit line BLsa1/BLsb1) is precharged to +5 V.

(2) While the drain (sub-bit line BLsa1/BLsb1) of at least one target memory cell transistor (Ma1 or Ma2, or Mb1 or Mb2) is precharged to +5 V, erase word line drive pulse WDPOUT like the one shown in FIG. 2B is applied to the control gate (word line W1/W2) of at least one target memory cell transistor (Ma1 or Ma2, or Mb1 or Mb2). With this operation, the threshold of each target memory cell transistor (Ma1 or Ma2, or Mb1 or Mb2) is caused to converge to the desired value (e.g., +2.5 V) (batch erase operation of all bits; flash EEPROM operation). With this batch erase operation of all the bits, for example, data "1" (corresponding to a threshold of 2.5 V) is written in each memory cell transistor.

[Write Operation (after erase operation)]

(1) The row (gate line ST1) and column (bit line BLa1) of a DRAM cell portion (bit line equivalent capacitance Co of sub-bit line BLsa1) including a target memory cell transistor (e.g., Ma1) to be subjected to a write operation are designed by row and column decoders (not shown), and a selection transistor (Tsa1) is turned on (if the power supply voltage of the memory is +5 V, for example, a voltage of +7 V is applied to the gate of selection transistor Tsa1). With this operation, bit line equivalent capacitance Co of the DRAM cell portion is charged to a write data voltage (a voltage corresponding to "1" or "0"; data "1" corresponding to, e.g., 0 V, and data "0" corresponding to, e.g., +5 V).

(2) The drain (sub-bit line BLsa1) of a target memory cell transistor (Ma1) is set to a write voltage (the charge voltage of bit line equivalent capacitance Co), and a high write voltage (e.g., +6 V) is applied to the control gate (word line W1) of this memory cell transistor (Ma1), thereby injecting hot electrons corresponding to the write voltage into the floating gate of the memory cell transistor (Ma1). With this operation, information is written in the target memory cell transistor (Ma1) using the DRAM cell portion (sub-bit line BLsa1) as a write buffer.

More specifically, if the write data stored in bit line equivalent capacitance Co is "0" (sub-bit line BLsa1=+5 V), hot electrons are injected into the floating gate of the target memory cell transistor (Ma1) to raise its threshold to, e.g., 6.5 V or more. If the write data is "1" (sub-bit line BLsa1=0 V), the threshold of the target memory cell transistor (Ma1) is kept at 2.5 V as in an erase operation without injecting any hot electrons.

Incidentally, according to a certain configuration of the multi-value memory, the above-exemplified numeric values should be modified as needed. More specifically, assume that a "large" write voltage (e.g. +Vwdp=3 V) is applied to the control gate of the memory cell transistor (Ma1) to which data will be written, while the write data held at sub-bit line capacitance Co represents data of "0" (in the example of FIG. 29, sub-bit line Blsa1=VD=+6 V). In this case, a tunnel current flows into the floating gate of this memory cell transistor in correspondence with the "large" write voltage, and the threshold voltage thereof becomes about 3.7 V at a certain time point. When a "middle" write voltage (e.g., +Vwdp=2 V) is applied, another tunnel current flows into the floating gate of the memory cell transistor in correspondence with the "middle" write voltage, and the threshold voltage becomes about 3.0 V at a certain time point. Similarly, when a "small" write voltage (e.g., +Vwdp=1 V) is applied, still another tunnel current flows into the floating gate of the memory cell transistor in correspondence with the "small" write voltage, and the threshold voltage becomes about 2.3 V at a certain time point.

When the multi-value memory is formed of four-value memory cells, the following example of relations between multi-value data pieces A1/A2 and the threshold voltages (center value of variations) can be obtained:

| MULTI-VALUE | DATA PIECES | THRESHOLD VALUE |
|---|---|---|
| A1 | A2 | VTH (V) |
| 0 | 0 | 6.5 to 7.0 |
| 0 | 1 | 3.7 |
| 1 | 0 | 3.0 |
| 1 | 1 | 2.3 |

[Read Operation]

(1) The row (gate line ST1) and column (bit line BLa1) of a DRAM portion (equivalent capacitance Co of sub-bit line BLsa1) including a target memory transistor (e.g., Ma1) to be subjected to a read operation are designated by row and column decoders (not shown), and a selection transistor (Tsa1) is turned on. With this operation, the potential of the DRAM cell portion (sub-bit line BLsa1) is precharged to a low voltage (e.g., +1 to 2 V) which does not cause injection of electrons (hot electrons) into the target memory cell transistor (Ma1). For this purpose, the potential of the column (bit line BLa1) in a read operation is set to be relatively low (e.g., +2.5 V).

(2) The potential of the control gate (word line W1) of the target memory cell transistor (Ma1) is set to an intermediate potential (about +4 V) between data "0" (a threshold of +6.5 V) and data "1" (a threshold of +2.5 V).

If the data stored in the target memory cell transistor (Ma1) is "0", since the transistor (Ma1) is kept off, the potential of the DRAM cell portion (sub-bit line BLsa1) is set at the preset potential (+1 to 2 V). This potential is detected by a sense amplifier (not shown) connected to sub-bit line BLsa1 and is read out as data "0".

If the data stored in the target memory cell transistor (Ma1) is "1", this transistor (Ma1) is turned on (a memory cell current flows). As a result, the potential of the DRAM cell portion (sub-bit line BLsa1) drops to almost 0 V. This potential of almost 0 V is detected by a sense amplifier (not shown) connected to sub-bit line BLsa1 and is read out as data "1".

[Refresh Operation]

(1) The voltage information (high/low voltage) stored in bit line equivalent capacitance Co of a DRAM cell portion (sub-bit line BLsa1) is periodically read out by a sense amplifier (not shown).

(2) The sense amplifier detects the high voltage information (+5 V in a write operation; +1 to 2 V in a read operation) of sub-bit line BLsa1 and, at the same time, recharges sub-bit line BLsa1 with the same voltage as that detected.

In the above manner, the voltage information stored in the DRAM cell portion (sub-bit line BLsa1) is refreshed in a data read operation or at a predetermined refresh period (this operation is the same as that in a known DRAM). With this operation, the information (the voltage information stored in bit line equivalent capacitance Co) in the DRAM cell portion is maintained unless the information is rewritten by an external unit or the power supply of the apparatus is turned off.

A nonvolatile semiconductor memory according to the second embodiment of the present invention will be described next with reference to FIG. 4. The arrangement of the embodiment shown in FIG. 4 is the same as that of the first embodiment except that a word line drive pulse generator 2a has an arrangement different from that of the word line drive pulse generator 2. For this reason, a description of identical portions will be omitted.

Word line drive pulse generator 2a comprises CMOS inverter 6 constituted by transistors T8 and T9, CMOS inverter 7 constituted by transistors T10 and T11, CMOS inverter 8 constituted by transistors T12 and T13, speed-up circuit 9 (increasing the rising/falling speed of an input pulse to CMOS inverter 8) constituted by a series circuit of inverters I1 and I2 and capacitor C1, normally ON transistor T14 (serving as a selection transistor upon control of the gate potential), and positive feedback transistor T15. The drains of transistors T11 and T12 are connected to each other and to the input terminal of CMOS inverter 6, and a voltage of 0 V is applied to the connection point thereof.

The positive power supply (the source side of P-channel MOS transistor T10) of CMOS inverter 7 is set at a voltage of +3 V (or +5 V), which corresponds to the positive pulse potential of word line drive pulse output WDPOUT. The output terminal of CMOS inverter 7 is connected to the source of P-channel MOS transistor T8.

The negative power supply (the source side of N-channel MOS transistor T13) of CMOS inverter 8 is set at a voltage of −10 V, which corresponds to the negative pulse potential of word line drive pulse output WDPOUT. The output terminal of CMOS inverter 8 is connected to the source of N-channel MOS transistor T9.

The source of N-channel MOS transistor T11 and the drain of P-channel MOS transistor T12 are connected to the input terminal of CMOS inverter 6. The output terminal of speed-up circuit 9 and the drain of N-channel MOS transistor T15 are connected to the input terminal of CMOS inverter 8, and the gate of transistor T15 is connected to the output terminal of CMOS inverter 8. The source of transistor T15 is connected to a negative power supply of −10 V.

Pulses each having a peak value of 5 V are respectively applied to the input terminals of CMOS inverters 7 and 8. A positive voltage of +3 V (or +5 V) is applied to the source of transistor T10. A negative voltage of −10 V is applied to the source of transistor T13.

Figure 5A:
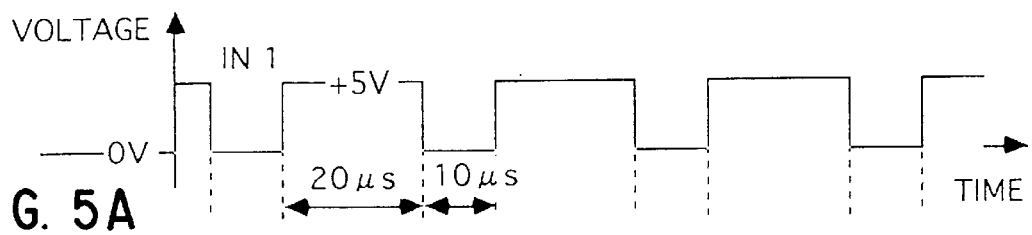
FIGS. 5A to 5F are views illustrating two examples of a circuit operation of a word line drive pulse generating circuit (level shifter) used in the memory shown in FIG. 4.
Figure 5B:
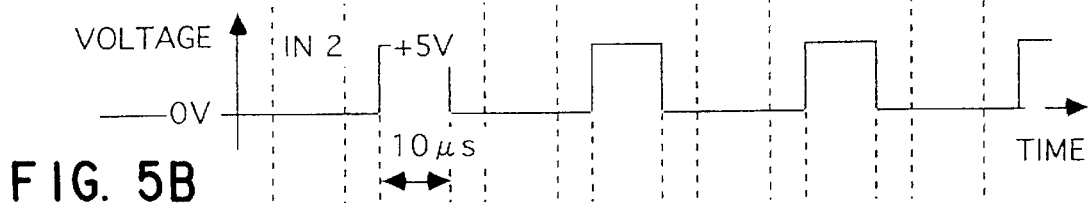
Figure 5C:
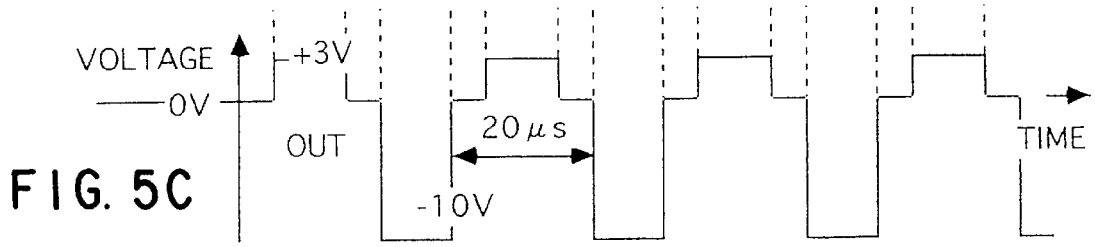

When word line drive signals WDSIN1 and WDSIN2 like those shown in FIGS. 5A and 5B are input to word line drive pulse generator 2a in FIG. 4, word line drive pulse output WDPOUT like the one shown in FIG. 5C can be obtained, provided that the positive power supply voltage of CMOS inverter 7 is +3 V.

Figure 5D:
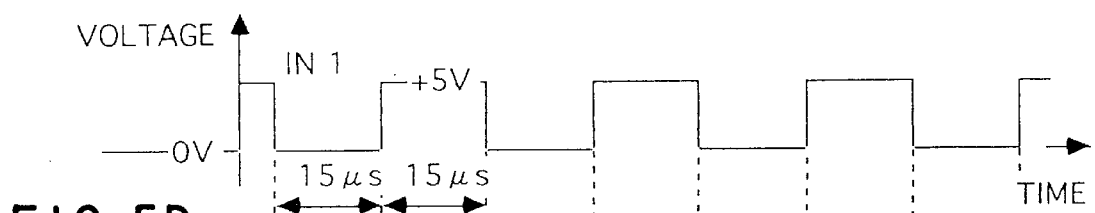
Figure 5E:
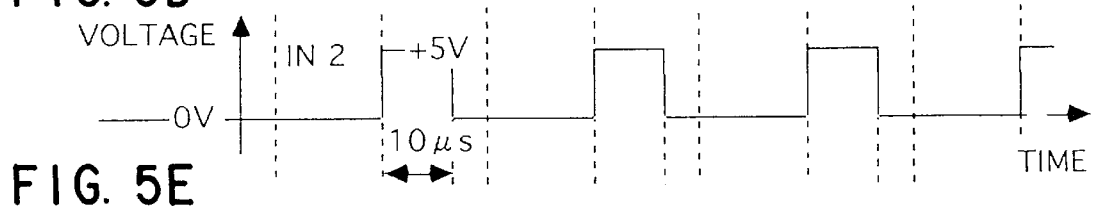
Figure 5F:
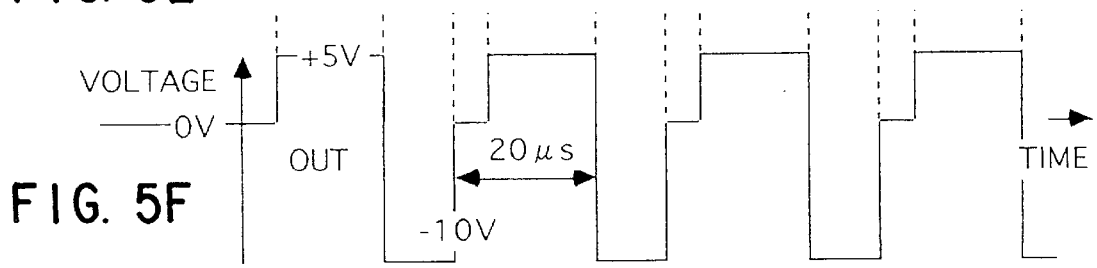

When word line drive signals WDSIN1 and WDSIN2 like those shown in FIGS. 5D and 5E are input to word line drive pulse generator 2a in FIG. 4, word line drive pulse output WDPOUT like the one shown in FIG. 5F can be obtained, provided that the positive power supply voltage of CMOS inverter 7 is +5 V.

If word line drive pulse output WDPOUT in FIG. 5C is applied to each of memory cell transistors Ma1 and Ma2/Mb1 and Mb2 in FIG. 4, threshold voltage VTH of each memory cell transistor can be caused to converge to a value corresponding to the voltage, +3 V, of pulse WDPOUT while electrons are extracted little by little from the floating gate of each memory cell transistor when pulse WDPOUT is set at −10 V.

If word line drive pulse output WDPOUT in FIG. 5F is applied to each of memory cell transistors Ma1 and Ma2/Mb1 and Mb2 in FIG. 4, threshold voltage VTH of each memory cell transistor can be caused to converge to a value corresponding to the voltage, +5 V, of pulse WDPOUT while electrons are extracted little by little from the floating gate of each memory cell transistor when pulse WDPOUT is set at −10 V.

Incidentally, FIGS. 5C and 5F show different waveforms of pulses WDPOUT to demonstrate variations.

More specifically, word line drive pulse output WDPOUT having various waveforms can be obtained by properly changing the duty ratios of word line drive signals WDSIN1 and WDSIN2 and/or modifying the phase relation between these word line drive signals. In addition, by properly changing the source potential (+3 V/+5 V) of P-channel MOS transistor T10 in FIG. 4, the positive side voltage amplitude of word line drive pulse output WDPOUT can be set at various values. Further, by properly changing the source potential (−10 V) of N-channel MOS transistor T13, the negative side voltage amplitude of word line drive pulse output WDPOUT can also be set at various values.

When the present invention is applied to a multi-value memory, the positive side voltage amplitude of word line drive pulse output WDPOUT is set at any of various values in correspondence with different threshold voltages of one memory cell transistor (e.g., Ma1), in order that the threshold voltage represents any of multi-values to be stored. The setting of the positive side voltage amplitude of WDPOUT can be easily performed by properly changing the source potential of P-channel MOS transistor T10 in FIG. 4. At this time, the negative side voltage amplitude of WDPOUT may be changed in correspondence with the change in the positive side voltage amplitude thereof. However, the negative side voltage amplitude of WDPOUT may be fixed at about −10 V regardless of the change in the positive side voltage amplitude of WDPOUT so as to simplify the circuit configuration.

The influence of large leakage of charges precharged in sub-bit line BLsa1 due to leakage current component equivalent resistance Ro shown in FIG. 3B will be described next.

The leakage current of sub-bit lines will be caused by tunnel currents among the drains of memory cell transistors while the gates thereof are applied with negative voltages, and/or by lattice defects near the drain diffusion layers of memory cell transistors. As for the leakage current, the former tunnel currents would be more significant than the latter lattice defects.

Assume that word line drive pulse generator 2a in FIG. 4 is operated with the waveforms shown in FIGS. 5D to 5F. In this case, FIG. 6A exemplifies voltage waveform VFG at the floating gate of a MOS transistor constituting each memory cell; FIG. 6B, voltage change VBL at a sub-bit line to which the MOS transistor is connected; and FIG. 6C, voltage waveform VCG at the control gate of the MOS transistor.

Referring to FIGS. 6A to 6C, assume that curve (a) corresponds to memory cell transistor Ma1 in FIG. 4; curve (b), memory cell transistor Mb1 in FIG. 4; and curve (c), a memory cell transistor connected to the third sub-bit line.

If the value of equivalent resistance Ro shown in FIG. 3B is small, i.e., a leakage current in the sub-bit line is large, floating gate voltage VFG does not easily converge to a desired value. FIG. 6A shows a waveform in such a case.

More specifically, when a pulse whose peak value fluctuates from 5 V to −10 V is applied to the control gate of a nonvolatile memory cell transistor to perform an erase operation as shown in FIG. 6C, floating gate voltage VFG fluctuates in accordance with the amplitude of a pulse applied to the control gate electrode as shown in FIG. 6A. In this process, owing to the leakage current (leakage current flowing via resistance Ro) in the sub-bit line, sub-bit line voltages VBL to which nonvolatile memory cell transistors (a), (b), and (c) are connected abruptly drop (at different change rates), as shown in FIG. 6B. If, however, the sub-bit line potential drops too quickly, the threshold voltages of nonvolatile memory cell transistors (a), (b), and (c) having different floating gate voltages VFG do not 5easily converge to predetermined threshold voltage VTH.

By using the embodiment shown in FIG. 3B, a drop in sub-bit line voltage like the one shown in FIG. 6B can be prevented by the intermittent ON operation of bit line selection transistor Tsa1. Therefore, threshold voltage VTH (corresponding to floating gate voltage VFG) of each memory cell transistor can be reliably caused to converge to the desired value.

In the embodiment shown in FIGS. 3A and 3B, the leakage current compensation circuit (Tsa1) compensates for charges escaping via leakage current component equivalent resistance Ro. For this reason, the charges stored in sub-bit line BLsa1 can be held for a long period of time while bit line selection transistor Tsa1 is kept off. Thus, a DRAM arrangement capable of setting a long refresh period can be realized by using bit line selection transistor Tsa1 as a transfer gate, and equivalent capacitance Co of sub-bit line BLsa1 as an information storage capacitance.

In the embodiments shown in FIGS. 3A and 3B, even if a leakage current flows, the high potential information in sub-bit line BLsa1 can be kept. The low potential information in sub-bit line BLsa1 can be kept by setting transistor Tsa1 or Ta in an OFF state.

However, if the application of pulses of FIG. 6C to the gate of the memory cell transistor (c) continues even after the threshold voltage of this transistor (c) is converged to predetermined threshold voltage VTH (i.e., after the data writing is completed), this transistor (c) continues its on/off switching. Then, voltage VBL of the sub-bit line (BLsa1/BLsa2) is subjected to potential variations (which may correspond to amplified vibrations of tiny changes in the waveform (c) of FIG. 6B) being synchronized to the pulses of FIG. 6C. (More concrete examples of the potential variations are shown in FIG. 9B of Japanese Patent Application No. 6-222734.)

These potential vibrations of the sub-bit line can be removed by SRAM bit 30 (or 30a and 30b) in the embodiments of FIG. 10.

Figure 8:
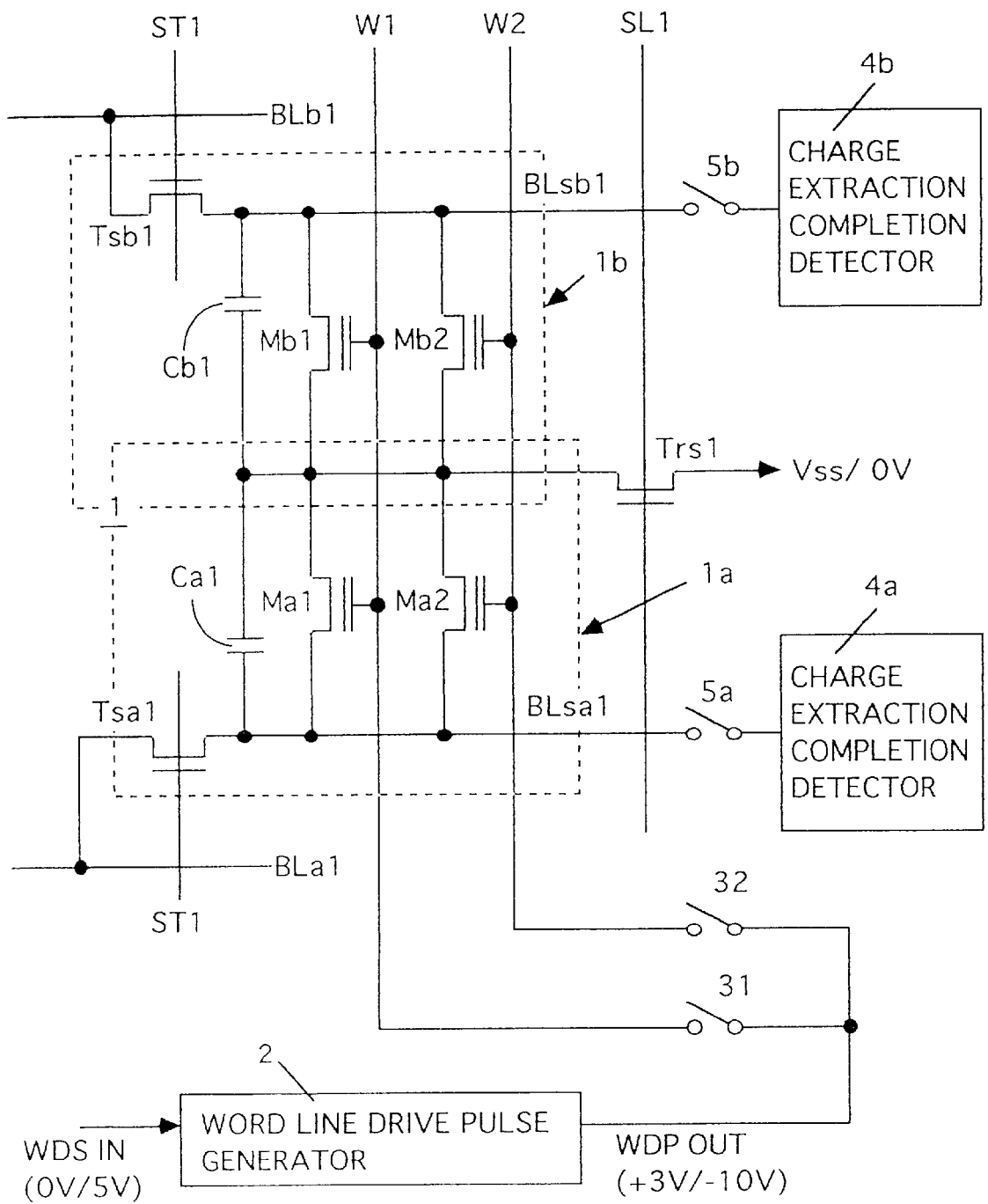
FIG. 8 is a circuit diagram illustrating a structure of a nonvolatile semiconductor memory of a third embodiment of the invention.

FIG. 8 shows the arrangement of a nonvolatile semiconductor memory according to the fifth embodiment of the present invention, which is also a modification of the embodiment shown in FIG. 1 or 4.

The number of word line switch circuits 3 in FIG. 1 may be set to be equal to the number of memory cell transistors Ma1 and Ma2 (Mb1 and Mb2) constituting memory cell block 1a (1b), as shown in FIG. 8. If, for example, memory cell block 1a is constituted by 1,024 memory cell transistors Ma1 to Ma1024, 1,024 word line switch circuits are prepared. Alternatively, word line switch circuit 3 may be constituted by a multiplexer for sequentially connecting the output terminal of word line drive pulse generator 2 to 1,024 word lines W1 to W1024.

Referring to FIG. 8, if all word line switch circuits 31 and 32 are simultaneously turned on to simultaneously connect all the word lines to the output terminal of word line drive pulse generator 2, the data in the memory cell transistors in all the memory cell blocks can be simultaneously erased (a batch erase operation of a flash EEPROM).

If word line switch circuits 31 and 32 are turned on each at a time to connect a specific word line to the output terminal of word line drive pulse generator 2, the data in only specific memory cell transistors in each memory cell block can be erased (an erase operation in a bit unit).

FIG. 9 shows the arrangement of a nonvolatile semiconductor memory according to the sixth embodiment of the present invention, which is also a modification of the embodiment shown in FIG. 1 or 4.

The number of word line switch circuits 3 may be set to be equal to the number of memory cell blocks 1a (1b), as shown in FIG. 9. If, for example, five hundred and twelve (512) memory cell blocks are arranged, 512 word line switch circuits are prepared. Alternatively, word line switch circuit 3 may be constituted by a multiplexer for sequentially connecting the output terminal of word line drive pulse generator 2 to 512 word lines in units of blocks.

Referring to FIG. 9, if all word line switch circuits 3a and 3b are simultaneously turned on to simultaneously connect all the word lines to the output terminal of word line drive pulse generator 2, the data in the memory cell transistors in all the memory cell blocks can be simultaneously erased (a batch erase operation of a flash EEPROM).

If word line switch circuits 3a to 3b are turned on each at a time to connect the output terminal of word line drive pulse generator 2 to each word line of a specific memory cell block, the data in all the memory cell transistors in each memory cell block can be erased in units of blocks (erase operation in units of blocks).

FIGS. 10A to 10C are views illustrating a nonvolatile semiconductor memory of a fifth embodiment of the invention. More particularly, FIG. 10A illustrates main parts of the structure of the memory; FIG. 10B, signal waveforms in the main parts; and FIG. 10C, a partial circuit thereof.

Referring to FIG. 10A, SRAM bit 30a is connected to sub-bit line BLsa1 via SRAM bit connection transistor Tga while SRAM bit 30b is connected to sub-bit line BLsb1 via SRAM bit connection transistor Tgb.

Referring to FIG. 10C, there is shown a circuit structure in the main parts on sub-bit line BLsa1 extracted from the circuit shown in FIG. 10A. Sub-bit line BLsa1 is selectively connected to main bit line BLa1 via bit line selection transistor Tsa1. Memory cell transistor Ma1 is connected to sub-bit line BLsa1. Capacitor Co and leakage current component resistor Ro are equivalently connected to this sub-bit line BLsa1. SRAM bit 30a is further connected to this sub-bit line BLsa1 via SRAM bit connection transistor Tga.

The circuit of FIG. 10C operates in the following manner. First, an address is instructed to memory cell transistor Ma1 for writing data, and sub-bit line BLsa1 is precharged to a potential (+5 V) of main bit line BLa1 (before time t1). Then, at time t1, an uppermost signal in FIG. 10B is applied to the gate of connection transistor Tga. Thereby, a circuit path between the drain and the source of transistor Tga is conducted, so that SRAM bit 30*a* is connected to sub-bit line BLsa1.

Then, in order to precharge sub-bit line BLsa1, signal ST1 (second from the above in FIG. 10B) having been applied to the gate of bit line selection transistor Tsa1 is decreased in level down to 0 V (time t2). Thereby, sub-bit line BLsa1 is electrically separated from main bit line BLa1 so that it is floated with a state charged to a precharge potential.

Thereafter, when word line pulse output WDPOUT (lowermost part in FIG. 10B) is given to the control gate of memory cell transistor Ma1 and this transistor is turned ON (time t3), the potential of sub-bit line BLsa1 changes toward 0 V. At this time, since SRAM bit connection transistor Tga is conductive, SRAM bit 30*a* can detect this change in the sub-bit line potential.

After detection of this sub-bit line potential change, SRAM bit 30 latches a sub-bit line potential (0 V) immediately after the change. Thereby, the potential of sub-bit line BLsa1 is clamped to the latch level (stored content: 0 V) of SRAM bit 30*a* via the conducted connection transistor Tga (third from the above in FIG. 10B).

As a result, even when memory cell transistor Ma1 is repeatedly switched ON/OFF due to continuous application of word line drive pulse outputs WDPOUT after time t3 (e.g., 10 pulses are continuously applied), since the sub-bit line potential has been clamped to the latch level (0 V), there will be few fluctuation in the potential of sub-bit line BLsa1, synchronized to word line drive pulse output WDPOUT.

The above-explanation was made assuming that the memory cell transistor is connected to the sub-bit line (e.g., BLsa1). On the other hand, if the memory cell transistor is connected to the main bit line (e.g., BLa1), when word line drive pulse outputs WDPOUT are applied to the control gate of the memory cell transistor, the main bit line (e.g., BLa1) is temporarily set to a floating state.

By connecting SRAM bit 30*a*/30*b* of FIG. 10 to sub-bit line BLsa1/BLsb1 in the circuit shown in the implementation of FIG. 1, FIG. 4, FIG. 8 or FIG. 9, potential fluctuations in the sub-bit line of the implementations will be prevented.

Figure 11:
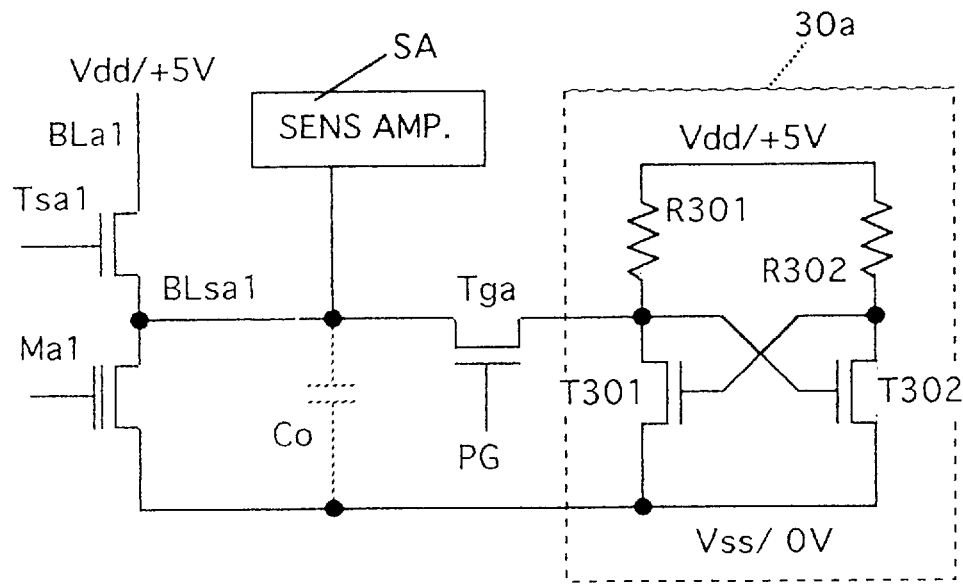
FIG. 11 is a circuit diagram illustrating a specific example of SRAM bit shown in the implementation of FIG. 10.

FIG. 11 illustrates a specific example of SRAM bit 30*a* of FIG. 10. This circuit 30*a* includes a flip-flop circuit which is constituted by cross-coupling N channel transistor T301, having drain load resistor R301, and N channel transistor T302, having drain load resistor R302. Normally, transistor T301 is kept OFF(because of a small conductance) while transistor T302 is kept ON (because of a large conductance).

The circuit of FIG. 11 will operate in the following manner. When connection transistor Tga is made conductive and sub-bit line BLsa1 is connected to the gate of transistor T302, transistor T302 is maintained ON if the sub-bit line potential is +5 V, and the circuit condition of the flip-flop will not change. This means that the sub-bit line potential +5 V is not latched by circuit 30*a*.

However, when connection transistor Tga is made conductive and sub-bit line BLsa1 is connected to the gate of transistor T302, and if the sub-bit line potential is 0 V, transistor T302 is switched OFF while transistor T301 is turned ON. Thereby, the flip-flop circuit condition will change, and the sub-bit line potential 0 V will be latched by circuit 30*a* (this means that the sub-bit potential is clamped to the drain potential of the turned-ON transistor T301).

The potential of sub-bit line BLsa1 is then detected and memory cell data corresponding to this potential is read by sense amplifier SA.

Since there is a difference in conductances between transistors T301 and T302, when SRAM bit connection transistor Tga is switched OFF, the flip-flop circuit will return to its original state (that is, transistor T301 is OFF while transistor T302 is ON).

Figure 12:
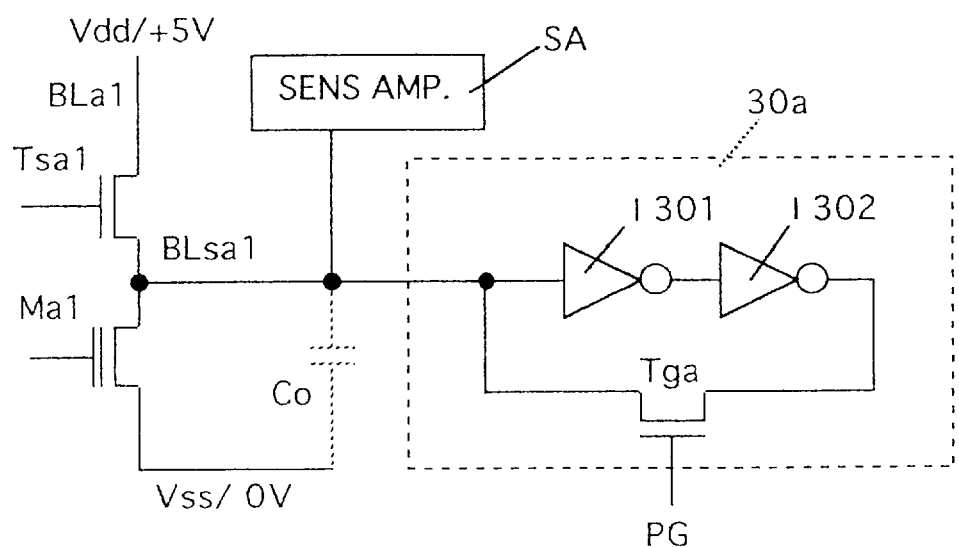
FIG. 12 is a circuit diagram illustrating another specific example of SRAM bit shown in the implementation of FIG. 10.

FIG. 12 illustrates another example of SRAM bit 30*a* of FIG. 10. This circuit 30*a* is constructed by two stage inverters I301 and I302 connected in series and transistor Tga for selectively and positively feeding the output of inverter I302 back to the input of inverter I301.

In the circuit of FIG. 12, if sub-bit line BLsa1 is +5 V while transistor Tga is made conductive, the output of inverter I302 is also +5 V. This +5 V output is fed back to sub-bit line BLsa1 via the conducted transistor Tga, and the potential of sub-bit line BLsa1 is clamped at (or latched to) +5 V.

However, if sub-bit line BLsa1 is 0 V while transistor Tga is made conductive, the output of inverter I302 is also 0 V. This 0 V output is fed back to sub-bit line BLsa1 via the conducted transistor Tga, and the potential of sub-bit line BLsa1 is clamped at (or latched to) 0 V. This 0 V clamping will suppress potential fluctuations of sub-bit line BLsa1.

The potential of sub-bit line BLsa1 is then detected and memory cell data corresponding to its potential is read by sense amplifier SA.

Figure 13:
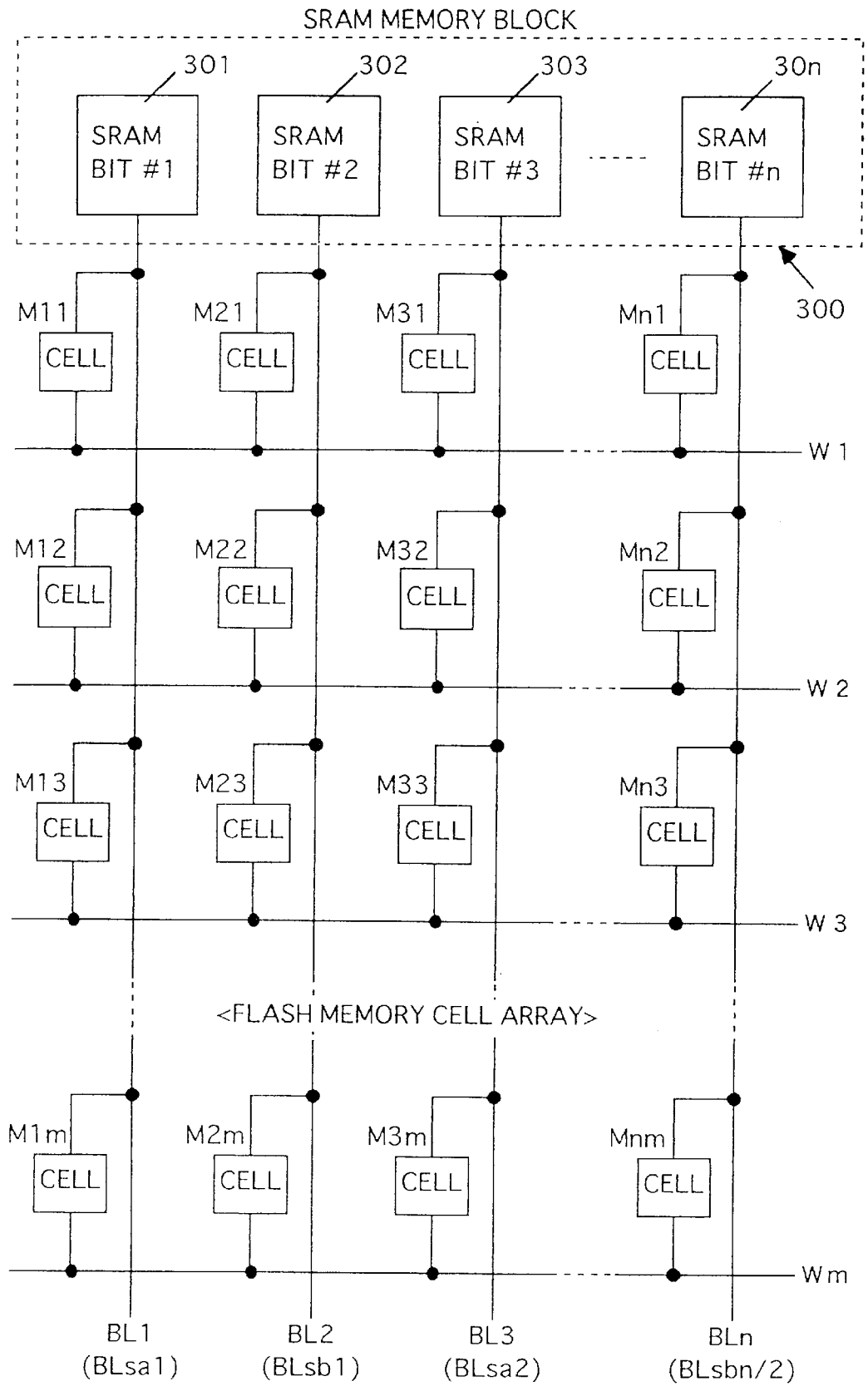
FIG. 13 is a circuit diagram illustrating a structure of the nonvolatile semiconductor memory of the fifth embodiment of the invention.

FIG. 13 is a circuit diagram illustrating the structure of a nonvolatile semiconductor memory according to a fifth embodiment of the invention. The n number of SRAM bits (flip-flops) 301 to 30*n* are connected respectively to the n pieces of bit lines BL1 to BLn. These SRAM bits constitute SRAM memory block 300.

The drains of m pieces of memory cell transistors M11 to M1m are connected to bit line BL1 of SRAM bit 301. Similarly, the drains of m pieces of memory cell transistors M21 to M2m are connected to bit line BL2 of SRAM bit 302, and the drains of m pieces of memory cell transistors Mn1 to Mnm are connected to bit line BLn of SRAM bit 30*n*.

The gates of n pieces of memory cell transistors M11 to Mn1 are connected to word line W1 while the gates of n pieces of memory cell transistors M12 to Mn2 are connected to word line W2. Similarly, the gates of n pieces of memory cell transistors M13 to Mn3 are connected to word line W3 and the gates of n pieces of memory cell transistors M1m to Mnm are connected to word line Wm.

In the above-noted structure, n×m pieces of memory cell transistors (each has the same structure as the transistor Ma1 of FIG. 10A) form a flush memory cell array of this embodiment. For example, if n=512 and m=8, the memory cell array of FIG. 13 constitutes a flush memory cell block of 512 bytes. By collecting 1000 pieces of these blocks, a nonvolatile semiconductor memory of 512 k bytes will be provided.

Even if it takes several hundreds of microseconds to write data in each of memory cell transistors M11 to M1m connected to bit line BL1 of FIG. 13, it takes only several tens of nanoseconds to write data in SRAM bit 301 connected to bit line BL1. After specified data ("0"/"1") is written in this SRAM bit 301 within a short period of time, the potential of bit line BL1 can be kept at a potential of the data written in SRAM bit 301. There will be no change in this data potential even when a small leakage current flows through bit line BL1.

For instance, if the level of word line W1 is set at "high" to select cell M11, while the potential of bit line BL1 is kept at a potential equivalent to the stored data, a positive/negative vibration pulse (word line drive signal WDPOUT)

like that shown in the lower part of FIG. 10 is given to the gate of the transistor (Ma1 of FIG. 10) constituting this cell M11. After this pulse is repeated from several pulses to 10 pulses, the potential of bit line BL1 (stored data of SRAM bit 301) is written in the floating gate of transistor M11 as nonvolatile information. Writing of data in the floating gates of other memory cell transistors can be similarly carried out.

Where the structure of FIG. 13 forms a memory block of, for instance 512×m (m is an integer), data of 512 bit unit is simultaneously written from an external circuit (not shown) into SRAM bits 301 to 30n (n=512). (Normally, time required to complete the writing is several ten nanoseconds or less.)

Thereafter, respective potentials of bit lines BL1 to BLn determined based on the data written in SRAM bits 301 to 30n are written as nonvolatile information in any of particular memory cell transistors M11 to Mnm selected with word lines W1 to Wm (time required to complete the writing is several 100 microseconds or less). After completion of this writing, the contents of SRAM bits 301 to 30n may be erased or cleared.

By employing the above-described structure, the flash memory allowing high-speed writing can be obtained.

Figure 14:
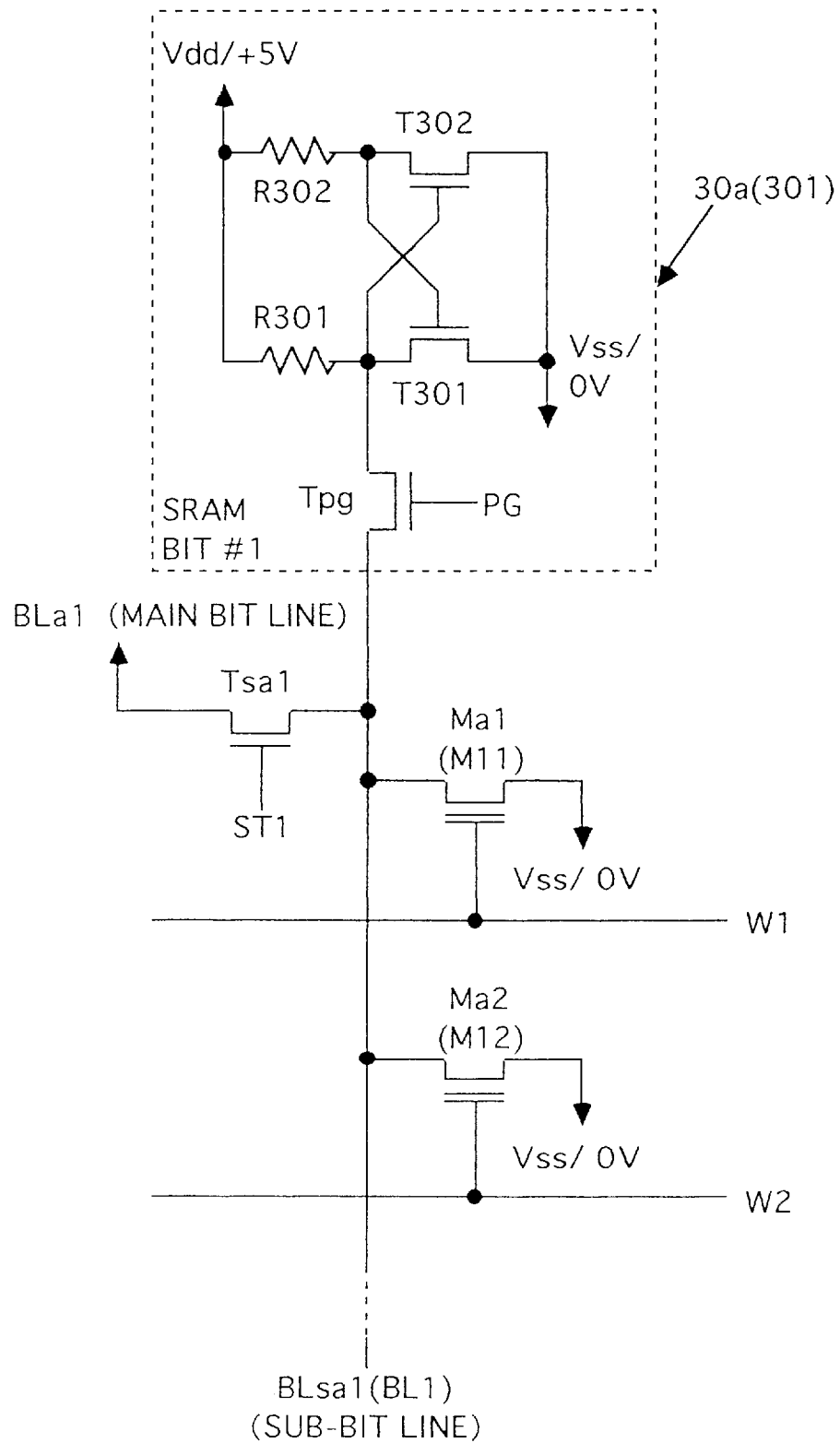
FIG. 14 is a circuit diagram illustrating a specific example of a SRAM bit circuit shown in the implementation of FIG. 13.

FIG. 14 illustrates a specific example of the SRAM bit. SRAM bit 30a of FIG. 14 includes the same circuit structure as flip-flop 30a of FIG. 11. However, in FIG. 14, one cell of SRAM bit 301 is constituted by including pass gate (connection transistor) Tpg in the flip-flop circuit.

Figure 16:
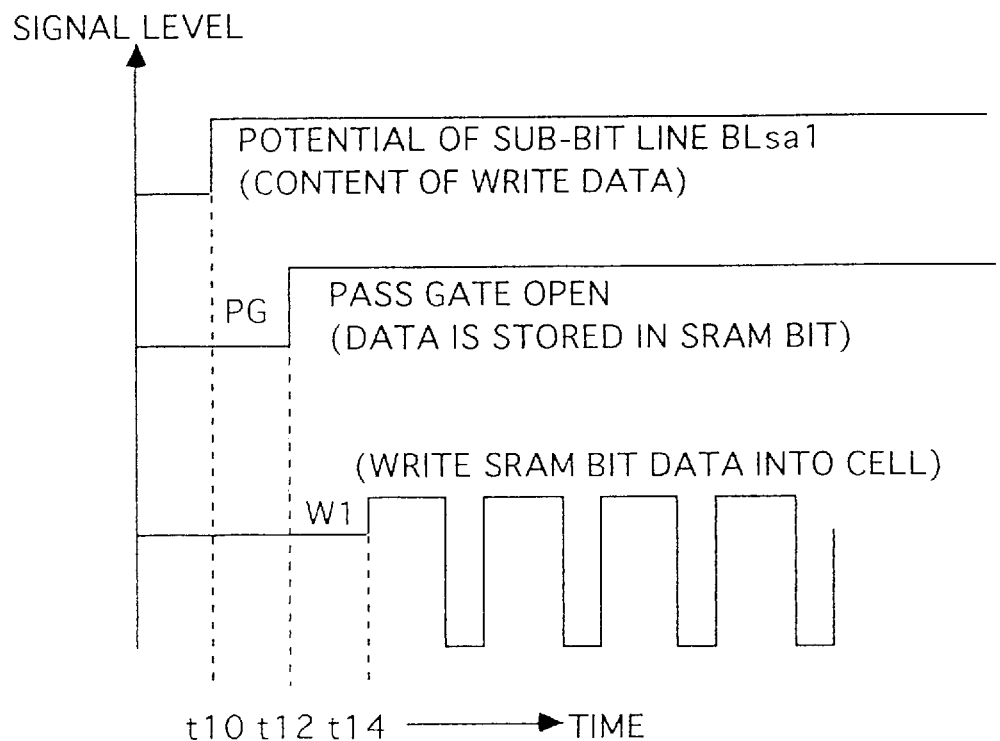
FIG. 16 is a timing chart illustrating the circuit operation of the SRAM bit circuit of FIG. 14.

FIG. 16 is a timing chart illustrating the circuit operation of SRAM bit 30a/301 of FIG. 14. After time t10, write data (0 or 1) from an external circuit (not shown) has been given to sub-bit line BLsa1. When pass gate signal PG is given to the gate of transistor Tpg at time t12, transistor Tpg is made conductive. Thereby, data corresponding to the potential of sub-bit line BLsa1 is stored in flip-flop type SRAM bit 30a. While transistor Tpg is conductive, the potential of sub-bit line BLsa1 is fixed at a potential corresponding to the stored data of SRAM bit 30a (e.g., 0 V if transistor T301 is ON), and no fluctuation will occur in the sub-bit line potential.

Thereafter, when a positive/negative vibration pulse (word line drive signal) is applied to the gate of memory transistor Ma1 via word line W1 at time t14, data corresponding to the potential of sub-bit line BLsa1 (i.e., stored content of the SRAM bit 30a) is written in the floating gate of transistor Ma1.

In FIG. 16, several tens of nanoseconds may be enough for time from t10 to t12 and t12 to t14.

FIG. 15 illustrates another specific example of the SRAM bit. In SRAM bit 301 of FIG. 14, pass gate Tpg is provided in only one spot of the one side output of the flip-flop. However, in SRAM bit 301 of FIG. 15, two pass gates Tpg1 and Tpg 2 are provided in two spots of both side outputs of the flip-flop.

FIG. 17 is a timing chart illustrating the circuit operation of SRAM bit 30a/301 of FIG. 15. After time t20, write data ("0") from an external circuit (not shown) has been given to sub-bit line BLsa1 via transistor Tsa1. When pass gate signal PG2 is given to the gate of transistor Tpg2 at time t22, transistor Tpg2 is made conductive. Thereby, data corresponding to the potential of sub-bit line Blsa1 is stored in the flip-flop type SRAM bit 30a and then, at time t24, transistor tpg2 is made nonconductive.

Thereafter, write data ("1") from the external circuit (not shown) is given to sub-bit line BLsa1 via transistor Tsa1 (time t30). Then, when pass gate signal PG1 is produced (time t32), transistor Tpg1 is made conductive. While transistor Tpg1 is conductive, the potential of sub-bit line BLsa1 is fixed to a potential corresponding to the stored data of SRAM bit 30a (e.g., 5 V if transistor T301 is OFF), and no fluctuation will occur in the sub-bit line potential.

Thereafter, an operation similar to that shown in FIG. 16 is performed. More particularly, when a positive/negative vibration pulse (word line drive signal) is applied to the gate of memory cell transistor Ma1 via word line W1 at time t40, data corresponding to the potential of sub-bit line BLsa1 (i.e., stored content of SRAM bit 30a) is written in the floating gate of transistor Ma1.

In FIG. 17, time from t20 to t26, from t30 to t36, and from t36 to t40 may be several tens of nanoseconds or less, respectively.

FIG. 18 illustrates a modified example of the memory shown in FIG. 14 or FIG. 15. In the drawing, SRAM bit 30a is provided in the main bit line BLa1 side. In the circuit of FIG. 18, gate signal ST1 is kept at a high level until writing of write data, temporarily stored in the SRAM bit, into a desired cell (e.g., Ma1) is finished. Except for this point, the mode of the implementation of FIG. 18 is basically the same as that shown in FIG. 14 or FIG. 15.

FIG. 19 is a circuit diagram illustrating a structure of a nonvolatile semiconductor memory of a sixth embodiment of the invention.

One end of bit line BL1 (or BLsa1) is connected to small current source 201 via the N channel transistor (transfer gate) Tb1. The other end of bit line BL1 is connected to sense amplifier SA1 via N channel transistor (transfer gate) TS1 and to a negative power source Vss/0 V circuit (circuit ground GND) via N channel transistor Tg1.

The drains of a number of nonvolatile memory cell transistors (N channel MOS transistors having control gates and floating gates) M11 to M1m constituting a first column of the memory cell array are connected to this bit line BL1. The sources of memory cell transistors M11 to M1m are connected to the negative power source Vss/0 V circuit (circuit ground GND).

Similarly, one end of bit line BL2 (or BLsb1) is connected to small current source 202 via N channel transistor (transfer gate) Tb2. The other end of bit line BL2 is connected to sense amplifier SA2 via N channel transistor (transfer gate) Ts2 and to the negative power source Vss/0 V circuit (circuit ground GND) via the N channel transistor Tg2. The drain of a number of nonvolatile memory cell transistors M21 to M2m constituting a second column of the memory cell array are connected to this bit line BL2. The sources of memory cell transistors M21 to M2m are connected to the negative power source Vss.

The other memory cell columns (not shown) are similarly constructed. Each block of the memory cell arrays is constructed by gate circuits (word lines) WL, that is, W1 to Wm, of memory cell transistors M11 to Mn1, M12 to Mn2, . . . , M1m to Mnm.

Each of small current source 201, 202, . . . , can be constructed by a constant current circuit or a voltage generating circuit (e.g., a charge pump) having high inner impedance.

Small current sources 201, 202, . . . , in the embodiment are operated with external clock CLK (Φ), and small currents Is1, Is2, . . . , having sizes or amounts respectively corresponding to the frequency or the duty ratio of this clock are supplied to transistors Tb1, Tb2, . . . . Transistors Tb1, Tb2, . . . are controlled to be opened/closed (ON/OFF) by means of their gate signals BLK. When the levels of signals BLK are high (H), the transistors are made conductive (turned ON), thereby allowing supply of small currents Is1, Is2, . . . , from small current sources 201, 202, . . . , to bit lines BL1, BL2, . . . .

Transistors Ts1, Ts2, . . . , are controlled to be opened/closed (ON/OFF) by means of gate signals S supplied thereto. When the levels of signals S are high (H), these transistors are made conductive (turned ON), and bit lines BL1, BL2, . . . , are connected to sense amplifiers SA1, SA2, . . . . For example, when sense amplifier SA1 is connected to bit line BL1 via transistor Ts1, the stored data (corresponding to the potential of bit line BL1) of memory cell transistor M11 selected by word line W1 is read out to sense amplifier SA1. For the other memory cells, reading is similarly carried out.

External clock CLK ($\Phi$),gate signal BLK, word line drive signal WL, and gate signal S are obtained from control circuit 120 with given timings.

Upon receiving data G1, G2, . . . , from memories 101, 102, . . . , transistors Tg1, Tg2, . . . temporarily store these data pieces, respectively. If all contents of data G1, G2, . . . , are at L levels, all transistors Tg1, Tg2, . . . , are OFF. Then, current paths from small current sources 201, 202, . . . , to circuit ground GND are shut off by transistors Tg1, Tg2, . . . . Even if transistors Tb1, Tb2, . . . , are turned ON with BLK=H, no small currents Is1, Is2, . . . , will flow.

On the other hand, if all contents of data G1, G2, . . . , are at H levels, all transistors Tg1, Tg2, . . . , are turned weakly ON (not a short-circuited state but a high impedance conductive state). Then, if transistors Tb1, Tb2, . . . , are ON with BLK=H, small currents Is1, IS2, . . . , will flow from small current sources 201, 202, . . . , to circuit ground GND via transistors Tg1, Tg2, . . . .

However, if only data G1 is at H level and all other data G2, . . . , are at L levels, only transistor Tg1 is turned weakly ON while all other transistors Tg2, . . . , are OFF. In this case, if transistors Tb1, Tb2, . . . , are ON with BLK=H, small current Is1 will flow from small current source 201 to circuit ground GND via only transistor Tg1.

Therefore, depending on the contents (data G1, G2, . . . ) of memories 101, 102, . . . , determination can optionally be made as to which of bit lines BL1, BL2, . . . the small currents Is1, Is2, . . . , should be supplied.

Memories 101, 102, . . . , are typically constructed by static type storage circuits such as flip-flop circuits or the like. However, these may be constructed by dynamic type storage circuits.

Assume that the present invention is not applied here. Under this assumption, when the potential of bit line BL1 changes (declines) with time due to leakage currents during writing of memory cell transistors M11 to M1m connected to the bit line BL1, writing (or erasing) into memory cell transistors M11 to M1m may not be correctly performed.

Small current source 201 is provided for canceling the potential change of bit line BL1 due to the above-mentioned leakage current. More specifically, while writing (or erasing) is being carried out for memory transistors M11 to M1m, electric charges lost from bit line BL1 due to the leakage current are compensated for by small current Is1 from small current source 201, so that potential changes causing a practical problem will be prevented from being generated.

Which (one or a plurality) of transistors Tg1, Tg2, . . . , is switched weakly OFF (or ON) is determined by the contents of data G1, G2, . . . (signal level). Since it is desired to hold the contents of data G1, G2, . . . , until writing (or erasing) is completed, memories 101, 102, . . . , are provided as holding means therefor.

The contents of data G1, G2, . . . , written in memories 101, 102, . . . are determined by memory rewriting circuit 110. Writing of data G1, G2, . . . from memory rewriting circuit 110 into memories 101, 102, . . . is performed in synchronization with timing clock CK120 from control circuit 120.

Figure 20:
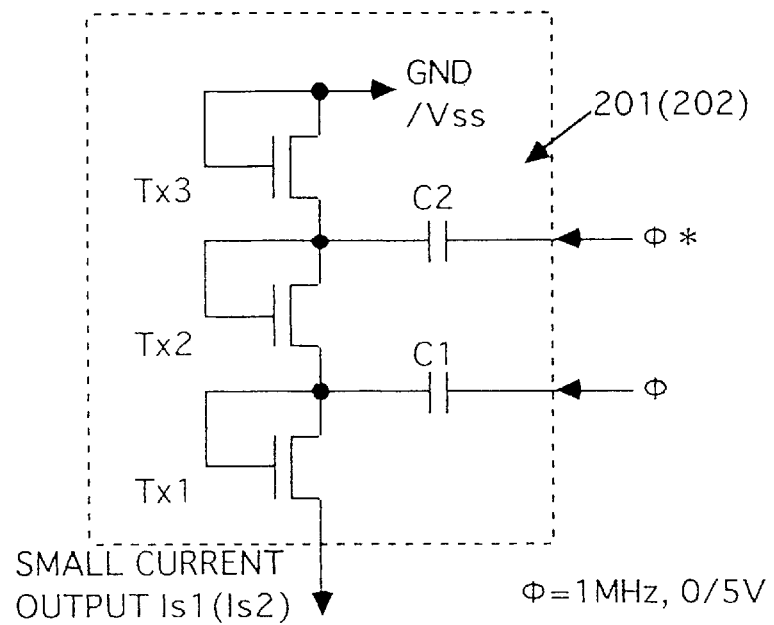
FIG. 20 is a circuit diagram illustrating a specific example of a small current source shown in the implementation of FIG. 19.

FIG. 20 is a circuit diagram showing a specific example of small current sources (charge pump) 201, 202, . . . of the embodiment shown in FIG. 19.

The gate and drain of N channel MOS transistor Tx3 are connected to the negative power source Vss (0 V) and the source thereof is connected to the gate and drain of N channel MOS transistor Tx2. The source of transistor Tx2 is connected to the gate and drain of N channel MOS transistor Tx1.

Clock $\Phi$ (=CLK) is supplied to the gate and drain of transistor Tx1 via capacitor C1, and inverted clock $\Phi$ of clock $\Phi$ is supplied to the gate and drain of transistor Tx2 via capacitor C2. For this clock $\Phi$ (or $\Phi^*$), a rectangular signal with a frequency of 1 MHz, with an amplitude 5 V, and with a duty ratio 50% may be utilized, for instance.

In the small current source (charge pump) configured in such a manner, small current Is1 (or Is2, . . . ) is output from the source of transistor Tx3 with a timing synchronized to clock $\Phi$.

Figure 21:
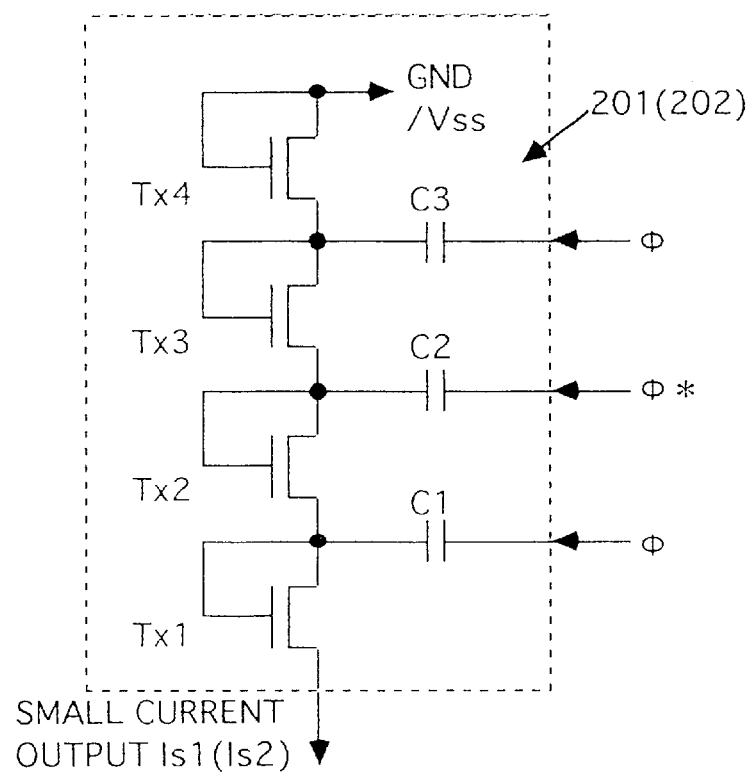
FIG. 21 is a circuit diagram illustrating another specific example of the small current source shown in the implementation of FIG. 19.

FIG. 21 is a circuit diagram showing another specific example of small current sources (switched capacitor) 201. 202, . . . , of the embodiment shown in FIG. 19.

The gate and drain of N channel MOS transistor Tx4 are connected to the negative power source Vss (0 V) and the source thereof is connected to the gate and drain of N channel MOS transistor Tx3. The source of transistor Tx3 is connected to the gate and drain of N channel MOS transistor Tx2. The source of transistor Tx2 is connected to the gate and drain of N channel MOS transistor Tx1.

Clock $\Phi$ (=CLK) is supplied to the gate and drain of transistor Tx1 via capacitor C1, inverted clock $\Phi^*$ of clock $\Phi$ is supplied to the gate and drain of transistor Tx2 via capacitor C2, and inverted clock $\Phi^*$ of clock $\Phi$ is supplied to the gate and drain of transistor Tx3 via capacitor C3. For this clock $\Phi$ (or $\Phi^*$), a rectangular signal with a frequency of 1 MHz, with an amplitude 5 V, and with a duty ratio 50% may be utilized, for instance.

In the small current source (switched capacitor) configured in such a manner, small current Is1 (or Is2, . . . ) is output from the source of the transistor Tx3 with a timing synchronized to clock $\Phi$.

Figure 22:
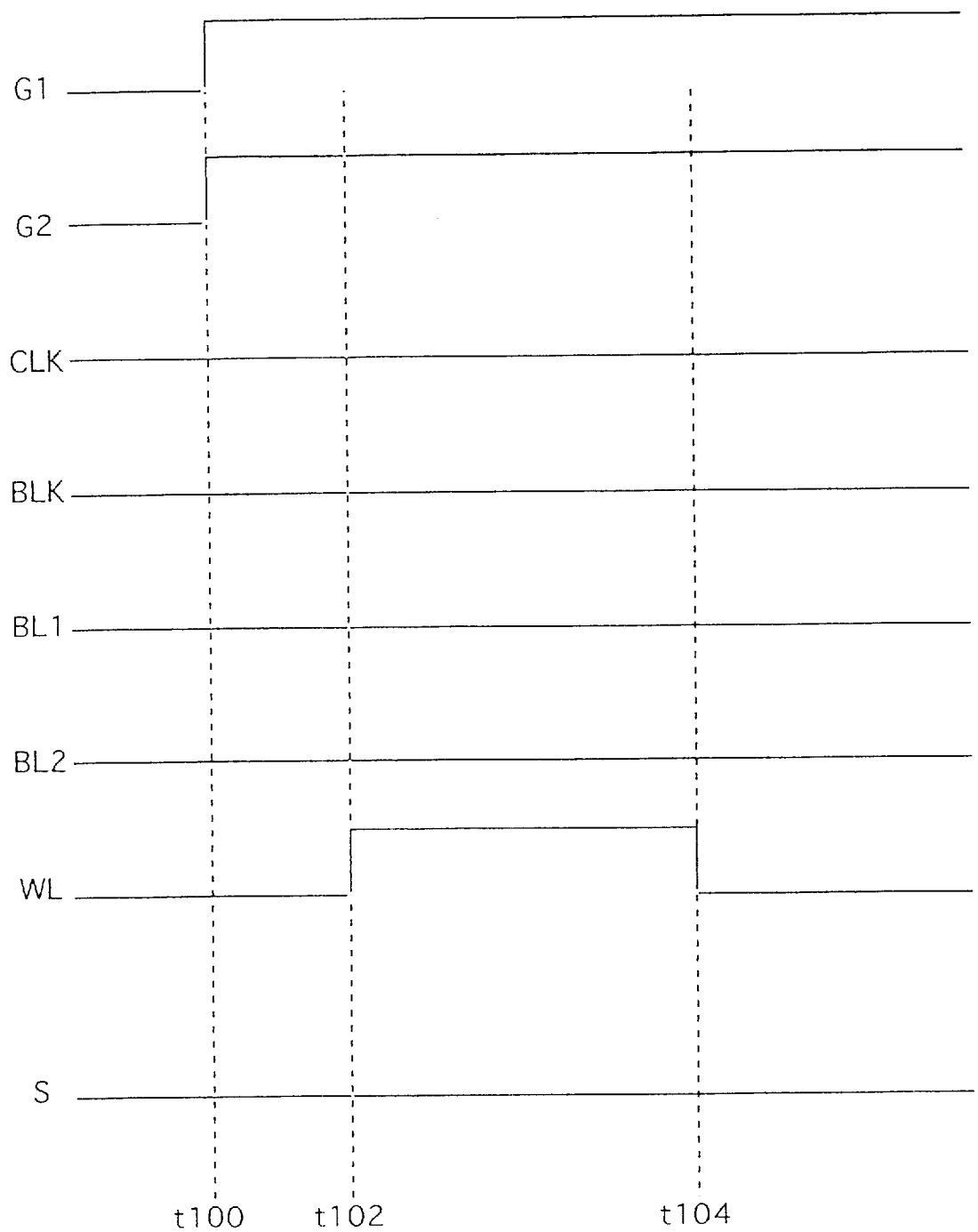
FIG. 22 is a timing chart illustrating the circuit operation (erasing) in the implementation of FIG. 19.

FIG. 22 is a timing chart illustrating the circuit operation (erasing) of the embodiment shown in FIG. 19.

When all memory cell transistors M11 to Mnm of FIG. 19 (or memory cell transistors in unit of blocks) are to be erased at once (that is, flashed), H level data G1, G2, . . . , from memory rewriting circuit 110 are written into memories 101, 102, . . . (time t100). After time t100, H level data G1, G2, . . . , are given from memories 101, 102, . . . , to transistors Tg1, Tg2, . . . , and then, transistors Tg1, Tg2, . . . , are lightly and weakly turned ON. In this state, an erasing potential (e.g., +6.5 V) is given from a precharge circuit (not shown). With this potential, bit lines BL1, BN2, . . . , are precharged. During this time, a small current always flows from the precharge circuit to weakly turned-ON transistors Tg1, Tg2, . . . . Thus, even when there is leakage of currents in bit lines BL1, BL2, . . . , the leakage currents will be canceled by the small current from the precharge circuit and, thereby, the erasing potential for the bit lines will be maintained at a necessary level.

Within the subsequent specified period (time t102 to t104), H level word line drive signal WL is applied to the gates of all the memory cell transistors (or the memory cell transistors of the particular blocks to be flashed), and the stored contents of all the memory cell transistors (or the memory cell transistors of the particular blocks to be flashed) are flashed to the contents corresponding to the erasing potential (+6.5 V).

In FIG. 22, word line drive signal WL is shown as a simple rectangular wave. However, this signal WL may be a positive/negative vibration pulse like that shown in FIG. 6C.

Figure 23:
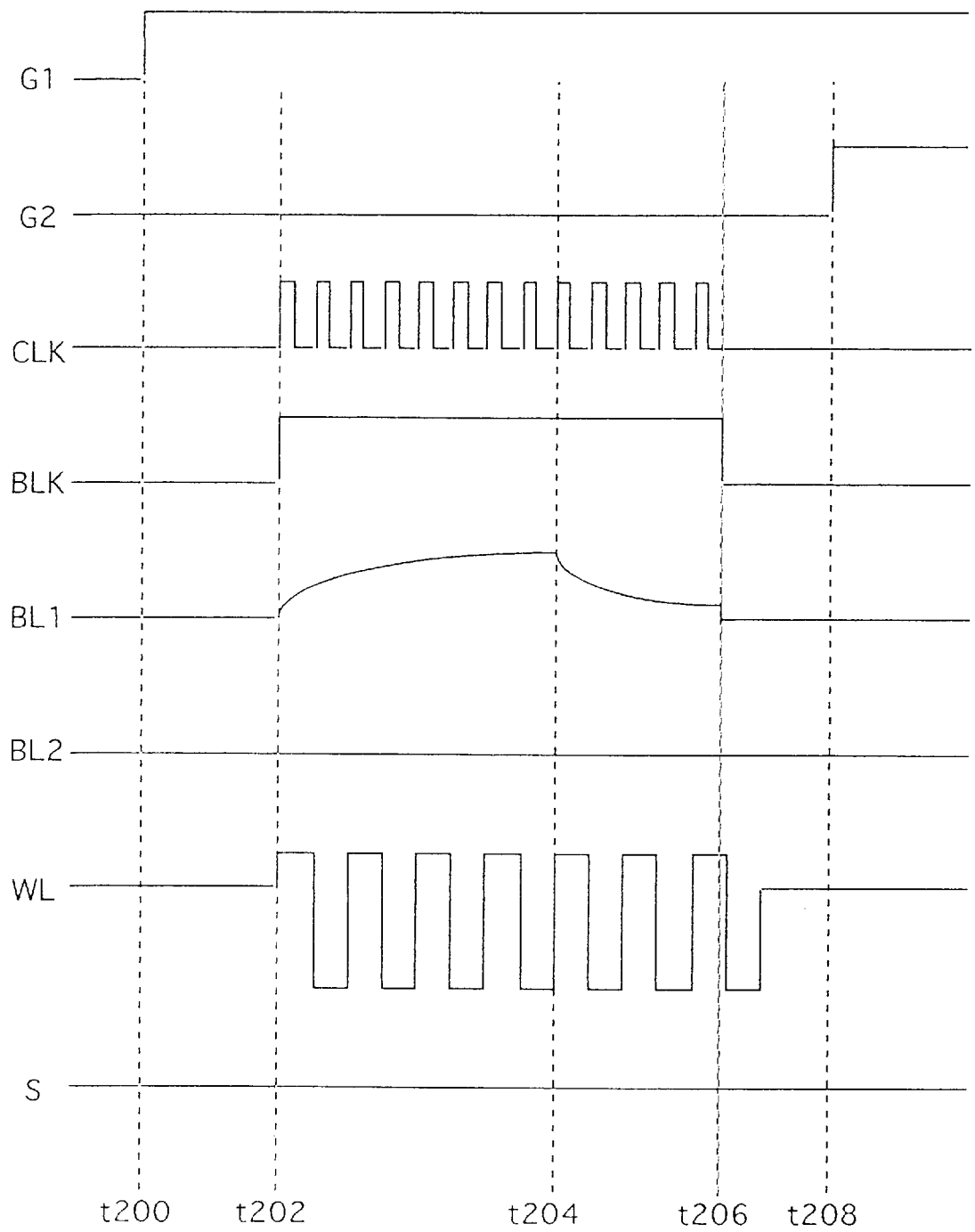
FIG. 23 is a timing chart illustrating the circuit operation (writing) in the implementation of FIG. 19.

FIG. 23 is a timing chart illustrating the circuit operation (writing) of the embodiment shown in FIG. 19. For example, when writing is to be performed for any (e.g., M11) of memory cell transistors M11 to M1m of a first column, H level data G1 is written from memory rewriting circuit 110 into only memory 101(time t200), and L level data G2, . . . , are written in other memories 101, . . . . With this G1=H level, only transistor Tg1 will be turned weakly ON while other transistors Tg2, . . . , will be switched OFF.

After clock CLK is given to small current sources 201, 202, . . . , at time t202, these small current sources can supply small currents. When signal BLK is H level, transistors TB1, Tb2, . . . , are turned ON at time t202, and small current sources 201, 202, . . . , can supply small currents Is1, Is2, . . . , to bit lines BL1. BL2, . . . . Here, since H level data is only G1, only transistor Tg1 is weakly turned ON and small current Is1 flows thereto. Then, a writing potential (writing data) not practically affected by leakage currents will be produced in the drain of transistor Tg1. The writing potential for bit line BL1 will be maintained to be a potential obtained in such a manner.

After time t202, clock CLK for supplying small currents is given to small current source 201, and signal BLK becomes H level in order to transmit small current Is1 to bit line BL1 (time t202 to t206). Also, word line drive signal WL in a positive/negative pulse form is applied to the gate of a particular memory cell transistor (e.g., M11) for writing (time t202 to t206). During this period (time t202 to t206), the potential of bit line BL1 gradually increases because of small current Is1 supplied from small current source 201. After writing is completed for the particular memory cell transistor (e.g., M11) (time t204), this transistor (M11) is made weakly conductive, and the potential of bit line BL1 drops (time t204 to t206).

After writing for the particular memory cell transistor (M11) is finished in the above-noted manner, when writing is to be made in any (e.g., M22) of memory cell transistors M21 to M2m of a second column, only data G2 becomes H level. Thereafter, as in time t202 to t206, writing is performed for another memory cell transistor (M22).

Because of the small current (Is1) supplied during writing (time t202 to t206), a sufficient writing level can be obtained without too much reduction in the potential of the bit line (BL1) even when leakage currents flow, thereby assuring completion of data writing.

Figure 24:
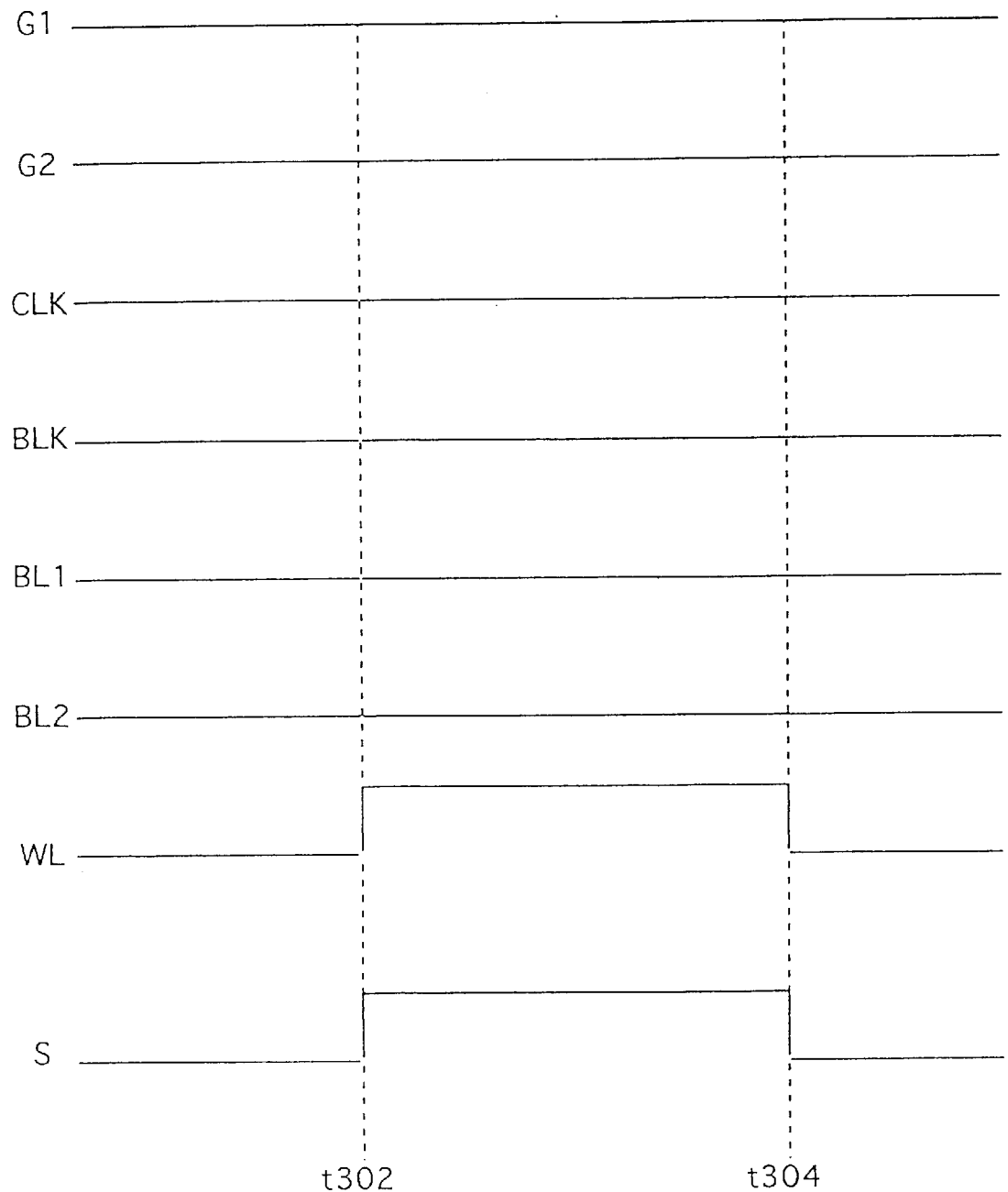
FIG. 24 is a timing chart illustrating the circuit operation (reading) in the implementation of FIG. 19.

FIG. 24 is a timing chart illustrating the circuit operation (reading) of the embodiment shown in FIG. 19. In the case of reading, data G1, G2, . . . , are all L levels and all transistors Tg1, Tg2, . . . , are switched OFF. Also, signal BLK is L level and supplying of small currents Is1, Is2, . . . , to bit lines BL1, BL2 is stopped.

For example, when reading of stored data from memory cell transistor M11 is to be performed, the level of drive signal WL of word line W1 becomes H (time t302 to t304). Also, signal S becomes H level simultaneously so as to connect bit line BL1 to sense amplifier SA1. In this manner, the potential of bit line BL1 defined according to the content of the stored data of memory cell transistor M11 is detected, thereby allowing data to be read from cell M11.

In order to prevent small currents from being supplied to any bit lines during reading, signal BLK is set to L level and, likewise, data G1, G2, . . . , are all set to L level.

Figure 25:
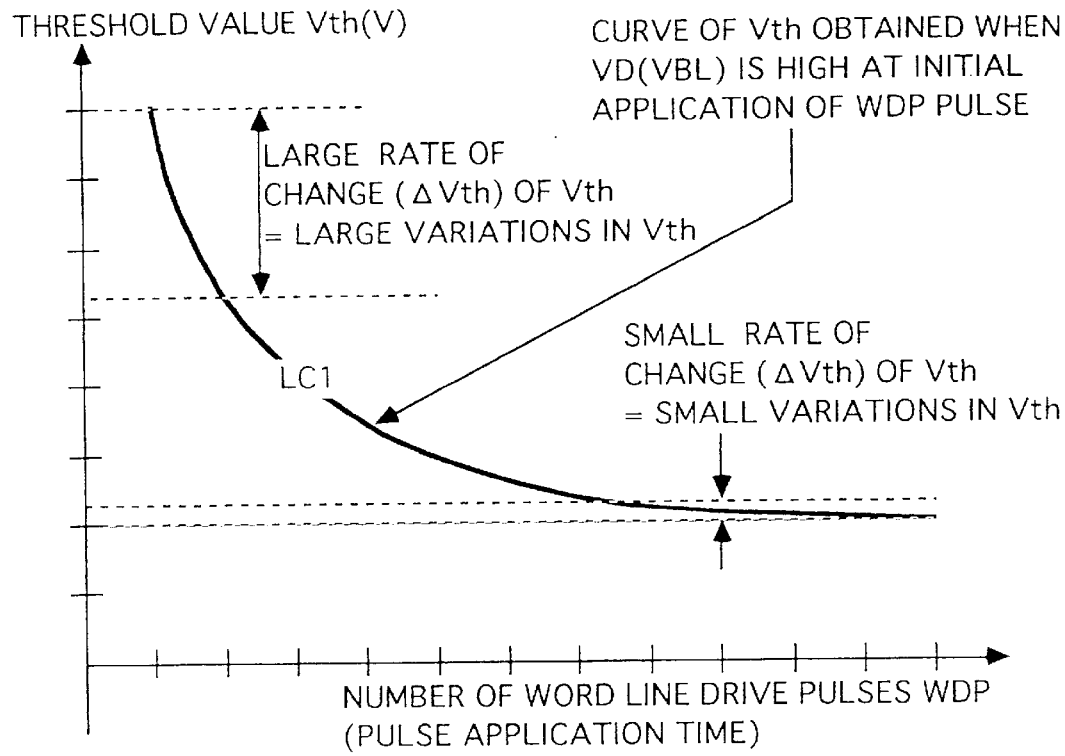
FIG. 25 is a view qualitatively illustrating how threshold value Vth of transistor M11 changes (curve LC1) with respect to the number of pulses (corresponding to pulse application time) of drive pulse WDP applied to word line W1 which is connected to the gate of transistor M11 when data is to be written in, for instance, memory cell transistor M11 (threshold value Vth of transistor M11 is changed) shown in FIG. 19.

FIG. 25 qualitatively illustrates how threshold value Vth of transistor M11 changes (curve LC1) with respect to the number of pulses (corresponding to a pulse application period) of drive pulse WDP applied to word line W1 connected to the gate of transistor M11, when data is to be written in memory cell transistor M11 of FIG. 19 (here, the threshold value Vth of transistor M11 is to be changed).

More specifically, with a drain voltage of the memory cell transistor connected to the bit line constantly maintained high (+5 to 7 V), word line drive pulse WDP is applied to the control gate of the transistor when the threshold value Vth thereof is high (stored data "0"). Then, the threshold value Vth rapidly declines during first several pulses and thereafter, this declines relatively slowly. (The low state of the threshold value Vth corresponds to stored data "1" of a binary memory. In the multi-value memory, there are plural states of low threshold values Vth).

In FIG. 25, a rate of change (ΔVth/pulse) is shown to be large in the initial application of word line drive pulse WDP, and the rate of change (ΔVth/pulse) in the threshold value Vth is shown to be smaller as the application time progresses. This means that in the initial period of applying word line drive pulse WDP, variance or variation in threshold values Vth obtained with respect to the number of particular applied pulses tends to be large. In the latter application period of word line drive pulse WDP, variance or variation in threshold values obtained with respect to the number of particular applied pulses tends to be small.

When there is large variance in threshold values Vth during the initial period of applying word line drive pulse WDP (for instance, after application of one or two pulses), stored multi-value data in the higher level side of threshold values Vth widely varies, making it difficult to accurately read the stored multi-value data in this state.

According to the present invention, in order to reduce the "large variance in stored multi-value data in the higher level side of threshold values Vth", special means is provided such that a rate of change (ΔVth/pulse) in threshold values Vth will not be large during the initial period of applying the word line drive pulse.

Figure 26:
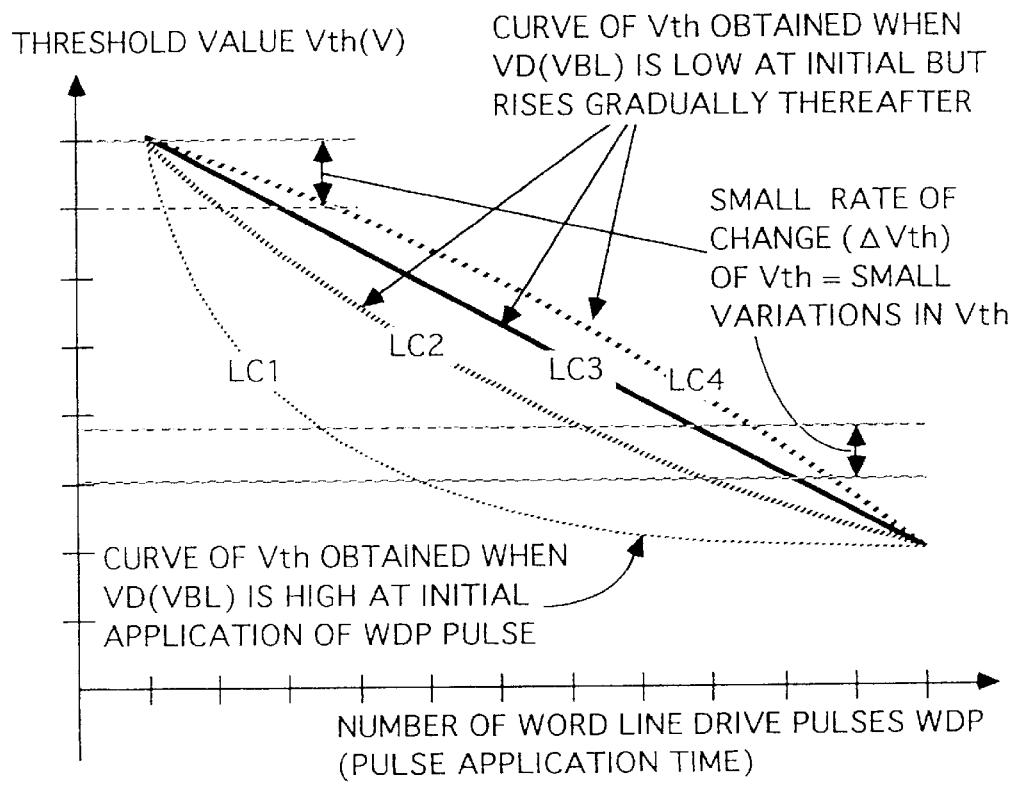
FIG. 26 is a view qualitatively illustrating how a rate of change in threshold value Vth changes (curves LC2 to LC4) when a form of the threshold value change curve LC1 of FIG. 25 is changed.

FIG. 26 qualitatively illustrates the content of the above-mentioned special means. That is, a whole rate of change (ΔVth/pulse) is limited small by correcting the curve LC1 of FIG. 25 to a curve (LC2, LC4) or a straight line (LC3) slowly changing as a whole, so that the "large variance in stored multi-value data in the higher level side of threshold values Vth" is reduced.

Figure 27:
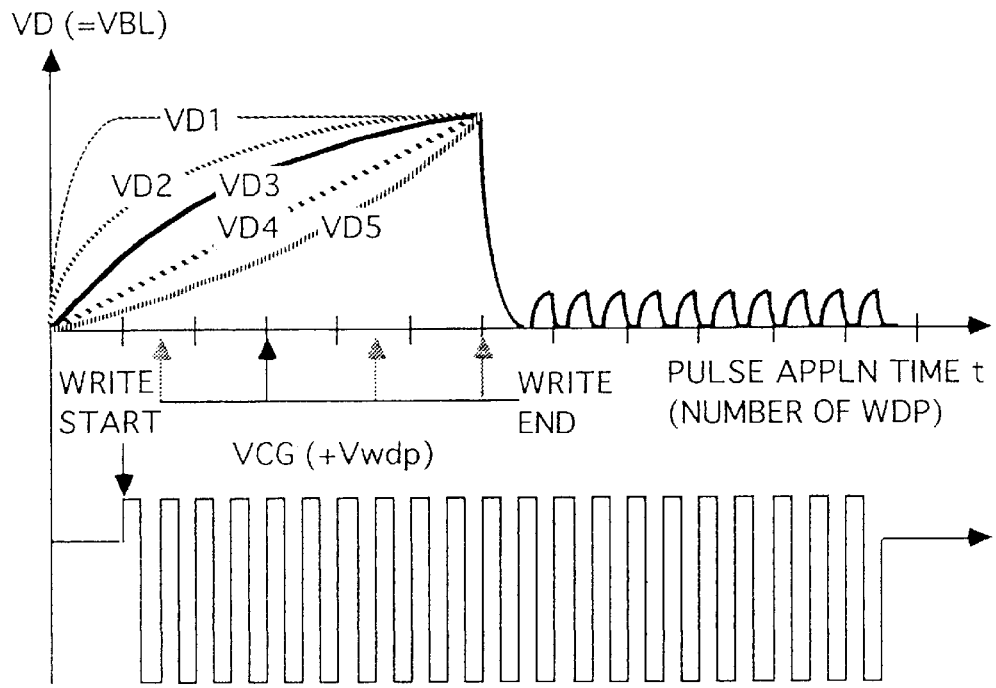
FIG. 27 is a view qualitatively illustrating how drain voltages VD (bit line voltage VBL) of memory cell transistors, respectively corresponding to threshold value change curves LC1 to LC4 of FIG. 26, change (curves VD1 to VD4), and illustrating when to start the application of drive pulses WDP (pulse for providing control gate voltage VCG or word line voltage Vwdp) to the control gates of the memory cell transistors.

FIG. 27 illustrates the change curves VD1 to VD4 of drain voltages VD (bit line voltages VBL) of the memory cell transistors respectively corresponding to threshold value change curves LC1 to LC4 of FIG. 26, and illustrates when to start applying the drive pulse WDP (pulse for giving control gate voltage VCG or word line voltage Vwdp) to the control gates of these memory cell transistors.

In FIG. 27, if the drain voltage (curve VD1) is already high when first drive pulse WDP (writing start point) is given to the control gate of the memory cell transistor, as shown by curves LC1 in FIG. 25 or FIG. 26, since a rate of change (ΔVth/pulse) in threshold value Vth of the memory cell transistor is high, the "multi-value data in the higher level side of the threshold value" stored in this memory cell transistor varies widely.

On the other hand, when first drive pulse WDP (writing start point) is given to the control gate of the memory cell transistor, and if the drain voltage thereof (e.g., curve VD3) is still low then a rate of change in threshold values Vth (ΔVth/pulse) can be maintained at a relatively small value (almost constant) over a wide range. Thus, the "variance in multi-value data in the higher level side of threshold values Vth" stored in this memory cell transistor can be reduced.

Also, since the rate of change (ΔVth/pulse) in threshold values takes a relatively small value in a wide range, the "variance in multi-value data in the higher level side of threshold values" can be limited or suppressed small.

For the purpose of "maintaining the rate of change (ΔVth/pulse) in threshold values to a relatively small fixed value in a wide range", it is most desired for the Vth change curve of FIG. 26 to be a straight line (LC3). However, if the rate of change is small, the Vth change curve should not necessarily be a straight line and the present invention is applicable to a relatively slow changing curve.

That is, even when a curve indicating a slow change in threshold value Vth is employed (LC2 or LC4 of FIG. 26), multi-value data pieces (3 or more threshold values) each having small variance can be accurately stored in a single memory cell transistor for practical purposes. The bottom drooping curve LC2 of FIG. 26 can be obtained corresponding to, for instance, the upper side bulging curve VD2 of FIG. 27, and the upper side bulging curve LC4 of FIG. 26 can be obtained corresponding to, for instance, the bottom drooping curve VD4 or VD5 of FIG. 27.

Figure 28:
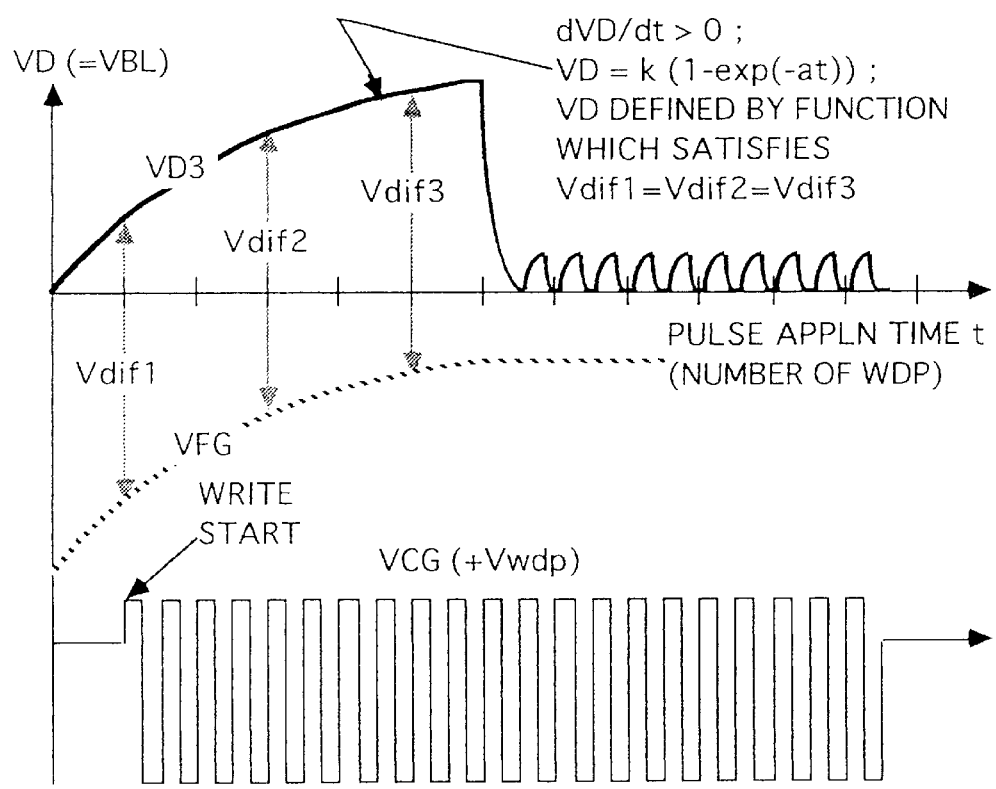
FIG. 28 is a view qualitatively illustrating the relationship between drain voltage curve VD3 of FIG. 27, corresponding to the straight line LC3 of FIG. 26, and floating gate voltage VFG of the memory cell transistor (e.g., M11) to which this drain voltage VD3 is applied.

A question arises as to what specific form (function form) a change of the drain potential VD (bit line potential VBL) of the memory cell transistor should take in order to obtain the straight line LC3 of FIG. 26. The answer is shown in FIG. 28.

That is, it has been found that the straight line LC3 of FIG. 26 can be obtained by maintaining potential difference Vdif1 to Vdif3 between floating gate potential VFG of the memory cell transistor and its control gate potential VCG almost constant (Vdif1=Vdif2=Vdif3). A change form of drain potential VD3 of the memory cell transistor satisfying this condition (Vdif1=Vdif2=Vdif3) is as follows:

$$VD = k(1 - \exp(-at)) \quad (1)$$

; "k" and "a" are proportional constants and "t" is a time parameter in proportion to the count value of pulse WDP. Proportional constants "k" and "a" can be experimentally determined by testing several samples.

Drain potential D of the memory cell transistor is increased based on the function form of the expression (1) and, when word line drive pulse Wdp is applied to the control gate during increasing thereof, the threshold values (Vth3, Vth2, and Vth1) determined depending on a positive/negative amplitude value (+Vwdp=3 V, 2 V, or 1 V) can be obtained with a slow change rate like that indicated by curves LC2 to LC4 in FIG. 26 (or they can be obtained under quality control with little variance).

Figure 30:
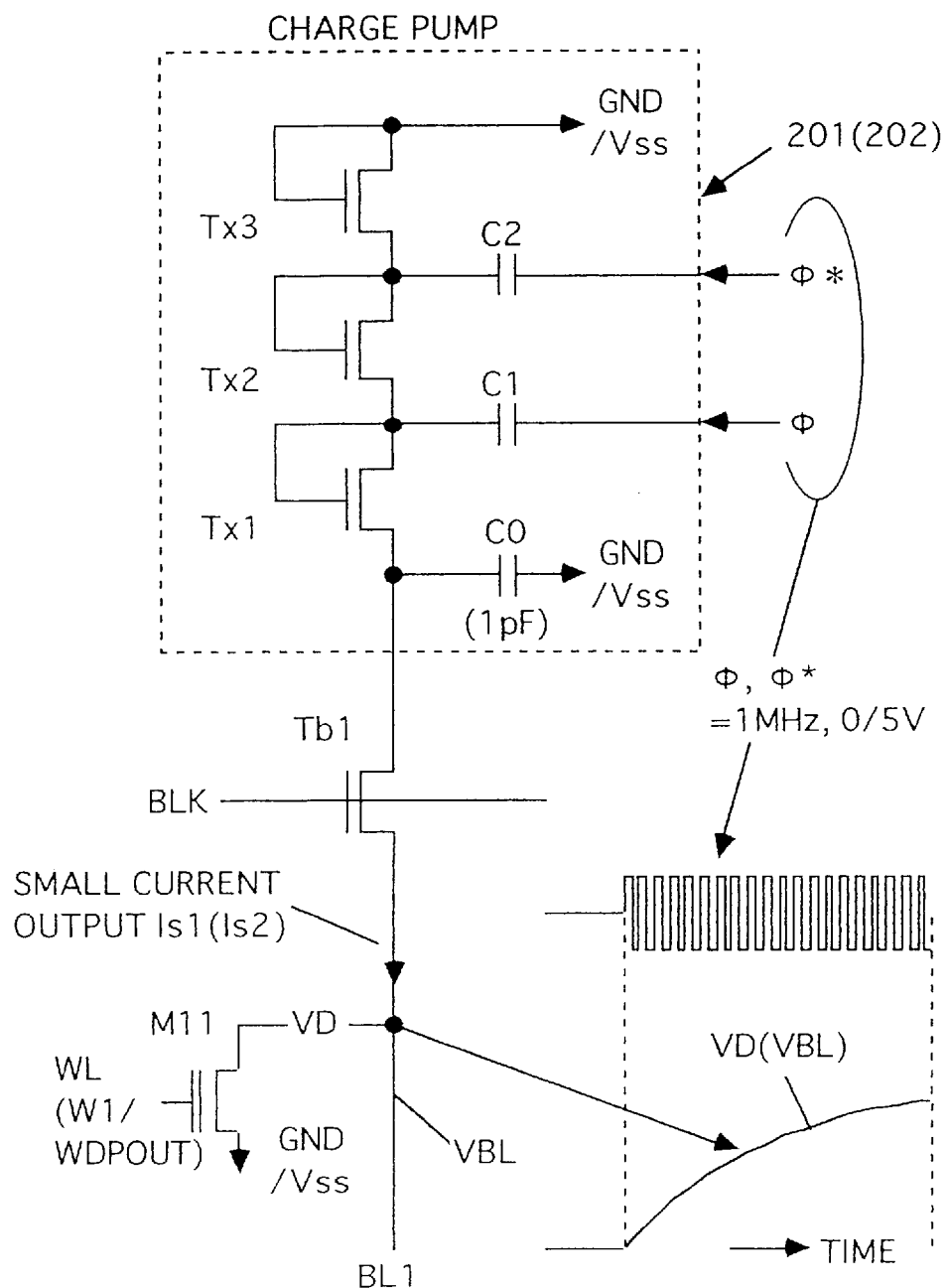
FIG. 30 is a circuit diagram illustrating an example of a bit line charging circuit (small current source 201) for providing drain voltage curve VD3 like that shown in FIG. 28 to a bit line to which the drains of a number of memory cell transistors are connected.

FIG. 30 illustrates a specific circuit example for obtaining the drain voltage VD (=bit line voltage VBL=VD3 of FIG. 28) of the memory cell transistor having the function form of expression (1).

In this circuit example, capacitor C0 of about 1 pF is provided in the output side of charge pump 201 which may have the same structure as that shown in FIG. 20, and this capacitor C0 is charged by the output of charge pump 201. (For this capacitor C0, a parasitic capacitor on the bit line can be utilized in reality). When transistor Tb1 is turned ON by application of high level gate signal BLK, a charged voltage of capacitor C0 is supplied to bit line BL1 via transistor Tb1. In this case, potential VBL of bit line BL1 increases in a curve along an exponential function form corresponding to the product between the equivalent capacitor (equivalent to C0 of FIG. 3) of bit line BL1 and the output impedance of charge pump 201. The size of inclination of this increase (dVD/dt) can be adjusted by the values of capacitor C1 and/or C2.

In reality, capacitors C1 and C2 can be constructed by capacitances formed between the gate and the source/drain of an MOS transistor. The value of these capacitors can be adjusted by altering the gate area of the MOS transistor and the thickness of an insulating layer between the gate and the channel thereof.

Figure 31:
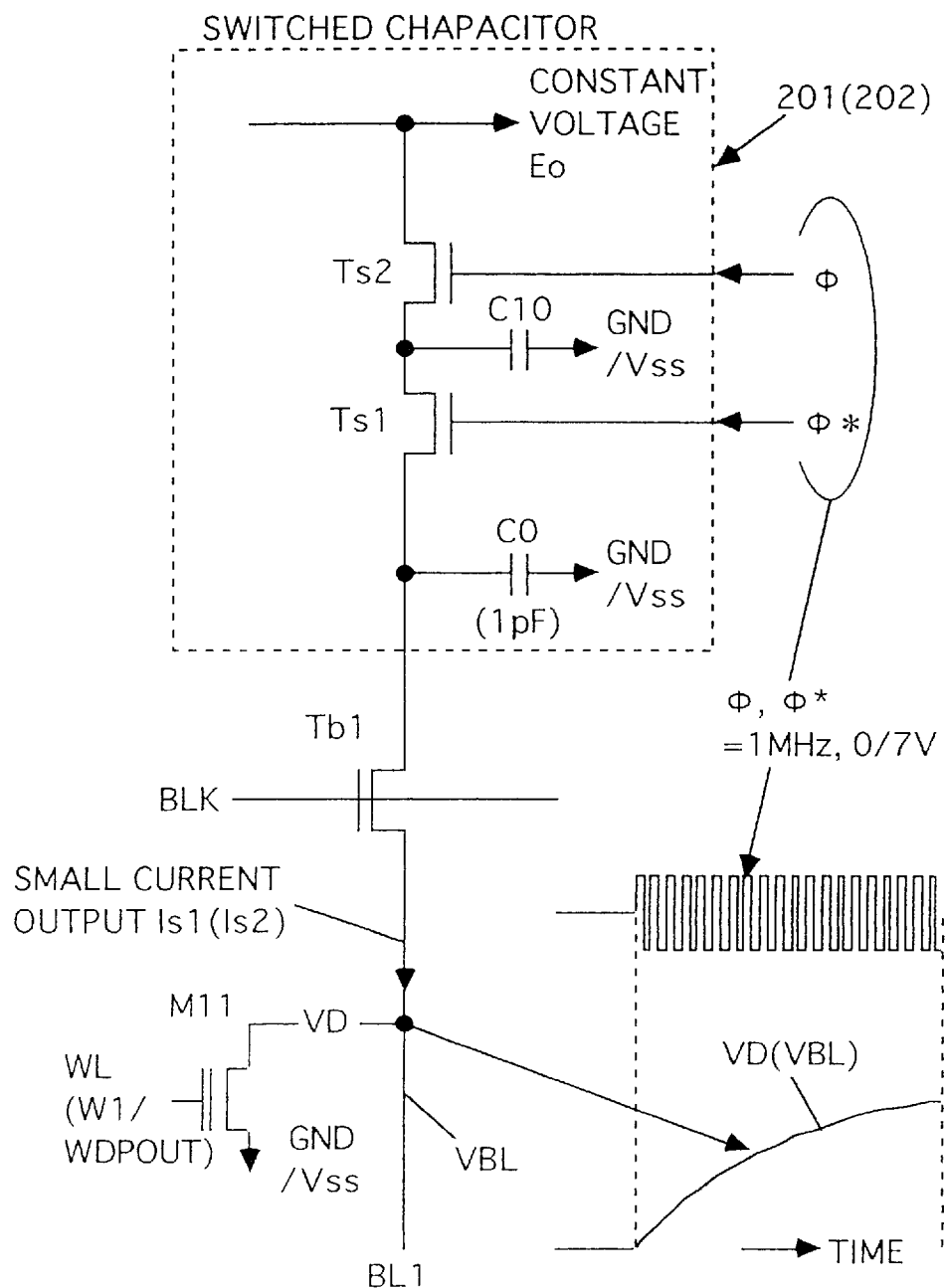
FIG. 31 is a circuit diagram illustrating another example of a bit line charging circuit (small current source 201) for providing drain voltage curve VD3 like that shown in FIG. 28 to a bit line to which the drains of a number of memory cell transistors are connected.

FIG. 31 illustrates another circuit example for obtaining drain voltage VD (=bit line voltage VBL=VD3 of FIG. 28) of the memory cell transistor having a function form of expression (1).

That is, in switched capacitor 201 of this circuit example, a serial circuit for transistors Ts1 and Ts2 is provided between transistor Tb1 and the circuit having specified constant voltage Eo. The connection node of transistors Ts1 and Ts2 is circuit-grounded via capacitor C10, and the connection node of transistors Ts1 and Tb1 is circuit-grounded via capacitor C0 (bit line parasitic capacitor). The gates of transistors Ts1 and Ts2 respectively receive clocks Φ and Φ* of phases reverse to each other and alternately controlled to be switched ON and OFF by these clocks.

Capacitor C0 is charged by the output of switched capacitor 201. When transistor Tb1 is turned-ON by application of high level gate signal BLK, the charged voltage of capacitor C0 is supplied to bit line BL1 via transistor Tb1. In this case, potential VBL of bit line BL1 increases in a curve along with an exponential function form corresponding to the product between the equivalent capacitor (equivalent to Co of FIG. 3) and the output impedance of switched capacitor 201. The side of the inclination of this increase (dVD/dt) can be adjusted by altering the value of capacitor C10.

In reality, capacitor C10 can be obtained by a capacitance formed between the gate and the source/drain of an MOS transistor.

FIG. 32 illustrates yet another circuit example for obtaining drain voltage VD (=bit line voltage VBL=VD3 of FIG. 28) of the memory cell transistor having a function form of expression (1). This is a modified example of the circuit shown in FIG. 31.

That is, in switched capacitor 201 of this circuit example, a serial circuit for transistors Tss1, Tss2, and Tss3 is provided between transistor Tb1 and the circuit having specified constant voltage Eo. The connection node of transistors Tss3 and Tss2 is circuit-grounded via capacitor C10, the connection node of transistors Tss2 and Tss1 is circuit-grounded via capacitor C20, and the connection node of transistors Tss1 and Tb1 is circuit-grounded via capacitor C0 (bit line parasitic capacitor).

In reality, capacitors C10 and C20 can be constructed by a capacitance formed between the gate and the source/drain of an MOS transistor.

The gates of transistors Tss1 and Tss3 receive clock Φ, and the gate of transistor Tss2 receives inverted clock Φ* having a phase reverse to clock Φ. These transistors are controlled to be alternately switched ON and OFF by clocks Φ and Φ*.

Capacitor C0 is charged by the output of switched capacitor 201. When transistor Tb1 is turned-ON by application of high level gate signal BLK, the charged voltage of capacitor C0 is supplied to bit line BL1 via transistor Tb1. In this case, potential VBL of bit line BL1 increases in a curve along with an exponential function form corresponding to the product between the equivalent capacitor of bit line BL1 (equivalent to Co of FIG. 3) and the output impedance of switched capacitor 201. The side of the inclination of this increase (dVD/dt) can be adjusted by altering the values of capacitor C10 and/or C20.

FIG. 33 illustrates a circuit example (132, 140, Tsw) for automatically determining the application end timing of pulse WDP by monitoring the potential of a particular bit line when word line drive pulse output WDPOUT having a specified positive voltage peak is to be applied to a particular word line. The embodiment of FIG. 33 is a proper modification of the embodiment of FIG. 19 and the same reference numbers are attached to the common parts.

It is now assumed that multi-value data WD has a plurality of data existent states (e.g., 1 V, 2 V, 3 V) and one data nonexistent state (data erased state of FIG. 7; e.g., 0 V). When the data existent contents (1 V, 2 V. 3 V) of such multi-value data WD are to be written in a particular memory cell transistor (e.g., M11), threshold values Vth of the memory cell transistor (M11) must be set to particular values (e.g., 2.3 V, 3.0 V, 3.7 V) corresponding to the contents (1 V, 2 V, 3 V) of write data WD.

Next, an operation for setting the threshold values Vth (i.e., writing operation) will be described with the case of write data WD=2 V as an example.

When one of a plurality of multi-value data is to be written in a particular memory cell, write data generating part 130 including a microcomputer (CPU) supplies word line drive pulse generating circuit 2 with multi-value data WD (e.g., WD=2 V) corresponding to the multi-value data to be written. Then, word line drive pulse generating circuit 2 outputs word line drive pulse output WDPOUT whose positive side amplitude potential is +2. (The internal structure of this circuit 2 may be the same as or like that shown in FIG. 1). This pulse output WDPOUT is given to decoder 150 for selecting a particular word line WL via word line drive pulse transmission gate transistor Tsw which is turned-ON by output Vsw from comparator 140 (described later).

For example, when multi-value data WD (=2 V) is to be written in memory cell transistor M11, decoder 150 selects word line W1 according to an address input from an outside (not shown).

Then, high level BLK is given to the gate of transistor Tb1. The voltage of bit line BL1 starts to increase (see curve VD3 of FIG. 27) by means of small current Is1 supplied from small current source 201 (in the configurations of FIGS. 30 to 32). After this bit line potential reaches a specified height level (corresponding to the input threshold value of comparator 140; writing start point of FIG. 27), comparator 140 provides high level output Vsw to the gate of transistor Tsw. Transistor Tsw is then turned-ON.

While word line drive pulse transmission gate transistor Tsw is ON, output WDPOUT (positive side +2 V) from word line drive pulse generating circuit 2 is transmitted to a particular word line WL (W1) via decoder 150.

After receiving, for instance, 5 pulses of output WDPOUT with +2 V peaks from word line W1, the threshold value Vth of memory cell transistor M11 reaches a value equivalent to write data WD=2 V (Vth2). At this time, bit line potential VBL has increased to a certain potential after the passage of time equivalent to 5 pulses of output WDPOUT.

When the potential increase of this bit line potential VBL (VD input of the comparator 140) exceeds comparison level Vcomp equivalent to write data WD=2 V, comparator 140 provides low level output Vsw to the gate of transistor Tsw. Then, transistor Tsw is switched OFF. No WDPOUT is then given to the control gate of transistor M11 and, at this time, changes in threshold values of transistor M11 are stopped. In this manner, threshold value Vth2 of transistor M11 is fixed to a value (about +3.0 in the example of FIG. 29) corresponding to WD=2 V.

Comparison level Vcomp equivalent to write data WD=2 V is generated by voltage adjusting part 132 based on the content of write data WD (2 V) obtained from write data generating part 130. This voltage adjusting part 132 produces, for write data WD=1 V, a comparison level Vcomp higher than in the case of WD=2 V, and, for write data WD=3 V, another comparison level Vcomp lower than in the case of WD=2 V. What value each comparison level Vcomp should be set for each write data (WD=1 V, 2 V, 3 V) can be determined by experimentally making samples having structures like that shown in FIG. 33.

Next, the reading operation in the configuration of FIG. 33 will be described.

First, reading signals of voltage levels +2.7 V, +3.4 V, and +4.1 V (0.7 V step) are given to word line W1. If transistor M11 is turned-ON with the word line voltage level of +2.7 V, the stored data of transistor M11 is multi-value data corresponding to write data WD=1 V. If transistor M11 is not turned-ON with +2.7 V but turned-ON with the word line voltage level of +3.4 V, the stored data of transistor M11 is multi-value data corresponding to write data WD=2 V. If transistor M11 is not turned-ON with +3.4 V but turned-ON with the word line voltage level of +4.1 V, the stored data of transistor M11 is multi-value data corresponding to write data WD=3 V. If transistor M11 is not turned-ON with any of +2.7 V, +3.4 V and +4.1 V, the stored data thereof is Here, as the case of write data WD=2 V is assumed, transistor M11 is turned-ON when a reading signal of the voltage level +3.4 V is applied to word line W1. If transistor Tb1 is turned-ON by setting gate signal S to a high level during the reading, turning-ON of transistor M11 is detected by sense amplifier SA1. That is, one of multi-value data stored in transistor M11 (data of WD=2 V in this case) is read by sense amplifier SA1.

The writing/reading operations were described in the case of write data WD=2 V. The writing/reading operations in the case of write data WD=1 V or 3 V are the same.

Figure 34:
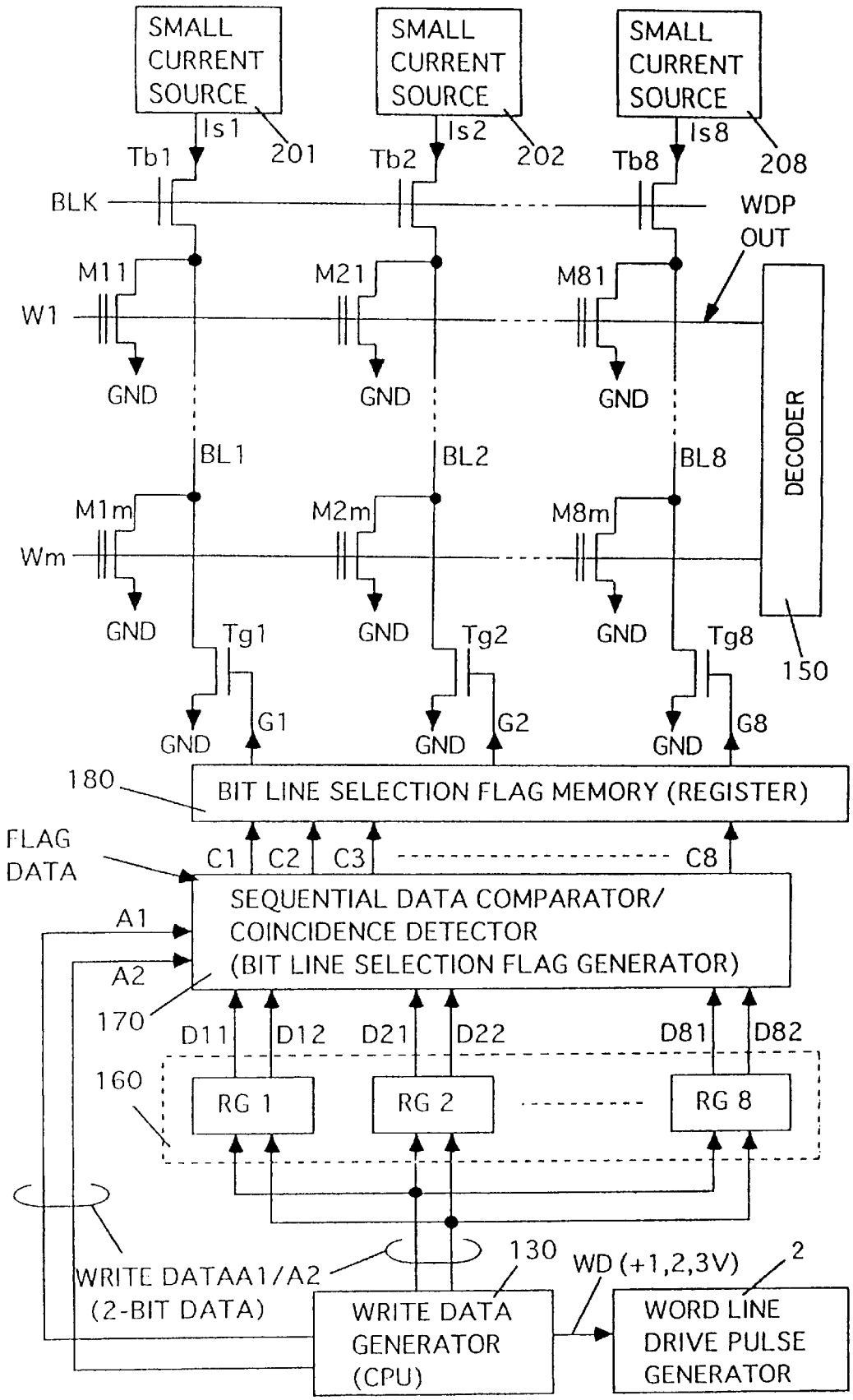
FIG. 34 exemplifies a circuit diagram for writing each variety of multi-value data pieces at once into a plurality of memory cell transistors in a memory block.

FIG. 34 shows an example of a configuration for writing each of a variety of multi-value data pieces in block in a plurality of memory cell transistors contained in a memory block. In the drawing, memory cell transistors M11 to M81 with their gates connected to word line W1 are shown as a first memory block, and memory cell transistors M1m to M8m with their gates connected to word line Wm are shown as a mth memory cell block.

A write data generating part (CPU) 130 gives an instruction to erase (or flash) the respective memory cell blocks (or all the memory cells) in block, and produces a content of data pieces (A1/A2 by 1 bit unit; D11/D12 to D81/D82 by block unit) to be written in each of the memory cells as well as word line drive pulse positive side determining data WD for determining the positive side amplitude of word line drive pulse output WDPOUT.

Generated 2-bit data pieces A1/A2 are supplied to bit line register circuit 160 with its content being changed according to the target memory cell for writing. Then, the content of write data pieces A1/A2=D11/D21 for memory cell transistor M11 is temporarily stored in register RG1, and the content of write data pieces A1/A2=D21/D22 for memory transistor M21 is temporarily stored in register RG2. Likewise, the content of write data pieces A1/A2=D81/D82 for memory cell transistor M81 is temporarily stored in register RG8. The data storing operations of these data pieces will be normally completed within 1 μs even when the number of memory cell transistors (or the number of bit line registers) constituting each block is more large.

Data pieces D11/D12 to D81/D82 temporarily stored in bit line register circuit 160 are supplied, in correspondence with bit lines BL1 to BL8 of each block, to sequential data comparator 170. Write data generating part 130 supplies write data pieces A1/A2 to comparator 170, and supplies word line drive pulse positive side level determining data WD, corresponding to the content of write data pieces A1/A2 (any of "00" to "11"), to word line drive pulse generating circuit 2.

Upon receiving data pieces, sequential data comparator 170 functions as a "coincidence detection circuit" to compare data pieces A1/A2 with any of data pieces D11/D12 to D81/D82 and to detect any of data pieces D11/D12 to D81/D82 being coincident with data pieces A1/A2. If coincidence between data pieces A1/A2 and any of data pieces D11/D12 and D81/D82 is found, bit line selection flags C1 and C8 corresponding to data pieces D11/D12 and D81/D82 are produced.

Bit line selection flags C1 and C8 are supplied to bit line selection flag memory 180 and temporarily stored therein. A portion in memory 180, which stores flags C1 and C8, generates bit line activation determining data pieces G1 and G8 of L level (=logic "0"). Then, only bit selection transistors Tg1 and Tg8, having received these L level data pieces at their gates, are switched OFF, thereby making bit lines BL1 and BL8 active (e.g., these lines are precharged to +5 V).

During this period, write data generating part 130 has produced word line drive pulse positive side level determining data WD corresponding to data pieces A1/A2 to be written in memory cell transistors M11 and M81. By means of this data WD, word line drive pulse generating circuit 2 produces word line drive pulse output WDPOUT having a positive side amplitude corresponding to data pieces A1/A2. This word line drive pulse output WDPOUT is repeatedly supplied to word line W1 by several to 10 pulses via decoder 150. Then, the threshold values of memory cell transistors M11 and M81 of the first block are simultaneously changed to the values corresponding to data pieces A1/A2 (in block writing of the same data in a plurality of memory cells).

If write data pieces A1/A2 indicate any of "11", "10", and "01", these data pieces are written in specified memory cells (any of M11 to M81) based on the above-noted procedure. If write data pieces A1/A2 indicate "00", an erasing state corresponding to data "00" is maintained without supplying any word line drive pulse outputs WDPOUT to word line W1.

FIG. 35 shows a specific example of sequential data comparator/coincidence detecting circuit 170 shown in FIG. 34.

Coincidence detecting circuit 170 is provided with 8 data coincidence detection gate circuits 171 to 178 respectively corresponding to 8 bit lines BL1 to BL8. In the drawing, circuit 171 is constructed by EXNOR gate GA11 for receiving data pieces A1 and D11, EXNOR gate GA12 for receiving data pieces A2 and D12, and NAND gate GA13 for outputting flag C1 upon receiving the outputs of gates GA11 and GA12. Remaining circuit 172 to 178 are constructed in the same manner.

More specifically, circuits 171 to 178 have the same circuit configuration, and they execute, in real time, the comparison between each data set of D11/D12 to D81/D82, obtained from the corresponding bit line registers RG1 to RG8, and the logic levels of a write data set of A1/A2. As a result, only when A1/A2=Dn1/Dn2 is detected, flag(s) Cn of the L level (n is any of 1 to 8) is(are) produced. Flag(s) Cn (C1 to C8) produced in such a manner is(are) stored in flag memory 180. The stored flag(s) serves as bit line activation determining data Gn (G1 to G8) and held therein until writing into word line W1 is finished (during this period, C1 to C8=G1 to G8).

FIG. 36 shows another example of sequential data comparator/coincidence detecting circuit 170 shown in FIG. 34.

As in the case of FIG. 35, coincidence detecting circuit 170 is provided with 8 data coincidence gate circuits 171 to 178 respectively corresponding to 8 bit lines BL1 to BL8. In the drawing, circuit 171 is constructed by EXOR gate GB11 for receiving data pieces A1 and D11, EXOR gate GB12 for receiving data pieces A2 and D12, and OR gate GB13 for outputting flag C1 upon receiving the outputs of gates GB11 and GB12. Remaining circuits 172 to 178 are similarly constructed.

Although the gate devices used in FIG. 36 are different from that used in FIG. 35, their circuit functions are the same.

FIG. 37 illustrates an example of the procedure of writing, at once, each content of 4 different kinds of data pieces (A1/A2) in a plurality of memory cell transistors (M11 to M81) in one memory block.

In the following, the configuration and the operation of FIG. 34 will be described assuming that write data generating part (CPU) 130 performs writing of data in a particular memory block, for instance, the memory block of word line W1.

First, it is assumed that transistors M11 to M81 of word line W1 have been erased in block (or flashing by block units) by means of repeated application of word line drive pulse WDPOUT which has an amplitude waveform like that shown in FIG. 5F. (Here, all the bits of memory cell transistors Mnm may be erased in block). Then, the threshold values of respective transistors M11 and M81, erased in block, are aligned to a constant value (+6.5 V to 7.0 V) corresponding to the data pieces "00".

Write data generating part 130 produces multi-value data pieces (2-bit data sets) "00", "01", "10", and "11" to be respectively written in the memory cell transistors (M11 to M81) of the first block, and writes these data pieces in 8 bit line registers (2-bit memory) RG1 to RG8 (step ST10).

For example, the data pieces "11" are written in transistors M11 and M81, the data pieces "10" are written in transistors M21 and M71, the data pieces "01" are written in transistors M31 and M61(not shown), and the data pieces "00" are written in transistors M41 and M51(not shown).

Then, an index counter (not shown) is set to i=1 (step ST12), and write data pieces A1/A2="11" are output from write data generator part 130 (step ST14).

Output data pieces A1/A2="11" are sequentially compared with the written contents ("00", "01", "10", and "11") of registers RG1 to RG8. If registers RG1 and RG8 storing the same content as A1/A2="11" are found, flags C1 and C8 representing these registers are produced (step ST16). As a result, only bit lines BL1 and BL8 are made active, thereby these bit lines being precharged to, for instance, +5 V.

Subsequently, write data generating part 130 sends word line drive pulse positive side level determining data WD, corresponding to data pieces A1/A2="11", to word line drive pulse generating circuit 2 (step ST18). Then, word line drive pulse generating circuit 2 supplies word line W1 with word line drive pulse WDPOUT by the specified number of pulses (several pulses to about 10 pulses) with, for instance, its positive side potential +3 V and its negative side potential −10 V (step ST20).

After word line drive pulse output WDPOUT has been applied to the corresponding word line W1 by the specified pulse numbers, writing of the data pieces "11" in the memory cells (M11 and M81) is completed (YES in step ST22).

Index counter i is incremented by 1 (step ST24) and checking is made on a new index value after the index increment (step ST26). If the new index value is below 4 (NO in step ST26), it is detected that writing of the 4 kinds of data pieces ("00", "01", "10", and "11") in the block being targeted for writing (or the block of word line W1) has not been completed yet. In this case, writing of next write data pieces (e.g., "10") is executed for memory cell transistors M21 and M71 (step ST14 to step ST22).

If the index value i is above 4, or it is 5 (YES in step ST26), writing of the 4 kinds of data pieces ("00", "01", "10", and "11") in the block being targeted for writing (or the block of word line W1) has been completed.

In the above-noted example, for the purpose of simplicity, the explanation has been made with reference to the structure of 8 memory cells in one block. However, to take specific numerical values in practical use, for instance, word lines Wm may be 1000 lines, bit lines BLn may be 256 lines, and 2-bit data (4 kinds of data pieces) may be stored in one memory cell Mnm.

When there are 256 bit lines, since one block includes 256 of 2-bit memory cells, the memory capacity of one block becomes 256×2=512 bits of a binary memory. That is, in the structure of FIG. 34, if 8 blocks are assembled (word lines W1 to W8), a memory of 512 bytes (EEPROM type IC memory) can be obtained. If 1000 blocks are assembled (word lines W1 to W1000), an IC memory of 512 kbits=64 kbytes can be obtained.

By increasing the integration density of this IC memory and by integrating 1000 memories of 64 k bytes in one semiconductor pellet, a nonvolatile semiconductor memory of 64M bytes is provided. With a memory capacity of this level, one or a combination of several nonvolatile semiconductor memories can be used as a compact computer external storage device instead of a hard disk.

According to an embodiment of the present invention, if word line number×bit line number×multi-value bit number is 1000×256×2, then 1000×2 bits can be written with an average write time of 1.5 ms. This can be interpreted as the writing time of 0.75 µs/bits. Thus, by parallel-providing the EEPROM's (flash memories) of the invention equivalent in number to the bit number of a data bus (16 to 64), it is possible to provide a nonvolatile semiconductor memory with a writing speed of 2M bytes/sec or more at the least.

FIG. 38 shows another example of a configuration for writing, at once, each of a variety of multi-value data pieces in a plurality of memory cell transistors in one block.

Write data pieces A1/A2 produced from write data generating part 130 are input to the same sequential data comparator (coincidence detecting circuit) as in FIG. 34 and to bit line selection decoder 190. Decoder 190 is constructed by one AND gate 191 and three AND gates 192 to 194 with inversion inputs. Decoder 190 performs logical calculation based on a truth table described below:

| A1 | A2 | F1 | F2 | F3 | F4 |
|----|----|----|----|----|----|
| 0  | 0  | 0  | 0  | 0  | 1  |
| 0  | 1  | 0  | 0  | 1  | 0  |
| 1  | 0  | 0  | 1  | 0  | 0  |
| 1  | 1  | 1  | 0  | 0  | 0  |

That is, when write data pieces A1/A2 are "11", only output F1 out of four decoder outputs F1 to F4 becomes H level (or logical 1). Similarly, when data pieces A1/A2 are "10", only decoder output F2 becomes H level (logical 1). When data pieces A1/A2 are "01", only decoder output F3 becomes H level (logical 1), and when data pieces A1/A2 are "00", only decoder output F4 becomes H level (logical 1).

Decoder output F1 is supplied to enable terminal EN of SRAM bit memory SM1 and to the gate of N channel transistor (serving as an analog gate) Ty1. Decoder output F2 is supplied to enable terminal EN of SRAM bit memory SM2 and to the gate of N channel transistor (serving as an analog gate) Ty2. Decoder output F3 is supplied to enable terminal EN of SRAM bit memory SM3 and to the gate of N channel transistor (serving as an analog gate) Ty3. Decoder output F4 is supplied to enable terminal EN of SRAM bit memory SM4 and to the gate of N channel transistor (serving as an analog gate) Ty4, via inverter 195. Inputs of memories SM1 to SM4 are connected to their other inputs via an inverter 1811, to thereby form binary memories (flip-flops).

SRAM bit memories SM1 to SM4 and inverters 1811 to 1812 constitute bit line selection circuit 181 for bit line BL1. Although not shown, bit selection circuits (if numbered, they would be 182 to 188) having the same structure are provided respectively for the corresponding bit lines (BL2 to BL8). These bit line selection circuits (tentatively 182 to 188), not shown, respectively receive bit line selection flags C2 to C8 from sequential data comparator 170.

When write data pieces A1/A2 are "11", only SRAM bit SM1 is enabled with decoder output F1=H, so that only transistor Ty1 is turned-ON. Then, if sequential data comparator 170 has output C1=L (that is, data pieces D11/D12 stored in the bit line register RG1 are "11" as in the case of write data pieces A1/A2), this C1=L is stored in SRAM bit SM1 and, simultaneously, data WD=+3 V is input to word line drive pulse generating circuit 2. Then, generating circuit 2 produces word line drive pulse output WDPOUT having a positive side potential (+3 V) corresponding to data pieces A1/A2="11".

When write data pieces A1/A2 are "11", the output of inverter 195 becomes H level since decoder output F4=L. Then, transistor Ty4 is turned-ON, so that pulse output WDPOUT (+3 V) from generating circuit 2 is applied to the gate of transistor M11 of word line W1, via decoder 150. In this case, since C1=L has been stored in SRAM bit SM1, by inverting this L level with inverter 1812 (open collector output), bit line BL1 becomes H level (precharged state of +5 V).

Therefore, by applying pulse output WDPOUT (+3 V) to the gate of transistor M11 of word line W1 by a specified number of pulses, data pieces A1/A2="11" can be written in transistor M11.

When write data pieces A1/A2 are "10", only SRAM bit SM2 is enabled with decoder output F2=H, so that only transistor Ty2 is turned-ON. Then, if sequential data comparator 170 has output C2=L (i.e., data pieces D21/D22 stored in bit register RG2 are "10" being same as write data pieces A1/A2="10"), this C2=L is stored in SRAM bit SM2 and, simultaneously, data WD=+2 is input to word line drive pulse generating circuit 2. Then, generating circuit 2 produces word line drive pulse output WDPOUT having a positive side potential (+2 V) corresponding to data pieces A1/A2="10".

When write data pieces A1/A2 are "10", transistor Ty4 has been turned-ON with decoder output F4=L. Then, pulse output WDPOUT (+2 V) from generating circuit 2 is applied to the gate of transistor M21 (not shown here) of word line W1 via decoder 150. In this case, since C2=L has been stored in SRAM bit SM2 of the bit line selection circuit (if numbered, it would be 182) placed in bit line BL2 (not shown here), bit line BL2 becomes H level (precharged state of +5 V) by inverting the above L level with inverter 1812 (open collector output).

Therefore, by applying pulse output WDPOUT (+2 V) to the gate of transistor M21 of word line W1 by a specified number of pulses, data pieces A1/A2="10" can be written in transistor M21.

When write data pieces A1/A2 are "01", only SRAM bit SM3 is enabled with decoder output F3=H, so that only transistor Ty3 is turned-ON. Although not shown, if sequential data comparator 170 has output C3=L (i.e., if data pieces D31/D32 stored in bit line register RG3, not shown, are "01" as in the case of write data pieces A1/A2), this C3=L is stored in SRAM bit SM3 and, simultaneously, data WD=+1 V is input to word line drive pulse generating circuit 2. Then, generating circuit 2 produces word line drive pulse output WDPOUT having a positive side potential (+1 V) corresponding to data pieces A1/A2="01".

When write data pieces A1/A2 are "01", transistor has been turned-ON with decoder output F4=L. Then, pulse output WDPOUT (+1 V) from generating circuit 2 is applied to transistor M31 (not shown) of word line W1 via decoder 150. In this case, since C3=L has been stored in SRAM bit SM3 of the bit line selection circuit (183) placed in bit line BL3, not shown, bit line BL3 becomes H level (precharged state of +5 V) by inverting the above L level with the inverter 1812 (open collector output).

Therefore, by applying pulse output WDPOUT (+1 V) to the gate of transistor M31 of word line W1 by a specified number of pulses, data pieces A1/A2="01" can be written in transistor M31.

When write data pieces A1/A2 are "00", only SRAM bit SM4 is enabled with decoder output F4=H, so that transistors Ty1 to Ty4 are in the OFF states. Then, generating circuit 2 supplies no word line drive pulse output WDPOUT to decoder 150.

In this case, since no word line drive pulse output WDPOUT is applied to the gate of transistor M41 (not shown) of word line W1 in which write data of A1/A2="00" is to be written, the threshold voltage of transistor M41 is kept at a value corresponding to the erased state (equivalent to data of "00"). In other words, the data of A1/A2="00" has been written in transistor M41.

Next, the circuit operation of FIG. 38 will be briefly described.

1. Only one of decoder outputs F1 to F4 becomes H level (or logical 1) depending on the content of write data pieces A1/A2 while the remaining decoder outputs are L level (or logical 0).

2. When write control signal WCS from CPU 130 to sequential data comparator (=coincidence detector) 170 is L level, all outputs C1 to C8 of comparator 170 are L levels.

In this case, CPU 130 changes data pieces A1/A2 in the order of "00", "01", "10", and "11", so that outputs F1 to F4 of bit line selection decoder 190 are changed to H levels in sequence.

3. SRAM cells (flip-flop) SM1 to SM4 store the input data (C1) when respective enable signals EN thereof (=F1 to F4) are H levels. All of SRAM cells SM1 to SM4 initially store data 0 (L level output) since C1=L level first.

4. When write control signal WCS from CPU 130 to sequential data comparator (coincidence detector) 170 is H level, only Cn, obtained when data pieces Dn1/Dn2 (n=1 to 8) coincide with write data pieces A1/A2, becomes L level. For example, where D11/D12="11" and D81/D82="11", and if A1/A2="11", then C1=L and C8=L are obtained while C2 to C7 are all H level.

5. If A1/A2="11", only output F1 of bit line selection decoder 190 becomes H level, and only SM1 is enabled, so that C1=L at this time is stored in SM1. Thus, the output of SM1 is kept at L level even after the condition of C1=L is erased or cleared and the output of inverter 1812 becomes H level (then bit line BL1 can be precharged to +5 V).

Similarly, C8=L is stored in SM1 (not shown) of bit line BL8. Thus, the output of SM1 of bit line BL8 is L level even after C8=L is cleared and the output of inverter 1812 (not shown) of bit line BL8 is H level (then bit line BL8 can be precharged to +5 V).

6. If only transistor Ty1 is turned-ON with F1=H, data WD for producing +3 V is supplied to word line drive pulse generating circuit 2. Then, generating circuit 2 produces word line drive pulse output WDPOUT of +3 V/–10 V.

7. Since F4=L and the output of inverter 195=H are obtained other than the state of A1/A2="00", word line drive pulse output WDPOUT +3 V/–10 V produced from generating circuit 2 is supplied to decoder 150. While decoder 150 selects word line W1, this WDPOUT is applied to the control gate of memory cell transistors M11 to M81. Of these transistors, it is only two transistors M11 and M81 that their drains have been precharged to +5 V.

Thus, the threshold values of transistors M11 and M81 become a value (e.g., +3.7 V) corresponding to the word line drive pulse output WDPOUT of +3 V/–10 V.

This means that write data pieces A1/A2="11" are written in each of two memory cell transistors M11 and M81, simultaneously.

8. Writing of write data pieces A1/A2="10" and "01" is carried out in the same manner.

9. Writing of write data pieces A1/A2="00" is carried out in the same manner as erasing. In this case, the output of inverter 195 is L with F4=H, so that transistor Ty4 is switched OFF. Then, the positive/negative potentials of word line drive pulse output WDPOUT becomes +0 V/–0 V, thereby keeping at the value of erasing the threshold value of the cell transistor(s) which is(are) the target of writing the data pieces A1/A2="00".

In the embodiments of FIGS. 34 and 38, in block erasing of a plurality of memory cells (i.e., increasing the threshold value of each memory cell transistor to a specified value) can be carried out in the following manner. A specific voltage with the potential of the word line side high is applied between the word line (Wm) and the IC chip substrate (not shown) with a built-in flash memory of FIG. 34 or 38. Then, a tunnel current is caused to flow to the floating gate (FG) of each memory cell transistor (Mnm) so that electrons are accumulated in this floating gate. In this manner, the threshold value of each memory cell transistor can be increased, thereby reaching an erasing state.

In the embodiments of FIGS. 34 and 38, reading of the multi-value data (plural kinds of threshold values) written in the plurality of memory cells can be carried in the following manner. More specifically, in the configuration of FIG. 34 or 38, a voltage corresponding to a specified threshold value is applied to the word line (Wm), and the content of the written multi-value data (one of a plurality of threshold values) is determined depending on whether a current flows from the bit line (BLn) to the ground circuit (GND).

In this case, since drain voltage VD of each memory cell transistor (Mnm) is "VD during writing">"VD during reading", threshold values Vth of each memory cell transistor (Mnm) are slightly different between writing and reading, realizing "Vth during writing"<"Vth during reading". Accordingly, a voltage applied to the word line (Wm) during reading must be set in consideration of the fact that "the threshold values Vth are slightly different between writing and reading."

In description of each of the embodiments, it is assumed that the memory cell transistor is constructed by an N-channel type MOS transistor. If the memory cell transistor is constructed by a P-channel type, the reference sings (±) representing the potential relationship must be reversed. Also, a portion "if the potential of . . . is high," in the description for the N-channel type needs to be changed to "if the potential of . . . is low," for the P-channel type. In addition, when the conductive types (N-type/P-type) of the semiconductor elements illustrated in each embodiment are to be changed, potential relationship in the description should properly change accordingly.

Apparent from the foregoing, according to the nonvolatile semiconductor memory of the present invention, by applying positive/negative vibrating pulses to the floating gate of one or more target memory cell transistors with their addresses specified after the bit line (sub-bit line) is precharged, it is possible to converge different floating gate voltages of a number of memory cell transistors to a prescribed voltage. This allows accurate writing and erasing of data for a number of nonvolatile memory cells by a very simple operation. In this case, by controlling the bit line potential to gradually increase during the initial period of applying the positive/negative vibrating pulses, data writing in the memory cell transistor (or setting of particular threshold values Vth) can be accurately performed (with little variations). Further, even when a leakage current flows to the bit line during writing of data in a particular memory cell transistor, by supplying a small current from small current supplying means to the bit line so as to compensate for the leakage current, fluctuations in the potential of the bit line can be suppressed or limited.

Furthermore, according to the high-speed block writing method of the invention, multi-value data of one block are held corresponding to the plurality of bit line included therein; one of multi-value data is produced; the produced multi-value data is compared with the held multi-value data and only the bit line corresponding to a portion which holds the multi-value data coincident with the produced multi-value data is activated; and the produced multi-value data is simultaneously written in one or more multi-value memory cells connected to the activated bit line. By performing writing of each content of the multi-value data simultaneously in the plurality of memory cells, it is possible to increase an actual speed for writing the multi-value data by block units.

What is claimed is:

1. A non-volatile semiconductor memory comprising:
   a memory cell array including word lines, bit lines arranged to cross the word lines at cross points, and a memory block containing memory cells corresponding in number to the bit lines, said memory cells being arranged at respective cross points between the word lines and the bit lines;
   said memory block comprising a plurality of memory cell transistors, each said memory cell transistor being arranged at said respective cross points and each said memory cell transistor having a source or drain connected to one of the bit lines, having a floating gate for holding non-volatile information with multi-values, and having a control gate connected to one of the word lines, wherein said control gate serves to control writing, erasing, or reading of the non-volatile information held at the floating gate;
   write data generation means for generating multi-value write data to be written in each of the memory cell transistors of said memory block;
   bit line selection data hold means coupled to said write date generation means and holding bit line selection data in correspondence with the bit lines, said bit line selection data corresponding to a content of said multi-value write data;
   bit line activation means coupled to said bit line selection data hold means for, when said bit line selection data hold means holds specific bit line selection data representing a specific content of said multi-value write data, activating only specific one or ones of the bit lines corresponding to the specific bit line selection data; and
   drive signal means coupled to the memory cell transistors for supplying each control gate of the memory cell transistors of said memory block with a drive signal having a first voltage potential, representing the specific content of said multi-value write data, and a second voltage potential which is different from the first voltage potential, wherein a voltage potential of said drive signal alternately reciprocates between said first and second voltage potentials.

2. The non-volatile semiconductor memory according to claim 1, further comprising:
   potential set means for generating a potential set signal in response to a content of the multi-value write data generated by said write data generation means, said potential set signal being coupled to said drive signal means for setting the first voltage potential of said drive signal at one value corresponding to the content of the multi-value write data.

3. The non-volatile semiconductor memory according to claim 1, further comprising:
   bit line potential control means coupled to said bit lines for controlling a bit line potential of the activated bit lines so that the activated bit line potential varies with a prescribed rate of change when said drive signal is supplied to each control gate of the memory cell transistors of said memory block to which data should be written.

4. The non-volatile semiconductor memory according to claim 2, further comprising:
   bit line potential control means coupled to said bit lines for controlling a bit line potential of the activated bit lines so that the activated bit line potential varies with a prescribed rate of change when said drive signal is supplied to each control gate of the memory cell transistors of said memory block to which data should be written.

5. The non-volatile semiconductor memory according to claim 1, further comprising:
   bit line potential control means coupled to said bit lines for controlling a bit line potential of the activated bit lines so that the activated bit line potential substantially rises with an exponential curve with respect to time representing repetitions of application of said drive signal, when said drive signal is supplied to each control gate of the memory cell transistors of said memory block to which data should be written.

6. The non-volatile semiconductor memory according to claim 2, further comprising:
   bit line potential control means coupled to said bit lines for controlling a bit line potential of the activated bit lines so that the activated bit line potential substantially rises with an exponential curve with respect to time representing repetitions of application of said drive signal, when said drive signal is supplied to each control gate of the memory cell transistors of said memory block to which data should be written.

7. The non-volatile semiconductor memory according to claim 1, further comprising:

bit line potential control means coupled to said bit lines for controlling a bit line potential of the activated bit lines, so that a potential difference between the activated bit line and each floating gate of the memory cell transistors of said memory block to which data should be written is maintained at a substantially constant value while said drive signal is supplied to each control gate of the memory cell transistors of said memory block to which data should be written.

8. The non-volatile semiconductor memory according to claim 2, further comprising:

bit line potential control means coupled to said bit lines for controlling a bit line potential of the activated bit lines, so that a potential difference between the activated bit line and each floating gate of the memory cell transistors of said memory block to which data should be written is maintained at a substantially constant value while said drive signal is supplied to each control gate of the memory cell transistors of said memory block to which data should be written.

9. A non-volatile semiconductor memory comprising:

a memory cell array including word lines, bit lines arranged to cross the word lines at cross points, and a memory block containing memory cells corresponding in number to the bit lines, said memory cells being arranged at respective cross points between the word lines and the bit lines;

said memory block comprising a plurality of memory cell transistors, each said memory cell transistor being arranged at said respective cross points and each said memory cell transistor having a source or drain connected to one of the bit lines, having a floating gate for holding non-volatile information with multi-values, and having a control gate connected to one of the word lines, wherein said control gate serves to control writing, erasing, or reading of the non-volatile information held at the floating gate;

write data generation means for generating multi-value write data to be written in each of the memory cell transistors of said memory block;

bit line selection data hold means coupled to said write data generation means and holding bit line selection data in correspondence with the bit lines, said bit line selection data corresponding to a content of said multi-value write data;

bit line activation means coupled to said bit line selection data hold means for activating only specific one or ones of the bit lines corresponding to a specific content of said multi-value write data; and drive signal means coupled to the memory cell transistor for supplying each control gate of the memory cell transistors of said memory block with a drive signal having a first voltage potential representing the specific content of said multi-value write data, and a second voltage potential which is different from the first voltage potential, wherein a voltage potential of said drive signal alternately reciprocates between said first and second voltage potentials.

10. The non-volatile semiconductor memory according to any one of claims 1 through 8, further comprising:

static type memory blocks respectively connected to said bit lines, said static type memory blocks temporarily holding data pieces to be stored in said memory cell transistors, respectively.

11. The non-volatile semiconductor memory according to claim 9, further comprising;

static type memory blocks respectively connected to said bit lines, said static type memory blocks temporarily holding data pieces to be stored in said memory cell transistors, respectively.

12. The non-volatile semiconductor memory according to any one of claims 1 through 8, further comprising:

means coupled to the bit lines for providing small currents to the bit lines, respectively.

13. The non-volatile semiconductor memory according to claim 9, further comprising:

means coupled to the bit lines for providing small currents to the bit lines, respectively.

14. The non-volatile semiconductor memory according to claim 10, further comprising:

means coupled to the bit lines for providing small currents to the bit lines, respectively.

15. The non-volatile semiconductor memory according to claim 11, further comprising:

means coupled to the bit lines for providing small currents to the bit lines, respectively.

16. The non-volatile semiconductor memory according to claim 12, further comprising:

determination data generation means for generating determination data by which it is determined whether said providing means provides the small currents to the bit lines;

memory means coupled to the determination data generation means for storing a content of the determination data unless data writing or data erasing of said memory cell transistors is completed; and selection means coupled to said memory means for selectively effecting supply of the small current only to specific one or ones of the bit lines which is or are determined by the determination data stored in said memory means.

17. The non-volatile semiconductor memory according claim 13, further comprising:

determination data generation means for generating determination data by which it is determined whether said providing means provides the small currents to the bit lines;

memory means coupled to the determination data generation means for storing a content of the determination data unless data writing or data erasing of said memory cell transistors is completed; and selection means coupled to said memory means for selectively effecting supply of the small current only to specific one or ones of the bit lines which is or are determined by the determination data stored in said memory means.

18. The non-volatile semiconductor memory according to claim 14, further comprising:

determination data generation means for generating determination data by which it is determined whether said providing means provides the small currents to the bit lines;

memory means coupled to the determination data generation means for storing a content of the determination data unless data writing or data erasing of said memory cell transistors is completed; and selection means coupled to said memory means for selectively effecting supply of the small current only to specific one or ones of the bit lines which is or are determined by the determination data stored in said memory means.

19. The non-volatile semiconductor memory according to claim 15, further comprising:

determination data generation means for generating determination data by which it is determined whether said providing means provides the small currents to the bit lines;

memory means coupled to the determination data generation means for storing a content of the determination data unless data writing or data erasing of said memory cell transistors is completed; and selection means coupled to said memory means for selectively effecting supply of the small current only to specific one or ones of the bit lines which is or are determined by the determination data stored in said memory means.

20. A method of writing data in a multi-value memory which is formed of memory blocks each including multi-value memory cells corresponding in number to bit lines, said method comprising the steps of:

a first step of holding multi-value data pieces of one block in correspondence with the bit lines contained in the one block;

a second step of generating one of the multi-value data pieces;

a third step of comparing each of the multi-value data pieces held at the first step with the one multi-value data piece generated at the second step, and activating only the bit line corresponding to the multi-value data piece which matches the one multi-value data piece generated at the second step; and a fourth step of writing the one multi-value data piece generated at the second step into the multi-value memory cell which is connected to the bit line activated at the third step.

21. The data writing method according to claim 20, comprising:

a further step of repeating the second to fourth steps so as to complete writing of multi-value data pieces of the one block.

22. The data writing method according to claim 20 or 21, wherein said multi-value memory cell is formed of memory cell transistors each having a source or drain connected to the bit line, a floating gate for holding non-volatile multi-value data piece, and a control gate, connected to the word line, for controlling writing erasing, or reading of data piece held at the floating gate, said fourth step including:

a step of supplying each control gate of the memory cell transistors of said memory block to be written with a drive signal having a first voltage potential which represents a specific content of the multi-value data piece, and having a second voltage potential which is different from the first voltage potential, wherein a voltage potential of said drive signal is alternatively reciprocating between said first and second voltage potentials.

23. The non-volatile semiconductor memory according to any one of claims 1 through 9, further comprising:

means coupled to a bit line for setting the bit line at a state being precharged with a given potential when the drive signal is repeatedly supplied to the control gate of said memory cell transistor.

24. A non-volatile semiconductor memory comprising:

a memory cell array including word lines, main-bit lines, sub-bit lines selectively connected to the main-bit lines, the word lines being arranged to cross the sub-bit lines at cross points, and a memory block containing memory cells which are arranged at respective cross points between the word lines and sub-bit lines;

said memory block comprising a plurality of memory cell transistors, each said memory cell transistor having a source or drain connected to one of the sub-bit lines, having a floating gate for holding non-volatile information with multi-values, and having a control gate connected to one of the word lines, wherein said control gate serves to control writing, erasing, or reading of the non-volatile information held at the floating gate;

write data generation means for generating multi-value write data to be written in each of the memory cell transistors of said memory block;

bit line selection data hold means coupled to said write data generation means and holding bit line selection data in correspondence with the bit lines, said bit line selection data corresponding to a content of said multi-value write data;

bit line activation means coupled to said bit line selection data hold means for activating only specific one or ones of the sub-bit lines corresponding to a specific content of said multi-value write data; and drive signal means coupled to the memory cell transistors for supplying each control gate of the memory cell transistors of said memory block with a drive signal having a first voltage potential, representing the specific content of said multi-value write data, and a second voltage potential which is different from the first voltage potential, wherein a voltage potential of said drive signal alternately reciprocates between said first and second voltage potentials.

25. The non-volatile semiconductor memory according to claim 24, further comprising:

means coupled to a sub-bit line for setting the sub-bit line at a voltage potential state which is floated from other circuits during a period when the drive signal is repeatedly supplied to the control gate of said memory cell transistors.

* * * * *